(12) United States Patent
Mills

(10) Patent No.: US 6,477,398 B1
(45) Date of Patent: Nov. 5, 2002

(54) RESONANT MAGNETIC SUSCEPTIBILITY IMAGING (REMSI)

(76) Inventor: Randell L. Mills, 1780 Greenbair Ct., Yardley, PA (US) 19067

( * ) Notice: Subject to any disclaimer, the term of this patent is extended or adjusted under 35 U.S.C. 154(b) by 0 days.

(21) Appl. No.: 09/191,454

(22) Filed: Nov. 12, 1998

Related U.S. Application Data

(60) Provisional application No. 60/065,318, filed on Nov. 13, 1997.

(51) Int. Cl.$^7$ ................................................. A61B 5/05
(52) U.S. Cl. ......................... 600/409; 324/201; 600/410
(58) Field of Search ................................. 600/409, 410, 600/420, 421, 425, 431; 324/201, 307, 309, 322, 239

(56) References Cited

U.S. PATENT DOCUMENTS

| | | | | |
|---|---|---|---|---|
| 5,073,858 A | * | 12/1991 | Mills | 364/413.13 |
| 5,274,331 A | * | 12/1993 | Macovski | 324/309 |
| 5,343,147 A | * | 8/1994 | Sager et al. | 324/239 |
| 5,408,178 A | * | 4/1995 | Wikswo et al. | 324/201 |
| 5,771,893 A | * | 6/1998 | Kassai et al. | 128/653.3 |
| 6,002,254 A | * | 12/1999 | Kassai et al. | 324/306 |

\* cited by examiner

*Primary Examiner*—Marvin M. Lateef
*Assistant Examiner*—Eleni Mantis Mercader
(74) *Attorney, Agent, or Firm*—Lahive & Cockfield, LLP

(57) ABSTRACT

A three-dimensional magnetic susceptibility map of an object including a patient placed in a magnetic field is generated from a three-dimensional map of the resonant radio frequency (RF) magnetic flux external to the patient. The magnetic susceptibility of each voxel is determined from the shift of the Larmor frequency due to the presence of the voxel in the magnetizing field. The intensity variation of the transverse RF field over space is used to determine the coordinate location of each voxel. The RF field is the near field which is a dipole that serves as a basis element to form a unique reconstruction. The geometric system function corresponding to a dipole which determines the spatial intensity variations of the RF field is a band-pass for $k_\rho = k_z$. In the limit, each volume element is reconstructed independently in parallel with all other volume elements such that the scan time is no greater than the nuclear free induction decay (FID) time. With the magnetic susceptibility determined independently (via by the Larmor frequency) from the spatial reconstruction (via the geometric system function), a digital versus analogue reconstruction is possible. With these unique features, the present novel magnetic resonance imaging (MRI) invention has the potential to generate high resolution, three-dimensional, real-time anatomical images and images based on physiological parameters with little or no deterioration from motion artifact.

45 Claims, 15 Drawing Sheets

RESONANT MAGNETIC SUSCEPTIBILITY IMAGING (REMSI)

This application claims benefit to Provisional Application No. 60/065,318 filed Nov. 13, 1997.

BACKGROUND

This invention relates to method and apparatus for imaging a body. In particular, the invention provides a magnetic susceptibility image of an animate or inanimate body. Many imaging techniques exploit some natural phenomenon which varies from tissue to tissue, such as acoustic impedance, nuclear magnetic relaxation, or x-ray attenuation to provide a contrast image of the tissue. Alternatively, some imaging techniques add a substance such as a positron or gamma ray emitter to the body to construct an image of the body by determining the distribution of the substance. Each imaging technique possesses characteristics which result in certain advantages relative to other imaging techniques. For example, the short imaging time of x-ray contrast angiography reduces motion artifacts. In addition, the high resolution of x-ray contrast angiography renders this technique superior to many prior known imaging techniques for high resolution imaging of veins and arteries. However, x-ray contrast angiography is invasive, requires injection of a noxious contrast agent, and results in exposure to ionizing radiation. Thus, it is not typically employed except for patients with severe arterial or venous pathology.

Nuclear Magnetic Imaging (NMR) which is commonly called magnetic resonance imaging (MRI) entails magnetizing a transverse tissue slice with a constant primary magnetic field in a direction perpendicular to the slice, and further magnetizing the slice by applying a gradient in the plane of the slice. A radiofrequency pulse excites selected nuclei of the slice. The excited nuclei relax and emit energy, i.e., radio signals, at frequencies corresponding to local magnetic fields determined by the gradient. A Fourier analysis of the emitted signals provides the signal intensity at each frequency, thereby providing spatial information in one dimension. Repeating the excitation of the nuclei and obtaining the Fourier spectrum of the emitted signals, as the gradient rotates in the plane of the slice, provides a two-dimensional image.

MRI is of primary utility in assessing brain anatomy and pathology. But long NMR relaxation times, a parameter based on how rapidly excited nuclei relax, have prevented NMR from being of utility as a high resolution body imager. The most severe limitation of NMR technology is that for spin echo imaging n, the number of free induction decays ("FIDs"), a nuclear radio frequency energy emitting process, must equal the number of lines in the image. A single FID occurs over approximately 0.1 seconds. Not considering the spin/lattice relaxation time, the time for the nuclei to reestablish equilibrium following an RF pulse, which may be seconds, requires an irreducible imaging time of n times 0.1 seconds, which for 512×512 resolution requires approximately one minute per each two dimensional slice. This represents a multiple of 1500 times longer that the time that would freeze organ movements and avoid image deterioration by motion artifact. For example, to avoid deterioration of cardiac images, the imaging time must not exceed 30 msec. A method for speeding NMR imaging flips the magnetization vector of the nuclei by less than 90 degrees onto the x-y plane, and records less FIDs. Such a method, known as the flash method, can obtain a 128×128 resolution in approximately 40 seconds. Another technique used to decrease imaging time is to use a field gradient and dynamic phase dispersion, corresponding to rotation of the field gradient, during a single FID to produce imaging times typically of 50 msec. Both methods produce a decreased signal-to-noise ratio ("SNR") relative to spin echo methods. The magnitude of the magnetization vector which links the coil is less for the flash case because the vector is flipped only a few degrees into the xy-plane. The echo-planar technique requires shorter recording times with a concomitant increase in bandwidth and noise. Both methods compensate for decreased SNR by increasing the voxel size with a concomitant decrease in image quality. Physical limitations of these techniques render obtaining high resolution, high contrast vascular images impractical.

Thus, it is an object of the invention to provide high resolution multi-dimensional images of tissue.

It is another object of the invention to provide multi-dimensional magnetic susceptibility images of an object.

It is yet another object of the invention to provide high resolution multi-dimensional images of the cardiopulmonary system.

It is yet another object of the invention to provide a magnetic susceptibility image of a body.

SUMMARY OF THE INVENTION

These and other objects of the invention are attained by providing an apparatus for obtaining a multi-dimensional susceptibility image of a body. The apparatus includes a radiation source for magnetizing the body with a magnetic component of a first radiation field. The apparatus also includes a first detector for measuring the magnetic component of the first radiation field in the absence of the body in a volume to be occupied by the body. The apparatus further includes a source for applying a second radiation field to the body, to elicit a third radiation field from the body. A second detector senses this third radiation field, and produces a signal that a reconstruction processor employs to create the magnetic susceptibility image of the body.

One practice of the invention provides a method for determining the distribution of radiation within a magnetized body, emanating from the body in response to an excitation radiation. The method includes the steps of measuring the emanated radiation over a three-dimensional volume by an array of detectors, and uniquely correlating each frequency component of the detected radiation with locations within the body producing that frequency component.

The invention is in part based on the realization that matter having a permeability different from that of free space distorts a magnetic flux applied thereto. This property is called magnetic susceptibility. An object, herein called a phantom, can be considered as a collection of small volume elements, herein referred to as voxels. When a magnetic field is applied to the phantom, each voxel generates a secondary magnetic field at the position of the voxel as well as external to the phantom. The strength of the secondary magnetic field varies according to the strength of the applied field, the magnetic susceptibility of the material within the voxel, and the distance of the external location relative to the voxel. For example, U.S. Pat. No. 5,073,858 of Mills, herein incorporated by reference including the references therein, teaches that the net magnetic flux at a point extrinsic to a phantom to which a magnetic field is applied, is a sum of the applied field and the external contributions from each of the voxels. The '858 patent further teaches sampling the external flux point by point and employing a reconstruction algorithm, to obtain the magnetic susceptibility of each voxel from the sampled external flux.

Unlike the '858 patent that relies on a static response from a magnetized body to determine the magnetic susceptibility of the body, a preferred practice of the invention elicits a radiative response from a magnetized body by subjecting the body to a resonant radiation field. One embodiment of the present invention generates a three-dimensional magnetic susceptibility image of an object including a patient placed in a magnetic field from a three-dimensional map of a radio frequency (RF) magnetic field external to the patient, induced by subjecting selected nuclei of the body to a resonant RF field. Application of an RF pulse to the body causes the body to emit the RF magnetic flux external to the body. A Fourier transform of this external flux produces its frequency components ("Larmor frequencies"). Each Larmor frequency determines the magnetic susceptibility of the voxels of the body producing that Larmor frequency. Further, the intensity variation of the external RF field over a three-dimensional volume of space is used to determine the coordinate location of each voxel.

The radiation source for magnetizing a body to be imaged can be a direct current ("DC") magnet, including a superconducting magnet. The radiation sources and amplifiers for applying an RF pulse to the magnetized body are well known in the art, and include, but are not limited to, klystrons, backward wave oscillators, Gunn diodes, and Traveling Wave Tube amplifiers. A preferred embodiment of the invention employs superconducting quantum interference devices (SQUID) as detectors for sensing the external RF field. SQUIDs advantageously allow nulling the applied magnetic flux in order to measure small external fields produced by precessing nuclei. Because the contributions of voxels to an external field at a detector typically drops off as the cube of the distance between the voxel and the detector, some embodiments of the invention employ a magnetizing field whose amplitude increases as the cube of the distance from the detectors. Such a spatial variation of the magnetizing field "levels" the magnitude of the external RF radiation from voxels at different locations relative to the detectors.

One practice of the invention obtains a three-dimensional magnetic susceptibility map of a magnetized body from a three-dimensional map of a secondary magnetic flux produced by the magnetized body, and detected over a three-dimensional volume of space external to the body, herein referred to as the "sample space." The extrinsic magnetic flux is sampled at least at the Nyquist rate, i.e., at twice the spatial frequency of the highest frequency of the Fourier transform of the magnetic susceptibility map of the phantom, to allow adequate sampling of spatial variations of the external magnetic flux. This practice of the invention preferably employs a Fourier transform algorithm, described in Fourier Transform Reconstruction Algorithm Section, to form the magnetic susceptibility map of the object.

One embodiment of the present invention employs nuclear magnetic resonance (NMR) to induce a magnetized body to emit an external radiation having a magnetic field component. In particular, application of an RF pulse, resonant with selected nuclei of a magnetized body, can polarize the nuclei through rotation of their magnetic moments. The polarized nuclei within a voxel precess about the local magnetic field in the voxel at a Larmor frequency determined in part by the applied magnetic field at position of the voxel and the susceptibility of the voxel. The superposition of external RF fields produced by all the voxels of the body creates the total external RF field. Thus, the external RF field contains frequency components corresponding to precession frequencies of the nuclei in different voxels of the body.

One practice of the invention detects the external RF field in the near field region where the distance of a detector sensing radiation from a voxel at a distance $r$ from the detector is much smaller than the wavelength $\lambda$ of the radiation emitted by the voxel, i.e., $r \ll \lambda$ (or $kr \ll 1$). The near fields are quasi-stationary, that is they oscillate harmonically as $e^{-i\omega t}$, but are otherwise static in character. Thus, the transverse RF magnetic field of each voxel is that of a dipole. In one embodiment, an array of miniature RF antennas sample the external RF field over a three-dimensional volume of space that can be either above or below the object to be imaged. The frequency components of the detected RF signals determine the magnetic susceptibility of voxels that give rise to the RF signals, and the location of each voxel is determined through measurements of the spatial variations of the intensity of the external RF field at a given frequency. Thus, the frequency components of the external RF radiation, and the intensity variations of the external RF radiation provide the necessary information for providing a magnetic susceptibility map of the magnetized phantom, such as a human body. Such a susceptibility map can be employed to obtain anatomical images of a human body based on selected physiological parameters.

Another practice of the invention employs paramagnetic and/or diamagnetic substances present in a body to be imaged to cause variations of local magnetic fields in different parts of the body, thereby providing a susceptibility image of the body. In particular, an excitation field, such a magnetic field, polarizes the paramagnetic and/or diamagnetic substances of the body. The polarized substances contribute to the local magnetic field at the positions of the voxels comprising the body. The amount of this contribution varies from one voxel to another depending on the variation of the concentration of the substances throughout the body. An excitation of selected nuclei of the voxels cause the nuclei to provide an external RF field through precession about the local magnetic fields. The external RF field includes a range of frequencies relating to the local magnetic field at position of each voxel. Thus, an analysis of the frequencies lead to information regarding the distribution of the paramagnetic or diamagnetic substances throughout the body.

Magnetic Susceptibility

All matter has a permeability different than that of free space that distorts an applied magnetic flux. This property is called magnetic susceptibility. An object, herein called a phantom, can be considered as a collection of small volume elements (hereafter called "voxels"). When a magnetic flux is applied to the phantom, each voxel generates a secondary magnetic flux at the position of the voxel as well as external to the phantom. The strength of the secondary magnetic flux varies according to the strength of the applied flux, the magnetic susceptibility of the material within the voxel, and the distance of the external location relative to the voxel. In one embodiment described in Mills [1] which is herein incorporated by reference including the references given therein in the Reference Section, the net magnetic flux at a point extrinsic to the phantom is a sum of the applied flux and the contributions of each of the voxels within the object. This flux is point sampled over a three dimensional space, and the magnetic susceptibility of each voxel is solved by a reconstruction algorithm.

In an embodiment of the present invention, the three-dimensional magnetic susceptibility map of an object including a patient placed in a magnetic field is generated from a three-dimensional map of the transverse resonant radio frequency (RF) magnetic flux external to the patient. The magnetic susceptibility of each voxel is determined from the shift of the Larmor frequency due to the presence of the voxel in the magnetizing field. The intensity variation of the transverse RF field over space is used to determine the coordinate location of each voxel. The RF field is the near field which is a dipole that serves as a basis element to form a unique reconstruction. The geometric system function corresponding to a dipole which determines the spatial intensity variations of the RF field is a band-pass for $k_\rho = k_z$. In the limit, each volume element is reconstructed independently in parallel with all other volume elements such that the scan time is no greater than the nuclear free induction decay (FID) time.

Secondary Magnetic Field

The magnetic moment, $m_Z$, of each voxel within the phantom is given by the product of its volume magnetic susceptibility, $\chi$, the magnetizing flux oriented along the z-axis, $B_Z$, and the volume of the voxel, $\Delta V$.

$$m_Z = \chi B \Delta V, \quad (1)$$

The magnetic moment of each voxel is a magnetic dipole. And the phantom can be considered to be a three-dimensional array of magnetic dipoles. At any point extrinsic to the phantom, the z-component of the secondary flux, B', from any single voxel is $$B' = m_z 2z^2 - x^2 - \frac{y^2}{(x^2 + y^2 + z^2)^{5/2}} \quad (2)$$

where x, y, and z are the distances from the center of the voxel to the sampling point. It is shown below that no geometric distribution of magnetic dipoles can give rise to Eq. (2). Therefore, the flux of each magnetic dipole (voxel contribution) forms a basis set for the flux of the array of dipoles which comprise the magnetic susceptibility map of the phantom.

Eq. (2) is a system function which gives the magnetic flux output in response to a magnetic dipole input at the origin. The phantom is an array of spatially advanced and delayed dipoles weighted according to the magnetic susceptibility of each voxel; this is the input function. The secondary flux is the superposition of spatially advanced and delayed flux, according to Eq. (2); this is the output function. Thus, the response of space to a magnetized phantom is given by the convolution of Eq. (2) with the series of weighted, spatially advanced and delayed dipoles representing the susceptibility map of the phantom.

In Fourier space, the output function is the product of the Fourier transform (FT) of the system function and the FT of the input function. Thus, the system function filters the input function. The output function is the flux over all space. However, virtually all of the spectrum (information needed to reconstruct the magnetic susceptibility map) of the phantom exists in the space outside of the phantom because the system function is essentially a band-pass filter. This can be appreciated by considering the FT, $H[k_\rho, k_Z]$, of Eq. (2):

$$H[k_\rho, k_z] = \frac{4\pi k_\rho^2}{k_z^2 + k_\rho^2} = \frac{4\pi}{1 + \frac{k_z^2}{k_\rho^2}} \quad (3)$$

where $k_\rho$ is the spatial frequency in the xy-plane or $k_\rho$-plane and $k_Z$ is the spatial frequency along the z-axis. $H[k_\rho, k_Z]$ is a constant for $k_\rho$ and $k_Z$ essentially equal as demonstrated graphically in FIG. 1c.

Band-Pass Filter

A magnetic field with lines in the direction of the z-axis applied to an object comprised of magnetically susceptible material magnetizes the material so that a secondary field superposes the applied field as shown in FIG. 9. The secondary field outside of the object (phantom) and detected at a detector 301 is that of a series of magnetic dipoles centered on volume elements 302 of the magnetized material. In Cartesian coordinates, the secondary magnetic flux, B', at the point (x,y,z) due to a magnetic dipole having a magnetic dipole moment $m_z$ at the position $(x_0, y_0, z_0)$ is $$B' = \mu_0 \frac{m_z(2(z-z_0)^2 - (x-x_0)^2 - (y-y_0)^2)}{[(x-x_0)^2 + (y-y_0)^2 + (z-z_0)^2]^{5/2}} i_z \quad (4)$$

$$B' = \frac{(2z^2 - x^2 - y^2)}{[x^2 + y^2 + z^2]^{5/2}} \otimes m_z \delta(x - x_0, y - y_0, z - z_0) i_z \quad (5)$$

where $i_Z$ is the unit vector along the z-axis. The field is the convolution of the system function h(x,y,z) or h(ρ,Φ,z) (the left-handed part of Eq. (5)), with the delta function (the right-hand part of Eq. (5)), at the position $(x_0, y_0, z_0)$. A very important theorem of Fourier analysis states that the Fourier transform of a convolution is the product of the individual Fourier transforms [2]. The Fourier transform of the system function, h(x,y,z) or h(ρ,Φ,z) is given in APPENDIX V.

The z-component of a magnetic dipole oriented in the z-direction has the system function, h(x,y,z), which has the Fourier transform, $H[k_x, k_y, k_z]$, which is shown in FIG. 1c.

$$H[k_x, k_y, k_z] = \frac{4\pi[k_x^2 + k_y^2]}{[k_x^2 + k_y^2 + k_z^2]} \quad (6)$$

$$= H[k_\rho, k_z] = \frac{4\pi k_\rho^2}{k_z^2 + k_\rho^2} = \frac{4\pi}{1 + \frac{k_z^2}{k_\rho^2}} \quad (7)$$

The output function, the secondary magnetic field, is the convolution of the system function, h(x,y,z)—the geometric transfer function for the z-component of a z-oriented magnetic dipole with the input function—a periodic array of delta functions each at the position of a magnetic dipole corresponding to a magnetized volume element.

$$\frac{(2z^2 - x^2 - y^2)}{[x^2 + y^2 + z^2]^{5/2}} \otimes \sum_{n=-\infty}^{\infty} m_z \delta(x - nx_0, y - ny_0, z - nz_0) \quad (8)$$

The Fourier transform of a periodic array of delta functions (the right-hand side of Eq. (8)) is also a periodic array of delta functions in k-space:

$$\frac{1}{x_0 y_0 z_0} \sum_{n=-\infty}^{\infty} m_z \delta\left(k_x - \frac{n}{x_0}, k_y - \frac{n}{y_0}, k_z - \frac{n}{z_0}\right) \quad (9)$$

By the Fourier Theorem, the Fourier transform of the spatial output function, Eq. (8), is the product of the Fourier transform of the system function given by Eq. (7), and the Fourier transform of the input function given by Eq. (9).

$$\frac{4\pi}{1+\frac{k_z^2}{k_\rho^2}} \frac{1}{x_0 y_0 z_0} \sum_{n=-\infty}^{\infty} m_z \delta\left(k_x - \frac{n}{x_0}, k_y - \frac{n}{y_0}, k_z - \frac{n}{z_0}\right) \quad (10)$$

In the special case that $$k_\rho = k_z \quad (11)$$

the Fourier transform of the system function (the left-hand side of Eq. (10)) is given by $$H = 4\pi \quad (12)$$

Thus, the Fourier transform of the system function bandpasses the Fourier transform of the input function. Both the input function (the right-hand part of Eq. (8)) and its Fourier transform (the right-hand part of Eq. (10)) are a periodic array of delta functions. No frequencies of the Fourier transform of the input function are attenuated; thus, no information is lost in the case where Eq. (11) holds. Thus, the resolution of the reconstructed magnetic susceptibility map is limited by the spatial sampling rate of the secondary magnetic field according to the Nyquist Sampling Theorem.

Reconstruction of the Magnetic Susceptibility Map

Superconducting Quantum Interference Devices (SQUIDs) allow the user to null the ambient or applied magnetic flux and to measure very small secondary magnetic fluxes ($10^{-15}$ Tesla). The flux contribution from a voxel of human tissue of millimeter dimensions is typically $10^{-9}$ Tesla. For example, representative parameters of Eq. (1) are $\chi=10^{-4}$, $B_Z=10^5 G$, and $\Delta V=10^{-3}$ cm$^3$ which results in $m_z = 10^{-2}$ Gcm$^3$. Substitution of this voxel magnetic moment into Eq. (2) with x=0; y=0; z=10 cm results in B=$10^{-5}$ G=1 nT. Eq. (2) shows that the field at the detector drops off as the cube of the distance from the voxel of tissue. By applying a voxel magnetizing field that increases as the cube of the distance from the detector to the voxel, the field at the detector becomes independent of the distance from the voxel. In this case, the field is given by $$B_z = B_0 [a^2 + z_n^2]^{3/2} \quad (13)$$

where $a_0$ and $B_0$ are constants and $z_n$ is the distance from the detector to the voxel. Thus, a magnetizing field that increases as the distance cubed from the detector "levels" the magnitude of signals from voxels at different locations relative to the detector. A three-dimensional magnetic susceptibility map can be generated from a three-dimensional map of the secondary magnetic flux of a magnetized phantom—such as a human (the corresponding space of detection is hereafter called the "sample space"). The magnetic susceptibility map is reconstituted using a Fourier transform algorithm. The algorithm is based on a closed-form solution of the inverse problem—solving the spatial distribution of magnetic dipoles from the extrinsic secondary flux from an array of magnetized voxels. The extrinsic magnetic flux is sampled at the Nyquist rate (twice the spatial frequency of the highest frequency of the Fourier transform of the magnetic susceptibility map of the phantom).

In an embodiment of the present invention, nuclear magnetic resonance (NMR) is the means to measure the secondary magnetic field to provide the input to the magnetic susceptibility reconstruction algorithm. In this case, the measured secondary (RF) field is transverse to the magnetic flux including the local contribution due to the magnetic susceptibility of the voxel. The RF field is detected in the near zone where r<<λ (or kr<<1), and the near fields are quasi-stationary, oscillating harmonically as $e^{-i\omega t}$, but otherwise static in character. Thus, the transverse RF magnetic field of each voxel is that of a dipole, the maximum amplitude of which is given by Eq. (2) wherein the Larmor frequency of each voxel is shifted due to its magnetic susceptibility, and $m_z$, the magnetic moment along the z-axis, of Eq. (2) corresponds to the bulk magnetization M of each voxel. In terms of the coordinates of Eq. (2), an array of miniature RF antennas point samples the maximum dipole component of the RF signal over the sample space such as the half space above (below) the object to be imaged wherein each RF signal is frequency-shifted by the perpendicularly oriented magnetic susceptibility moment of each voxel. A three-dimensional magnetic susceptibility map is generated from a three-dimensional map of the secondary (RF) magnetic flux of a magnetized phantom—such as a human. The magnetic susceptibility of each voxel(s) is determined from the shift of the Larmor frequency due to the presence of the voxel(s) in the magnetizing field. The measurements of the spatial variations of the intensity of the transverse RF field of a given frequency is used to determine the coordinate location of each voxel(s). In one embodiment, the magnetic susceptibility map is reconstructed using a Fourier transform algorithm. The algorithm is based on a closed-form solution of the inverse problem—solving the spatial location(s) of a magnetic dipole(s) of known magnetic moment (via the Larmor frequency) from the spatial variations of the extrinsic transverse secondary (RF) flux from the magnetized voxel(s). The extrinsic (RF) magnetic flux is sampled at the Nyquist rate (twice the spatial frequency of the highest frequency of the Fourier transform of the magnetic susceptibility map of the phantom). In the limit, each volume element is reconstructed independently in parallel with all other volume elements such that the scan time is no greater than the nuclear free induction decay (FID) time.

The NMR type ReMSI scan performed on the object to be imaged including a human comprises the following steps:

The primary or magnetizing field is first determined over the voxels of the imaged volume (hereafter called "image space") in the absence of the object to be imaged.

The magnetic moments of nuclei including protons of the object to be imaged that are aligned by the primary field are further aligned by a radio frequency (RF) pulse or series of pulses.

The strength and duration of the rotating $H_1$ (RF) field that is resonant with the protons of the magnetized volume and is oriented perpendicularly to the direction of the magnetizing field is applied such that the final precession angle of the magnetization is 90° ($\phi$=90°) such that the RF dipole is transverse to the primary magnetizing field and perpendicular to the RF magnetic field detector.

The nuclei process and emit RF energy at the frequency determined by the total magnetic flux at the voxel which is the superposition of the primary (applied flux) and the secondary (magnetic susceptibility flux).

The precessing nuclei undergo a free induction decay as they emit energy.

The magnetic intensity is time harmonic according to the magnetic flux at each voxel. The time dependent signals are Fourier transformed to give the spectrum. The magnetic moment corresponding to each frequency is determined (Eq. (21)).

The transverse RF field is a dipole. The maximum intensity is determined for each frequency at each detector for at least one synchronized time point or short time interval to form a matrix for each frequency of the intensity as a function detector position in sample space. The measurements of the spatial variations of the transverse RF field of a given frequency is used to determine the coordinate location of each voxel(s). Thus, each matrix comprises the intensity variation over the sample space of the RF field of the bulk magnetization M of each voxel having the corresponding magnetic moment. To improve the signal to noise ratio of the image, this procedure may be repeated for multiple time points with reconstruction and averaging of the superimposed images, or the data may be averaged before reconstruction.

The Fourier transform algorithm is performed on each frequency component over the detector array to map each bulk magnetization M corresponding to a magnetic moment to a spatial location or locations over the image space. The later case applies if the same magnetic moment is at more than one position in the image. The three-dimensional magnetic susceptibility map (the input function) is given as follows. With respect to the coordinate system of Eq. (2), (x, y, and z are the Cartesian coordinates, $m_z$, the magnetic moment along the z-axis, of Eq. (2) corresponds to the bulk magnetization M of each voxel, and B is the magnetic flux due to the magnetic moment shown in FIG. 9; the relationship to the NMR coordinate system is given in the Reconstruction Algorithm Section) the origin of the coordinate system, (0,0,0), is the center of the upper edge of the phantom. The phantom occupies the space below the plane x, y, z=0 ($z \leq 0$ in the phantom space), and the sampling points lie above the plane ($z>0$ in the sampling space). The magnetic flux in the sampling space is given by multiplying the convolution of the input function with the system function by the unitary function (one for $z \geq 0$ and zero for z<0). The input function can be solved in closed-form via the following operations:

1. Measure the magnetic flux at discrete points in the sampling space. Each point is designated (x, y, z, flux) and each flux value is an element in matrix A.
2. Discrete Fourier transform matrix A to obtain matrix B.
3. Multiply each element (flux value) of matrix B by the corresponding inverse (reciprocal) value of the Fourier transform of the system function, Eq. (2), evaluated at the same frequency as the element of the matrix A. This is matrix C.
4. Generate matrix D by taking the discrete inverse Fourier transform of matrix C.
5. Multiply each element of matrix D by the distance squared along the z-axis to which the element corresponds to generate the bulk magnetization M map. (This corrects the limitation of the sample space to $z \geq 0$).
6. In one embodiment, the voxels with a finite bulk magnetization M above a certain threshold or at an edge in the map are assigned the magnetic susceptibility (magnetic moment) determined from the shift of the Larmor frequency due to the presence of the voxel(s) in the uniform (nonuniform) magnetizing field. The other voxels are assigned a zero value. This procedure is repeated for all Larmor frequencies. In the limit with sufficient Larmor frequency resolution, each volume element is reconstructed independently in parallel with all other volume elements such that the scan time is no greater than the nuclear free induction decay (FID) time.
7. In the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)). The total magnetic susceptibility map is the superposition of the separate maps for each magnetic moment corresponding to a unique Larmor frequency which is plotted and displayed.

Further details regarding specific derivations, and calculations associated with the magnetic susceptibility systems of the present invention are provided in the attached appendices, wherein:

APPENDIX I is the field produced by a ring of dipoles according to the present invention;

APPENDIX II is the derivation of the field produced by a shell of dipoles according to the present invention;

APPENDIX III is the mathematical proof that the field produced by a shell of magnetic dipoles is different from that of a single dipole according to the present invention;

APPENDIX IV is the derivation of the field produced by a sphere of dipoles according to the present invention;

APPENDIX V is the derivation of the Fourier transform of the system function of the z-component of the magnetic field from a dipole oriented in the direction of the z-axis used in the reconstruction process according to the present invention;

APPENDIX VI is the derivation of S=HF U($K_z$) convolution from Eq. (44) used in a reconstruction process according to the present invention, and APPENDIX VII is the derivation of the Inverse Transform of Eq. (57) to Give Inverse Transform 1, Eq. (58), used in a reconstruction process according to the present invention.

DETAILED DESCRIPTION OF THE INVENTION

Figure 1A:
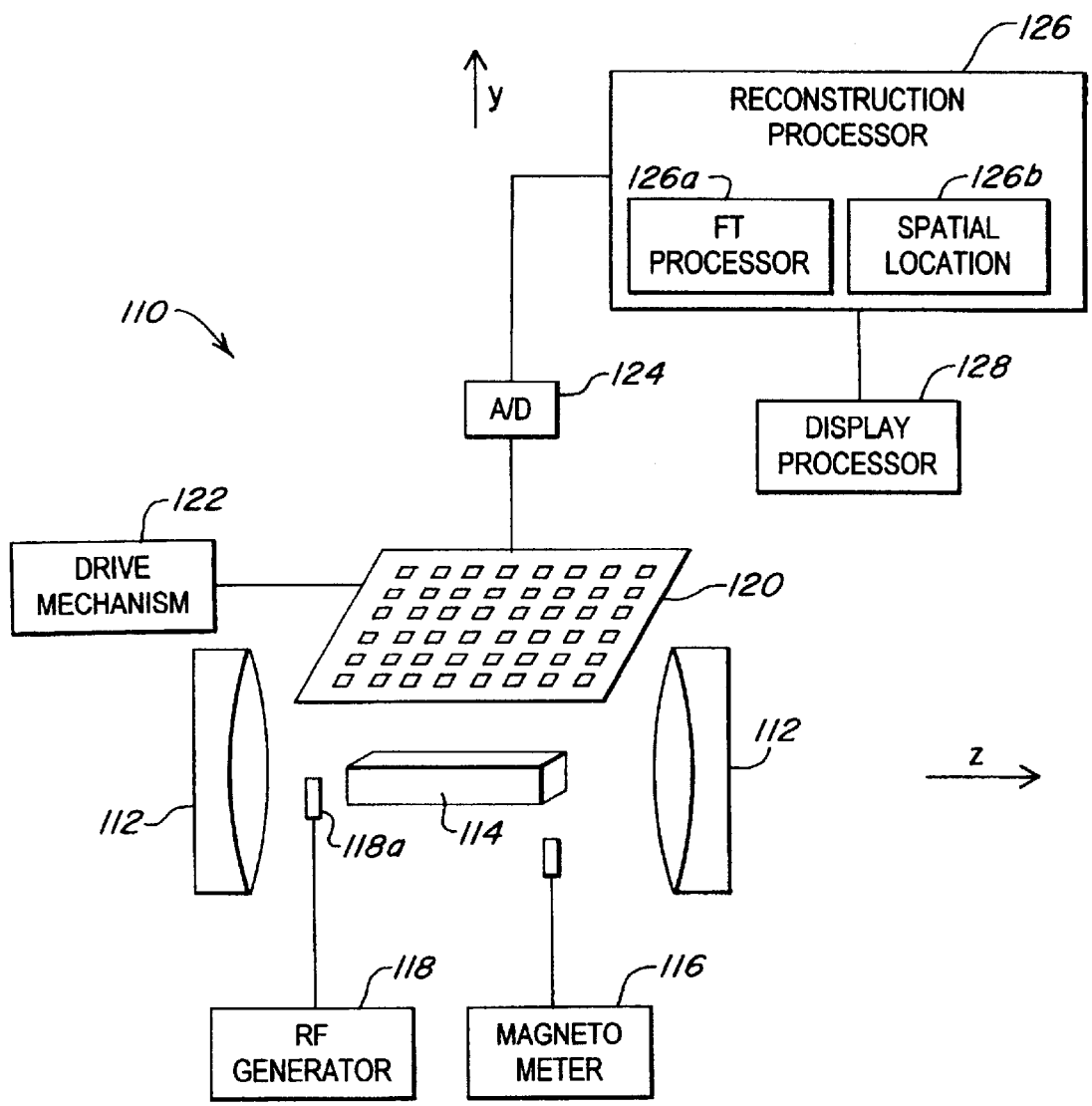
FIG. 1a is a schematic diagram of a system for determining magnetic susceptability according to the teachings of the invention in which a magnet magnetizes a body to be imaged, an RF generator excites the body, and an array of detectors detect radiation emitted by the body in response to the RF excitation radiation.

An exemplary embodiment of a resonant magnetic susceptibility (ReMSI) system 110 according to the teachings of the present invention is shown in FIG. 1a. The apparatus 110 includes a magnet 112, such as a superconducting magnet, that provides a primary or magnetizing field, to magnetize a body 114 to be imaged. A magnetometer 116 determines the primary or magnetizing field in the volume to be occupied by the body, i.e., in the image space, in the absence of the body. One practice of the invention utilizes a magnetometer that employs NMR of protons in water for determining the primary radiation field at multiple points in the image space. A radiation source 118, such as a radio frequency generator, applies an RF pulse to the body in combination with RF antennae 118a when the body is placed in the magnetic field, to excite and thereby polarize selected nuclei of the body. The excited nuclei emit an RF radiation that a plurality of detectors 120, disposed in a plane above or below the object, can detect. The excitation pulse is selected to rotate the magnetization of the nuclei, preferably by 90 degrees, with respect to the primary field. In such a case, the RF radiation that the excited nuclei emit is primarily along a direction perpendicular to the plane of the detectors. The detectors are selected to respond only to components of a magnetic field perpendicular to the plane in which they reside. Thus, such detectors can detect the emitted RF field without interference from the primary magnetic field. A drive mechanism 122 moves the detectors 120 in a direction perpendicular to the plane of the detectors, e.g., along the y-axis, to sample the external RF field over a three-dimensional volume. The separation of the detectors and the step size of the movement of the detectors along a direction perpendicular to the plane are selected such that the detectors sample the external RF field over a three-dimensional volume, i.e., the sample volume, at least at the Nyquist rate. Such a sampling advantageously allows obtaining the spatial variations of the magnetic susceptibility of the body.

A variety of detectors known in the art can be employed to construct the array of detectors 120. Such detectors include, but are not limited to, superconducting quantum interference devices (SQUID), Micromagnetic field sensors that employ galvanomagnetic effect due to the Lorentz force on charge carriers, semiconductor magnetic field sensors including MAGFET, magnetotransistors, Van der Pauw devices, integrated bulk Hall devices, such as the vertical MT and the lateral MT, silicon on sapphire and CMOS magnetodiodes, the magnetounijunction transistor, the carrier domain magnetometer, magnetic avalanche transistors, optoelectronic magnetic field sensors, and magnetoresistive magnetic field sensors. One preferred embodiment of the invention employs an array of SQUIDs, wherein each SQUID is cooled below the critical temperature after the magnetizing field is turned on and stabilized, to link the flux of the magnetizing field, and thus detect only the field generated by the body in response to an RF excitation. See Sarwinski, R. E., Superconducting Instruments, Cryogenics, December 1977, pp. 671–679, the teachings of which are herein incorporated by reference. Another embodiment employs an impedance-matched array of RF antennas that are time-multiplexed to reduce cross talk.

Figure 11:
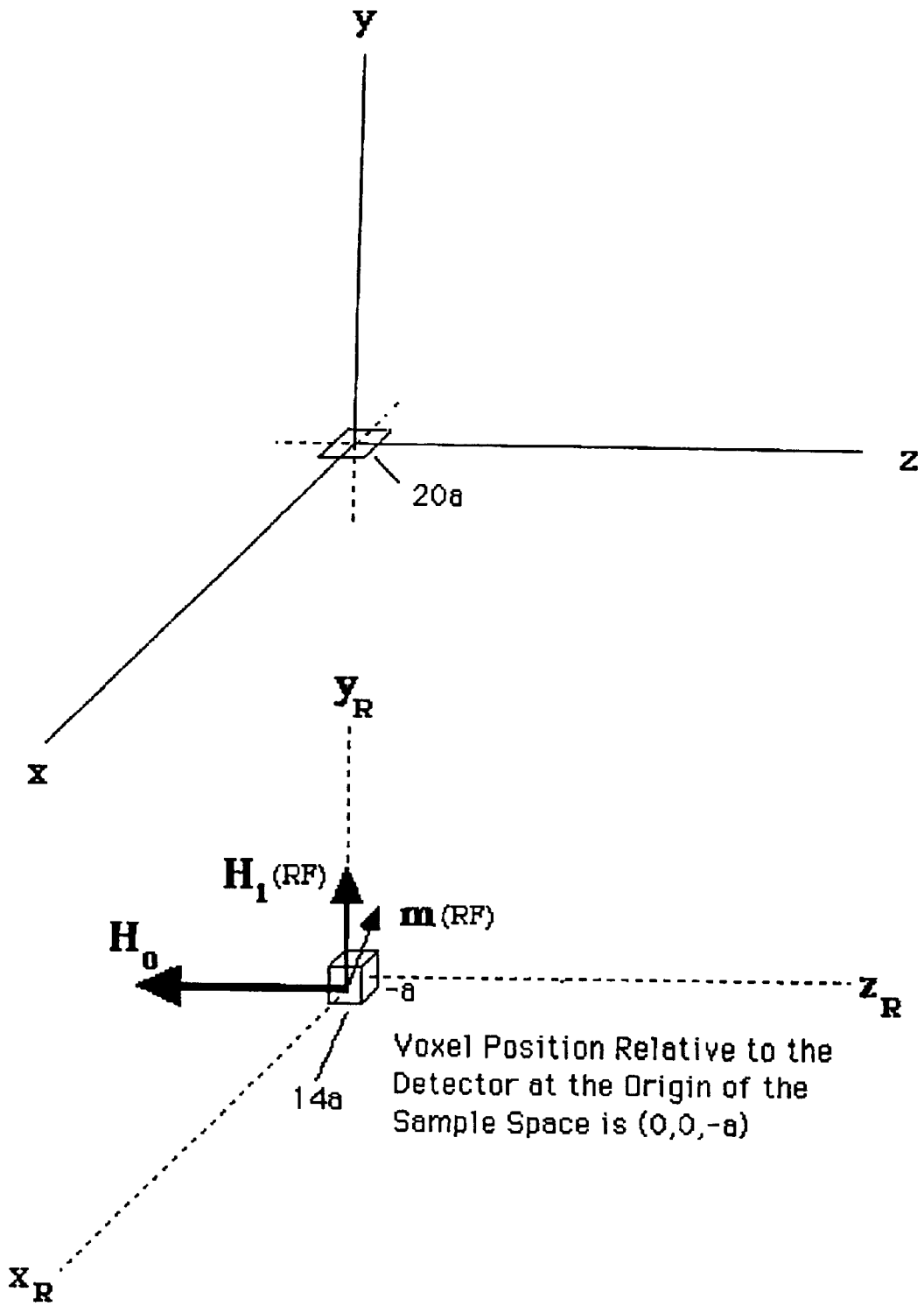
FIG. 11 shows the rotating NMR coordinate system $(x_R, y_R, z_R)$ and the stationary coordinate system (x, y, z) of the NMR detector corresponding to the coordinate system of FIG. 9 and FIG. 10 of a primary field $H_0$ oriented parallel to the $z_R$-axis and the z-axis and the corresponding transverse RF magnetic dipole oriented in the $x_R$ $y_R$-plane and periodically parallel to the y-axis wherein the spatial variation of the RF y-component of the flux due to the RF dipole is measured at a detector according to Eq. (2) and shows the distances from the voxel to the detector in accordance with the invention.

The process of magnetization of selected nuclei of the body can be better understood by referring to FIG. 11 which shows a magnetizing field $H_0$ applied to a voxel 14a of the body 114. The RF excitation field is selected to be in a direction perpendicular to the field $H_0$, and its magnitude is designated as $H_1$. NMR active nuclei of the voxel, such as protons, possess both angular momentum and a magnetic moment. Thus, the vector sum of the magnetic moments of all such NMR active nuclei present in the voxel 14a give rise to the bulk magnetization of the voxel 14a. The bulk magnetization vector M (not shown) designates the collective contribution of a selected type of NMR active nuclei to the magnetization of the voxel 14a which corresponds to a RF parallel magnetic moment M. The RF excitation field is selected to be in resonance with the selected type of nuclei, e.g., protons, of the voxel 14a, to rotate the bulk magnetization vector M. In a rotating frame representation, designated in FIG. 11 as ($x_R$, $y_R$, $z_R$) and well known to those skilled in NMR, the magnetization vector M rotates about $H_1$ so long as the RF radiation is present. The rate of rotation of the magnetization vector about the applied field $H_1$ depends on the gyromagnetic ratio of the affected nuclei and the magnitude of the excitation field, $H_1$. The duration of the RF radiation can thus be selected to cause a rotation of the magnetization vector, initially aligned along $H_0$, onto the $x_R y_R$-plane, for example by a 90° rotation. After the RF excitation field is turned off, the rotated magnetization M precesses about the local magnetic flux B (not shown) at the position of the voxel 14a. The local magnetic flux B is the sum of the primary magnetic flux $\mu_0 H$, and the magnetic flux due to the magnetic susceptibility of the magnetized voxel, $\mu_0 \chi H$, where $\mu_0$ represents the permeability of free space, $\chi$ is the magnetic susceptibility of the voxel, and H is the primary magnetic field strength at the position of the voxel. The total magnetic flux is the sum of the contributions from the primary magnetic flux and the flux corresponding to the magnetic susceptibility of the magnetic voxel. The term $(1+\chi)$ is herein defined as the total magnetic susceptibility. The magnetic susceptibility $\chi$ causes a small perturbation of the magnetizing flux because the value of the magnetic susceptibility $\chi$ is typically $10^{-4}$ to $10^{-5}$. Thus, the magnetizing field must be stable to at least 1 part in $10^5$ in order to produce a magnetic susceptibility image. Superconducting magnets are particularly suited for providing such a stability because superconducting magnets typically provide a magnetic field stability of 1 part in $10^8$ over a period of one month.

The precession of the magnetization M of each voxel about the local flux B produces a radiating dipolar field corresponding to a magnetic moment m that has its maximum intensity along the $y_R$ direction. The precession frequency of the magnetic moment called the Larmor frequency is dependent on the local magnetic flux which has a contribution corresponding to the magnetic susceptibility of the voxel (See Eq. (21) and Eq. (22)). A detector 20a can be, for example, an RF antenna pointing along the y direction to respond selectively to the radiating RF field from all of the voxels. A Fourier transform of this external RF field recorded as a function of time produces its frequency components ("Larmor frequencies"). Each frequency component can provide the total local magnetic flux in voxels producing that frequency component. The total local magnetic flux in turn is related to the susceptibility of the material within these voxels (See Eq. (22)). Thus, the values of magnetic susceptibility can be gleaned from frequency components of the external RF radiation. The next step in the process of determining the magnetic susceptibility image involves determining locations of the voxels contributing to each frequency component. The variation of the maximum intensity of the RF field at a particular frequency over the three-dimensional sample space is used to determine the locations of the voxels contributing to radiation at that frequency. Preferably, the magnetic susceptibility of each voxel is reconstructed independently in parallel with all other voxels such that the scan time is no greater than the time for the excited nuclei to return to their unexcited state, called the nuclear free induction decay (FID) time. This may be achieved by using sufficiently high resolution of the Larmor frequencies such that each frequency component corresponds to a single voxel.

With further reference to FIG. 1a, an analogue to digital converter ("A/D converter") 124 converts the analogue signal outputs of the detectors 120 into digital signals. A preferred embodiment of the invention utilizes at least a 12 bit A/D converter to digitize the output signals. An optional reconstruction processor 126 receives the digital signals, and determines the magnetic susceptibility map of the body. The reconstruction processor 126 may include a Fourier transform processor 126a that obtains the frequency components of the external RF field. In addition, a spatial locator 126b, which may also be a part of the reconstruction processor 126, employs the variation of the maximum intensity of the external RF field over the sample space (the three dimensional space sampled by the detectors) to locate the positions of the voxels in the image space producing a particular frequency component of the external RF field, in a manner described in detail below (See the Reconstruction Algorithm Section). An display processor 128 displays a two-dimensional or a three-dimensional image corresponding to the variations of the magnetic susceptibility of the body.

The spatial locator 126b employs an algorithm, described in detail below to determine the positions of the voxels of the magnetized body that produce each of the frequency components of the external RF field. It is demonstrated in the Uniqueness of Reconstruction Section that a magnetic field produced by a geometric distribution of dipoles is unique. Therefore, a unique spatial distribution of magnetic dipoles, such as those corresponding to the bulk magnetization of each voxel due to precessing nuclei, gives rise to a unique magnetic field. Thus, the measured external RF field can provide a unique solution for the spatial distribution of magnetic dipoles, i.e., magnetized voxels comprising excited nuclei in the body.

Referring again to FIG. 1a, the spatial locator 126b preferably employs a Fourier Transform Reconstruction Algorithm to map a bulk magnetic moment m corresponding to a particular frequency component of the external RF field onto a spatial location or locations in the body. The latter case applies if more than one location in the body gives rise to a particular frequency component of the external RF radiation.

According to a preferred embodiment of the invention, the system 110 employs an open design magnet, such as a Helmholtz coil, to allow positioning of the detector array 120 sufficiently close to the body 114 to be imaged. The orientation of the magnetic field with respect to the body can be selected to optimize the signal to noise ratio of the signals detected by the array of detectors 120. For example, in the case of imaging a patient body, the primary magnetic field can be selected to be coaxial with the body, or it can alternatively be perpendicular to the body axis.

The ReMSI apparatus of FIG. 1a provides a number of advantages. In particular, because the magnetic susceptibility of tissue is sensitive to the concentration of oxyhemoglobin relative to deoxyhemoglobin in tissue, the apparatus of the invention is particularly suited for imaging cardiopulmonary and vascular systems. Further, the apparatus of the invention can achieve a typical resolution of $10^{-3}$ cm$^3$, thereby permitting physicians to view human anatomy and pathology in a manner not available with conventional imaging techniques. In addition, the fast data acquisition possible with the ReMSI technique reduces motion artifacts in the image. Another important advantage of the present technique is that it is non-invasive. In contrast, many of the conventional techniques, such as X-ray angiography, require surgery. Many conventional non-invasive imaging techniques, such as nuclear medicine and magnetic resonance angiography, provide at least an order of magnitude lower resolution than the technique of the invention, and are much more susceptible to motion artifacts. Further, the present technique provides a three dimensional image that can be displayed from any perspective.

Figure 1B:
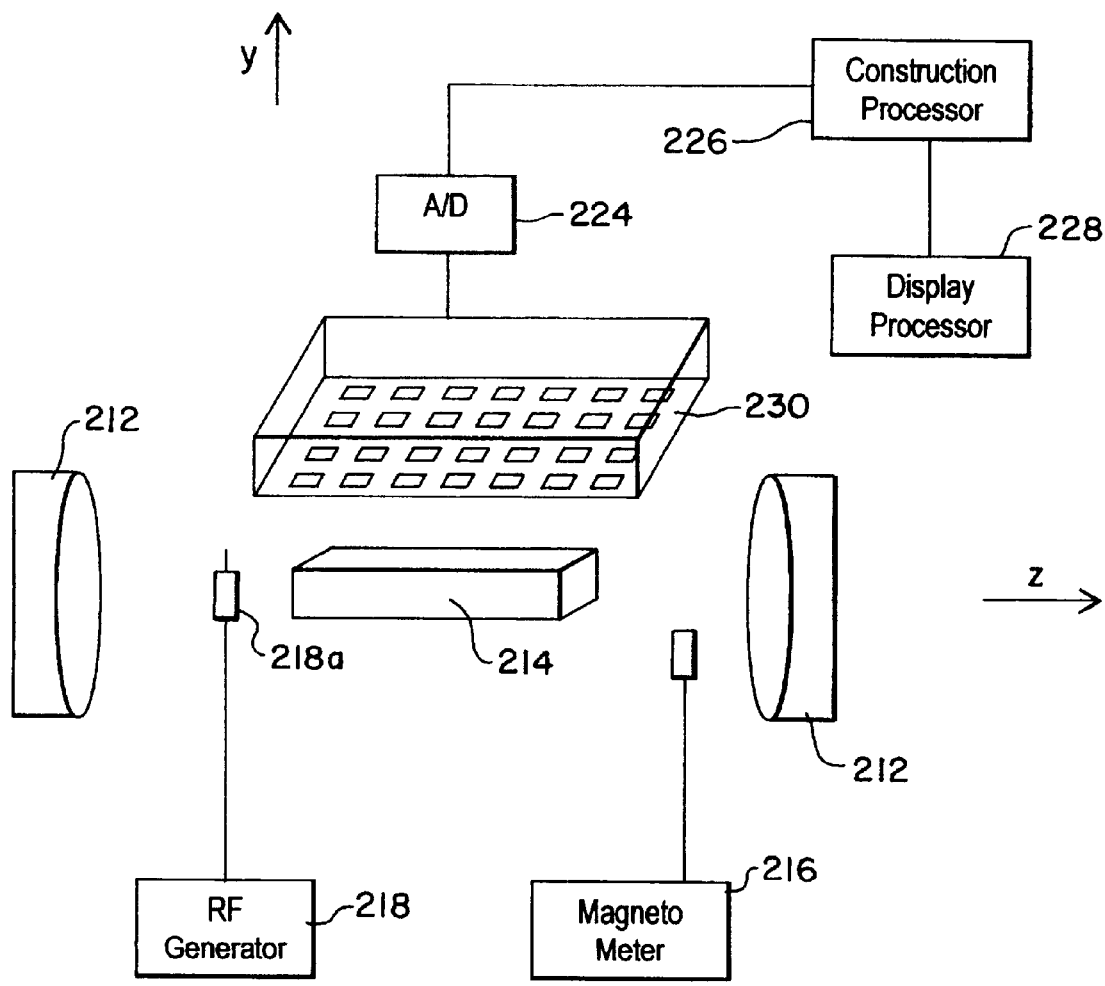
FIG. 1b is a schematic diagram of the system of FIG. 1a employing a three-dimensional array of detectors to detect radiation emitted by nuclei of a body to be imaged in response to excitation of the nuclei by a radiation source.

An alternative embodiment of the ReMSI apparatus of the invention, shown in FIG. 1b, employs a three-dimensional array of detectors 230, spaced apart to detect spatial variations of the emitted RF radiation at least at the Nyquist frequency. A magnet 212 provides a magnetizing field in a volume to be occupied by a body, i.e., image space. A magnetometer 216 measures the magnetizing field at a plurality of positions in the image space in the absence of the body. As in embodiment of FIG. 1a, the body 214 to be imaged is placed in the magnetizing field provided by the magnet 212. An RF generator 218 in combination with an RF antenna 218a apply an RF pulse to the body to polarize selected nuclei of the body. The polarized nuclei emit an RF radiation. The three-dimensional array of detectors 230 provide output signals in response to the RF radiation emitted by the body. A digitizer 224 digitizes the output signals and sends the digital signals to a construction processor 226 that determines variations of the magnetic susceptibility of the body in a manner similar to that described in connection with the embodiment of FIG. 1a. A display processor 228 receives the information regarding the spatial variations of the magnetic susceptibility from the construction processor 226, and provides a two-dimensional or a three-dimensional magnetic susceptibility image of the body. Employing a three-dimensional array of detectors advantageously decreases the acquisition time because the emitted RF signal over the entire three-dimensional sample space is detected at once. The shortening of the acquisition time in turn reduces motion artifacts in the susceptibility image.

Uniqueness of Reconstruction

Figure 1C:
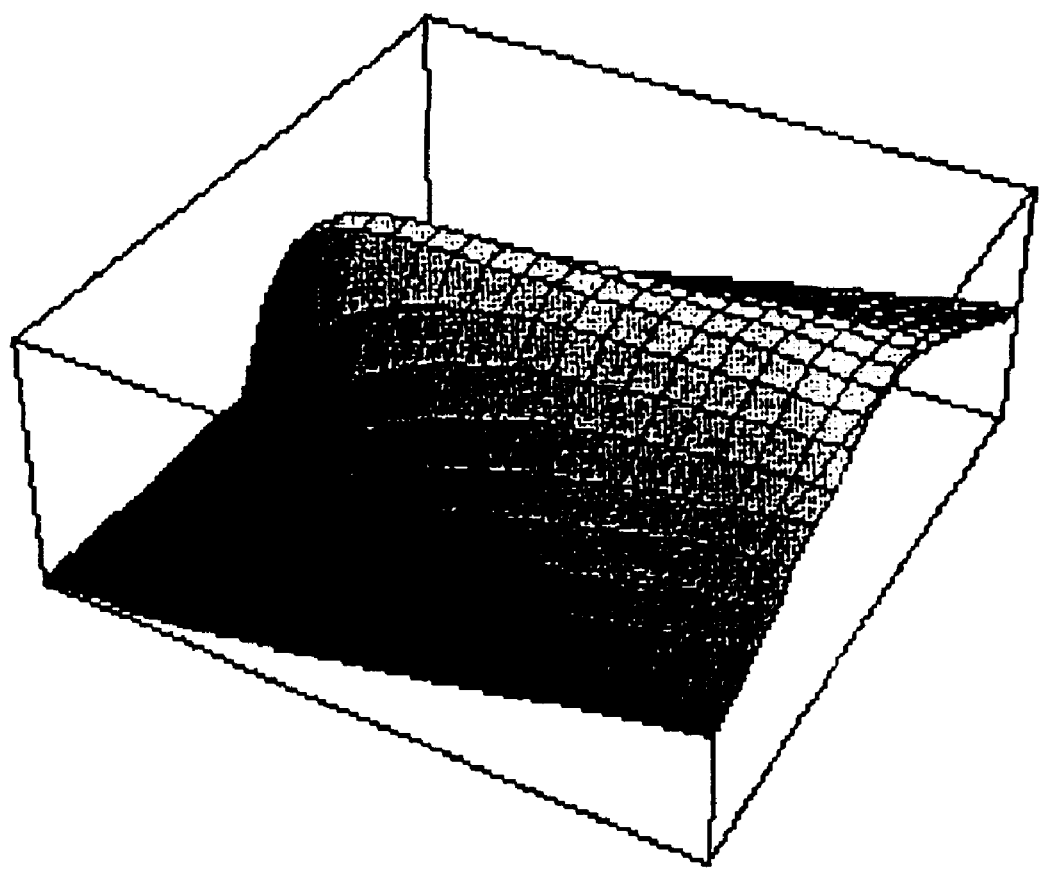
FIG. 1c is a plot of the Fourier transform $H[k_x,k_y,k_z]$ of the system function h(x,y,z) (Eq. (2)) corresponding to the z-component of a magnetic dipole oriented in the z-direction in accordance with the invention, illustrating the ability to obtain a magnetic susceptibility image by sampling the magnetic field at a selected number of locations.

The reconstruction processor 126 of FIG. 1 constructs the magnetic susceptibility map according to a defined sequence and program. Those of ordinary skill will be able to properly program the processor in light of the following description. Those of ordinary skill will also recognize that the steps to reconstruct the magnetic susceptibility map can be implemented in either hardware or software. All matter has a permeability different from that of free space that distorts an applied magnetic flux. This property is called magnetic susceptibility. An object, herein called a phantom, can be considered as a collection of small volume elements or voxels. When a magnetic flux is applied to the phantom, each voxel generates a secondary magnetic flux external to the phantom. The strength of the secondary magnetic flux varies according to the strength of the applied flux, the magnetic susceptibility of the material within the voxel, and the distance of the external location relative to the voxel. The net magnetic flux at a point extrinsic to the phantom is a sum of the applied flux and the contributions of each of the voxels within the object. This flux is point sampled over a three dimensional space, and the magnetic susceptibility of each voxel is solved by a reconstruction algorithm. The resulting image is called the magnetic susceptibility map.

The secondary magnetic field due to magnetized tissue has to be modeled as noninteracting dipoles aligned with the imposed field. It is demonstrated below that the field of any geometric distribution of dipoles is unique, and the superposition principle holds for magnetic fields; therefore, a unique spatial distribution of dipoles gives rise to a unique secondary magnetic field, and it is further demonstrated below that this secondary field can be used to solve for the magnetic susceptibility map in closed form. It follows that this map is a unique solution. To prove that any geometric distribution of dipoles has a unique field, it must be demonstrated that the field produced by a dipole can serve as a mathematical basis for any distribution of dipoles. This is equivalent to proving that no geometric distribution of dipoles can produce a field which is identical to the field of a dipole.

Figure 2:
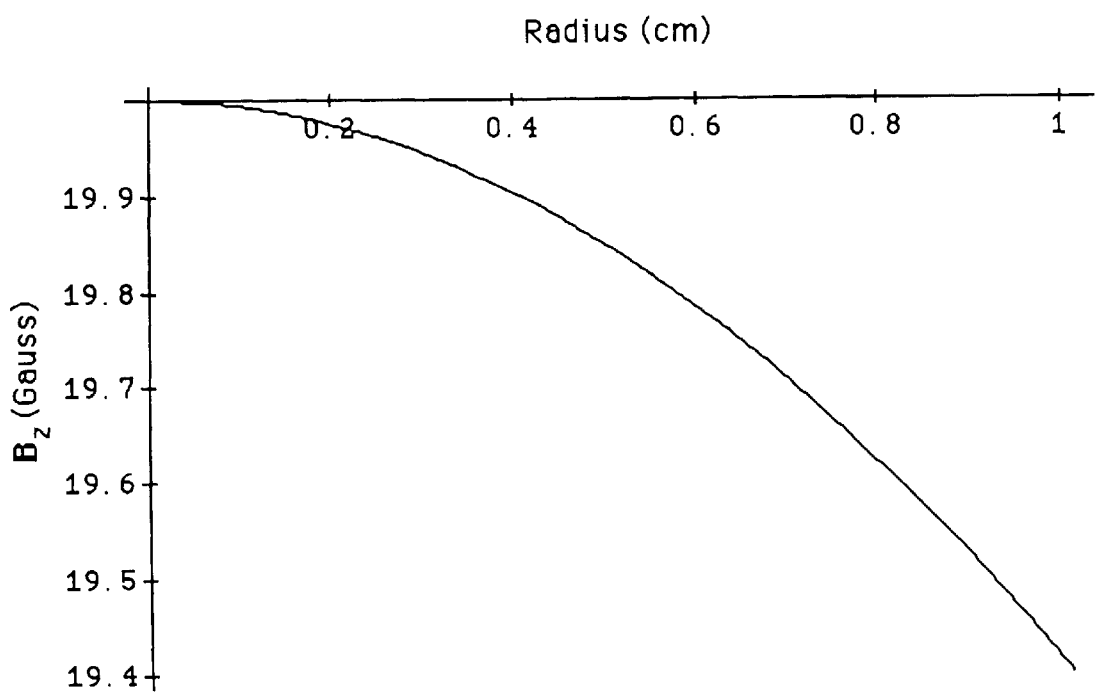
FIG. 2 is the plot of the field of a ring of dipoles of radius R and magnetic moment $m=10^4$ Gcm$^3$ given by Eq. (I.14) as a function of radius R where the position of the center of the ring relative to the detector is the point (0,0,10) in accordance with the invention.
Figure 4:
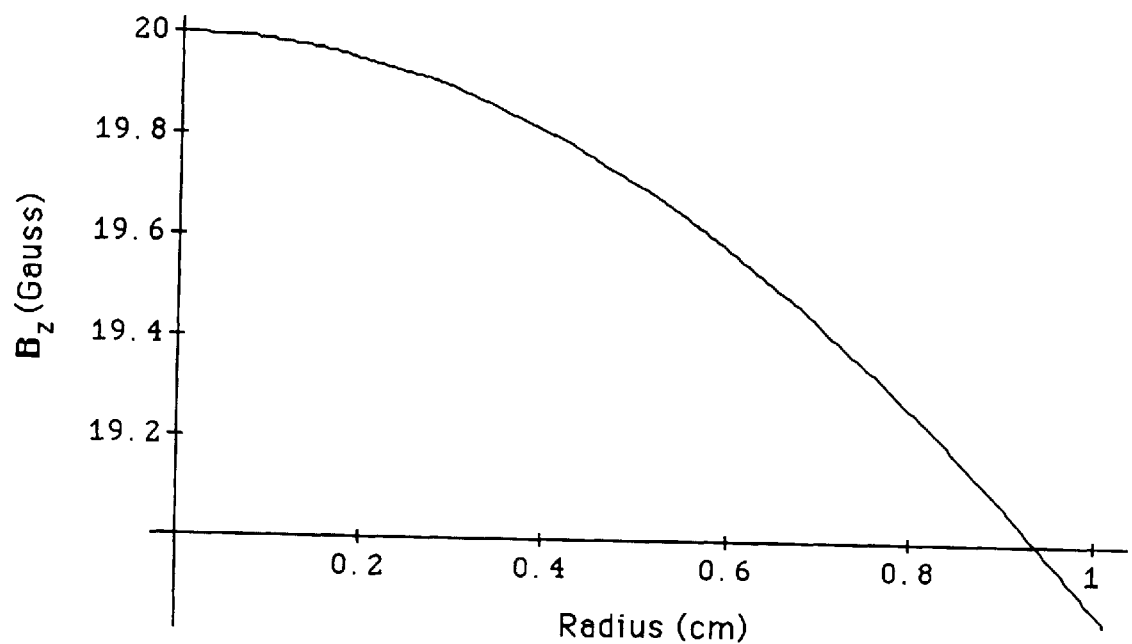
FIG. 4 is the plot of the field of a shell of dipoles of radius R and magnetic moment $m=10^4$ Gcm$^3$ given by Eq. (II.17) as a function of radius R where the position of the center of the shell relative to the detector is the point (0,0,10) in accordance with the invention.
Figure 6:
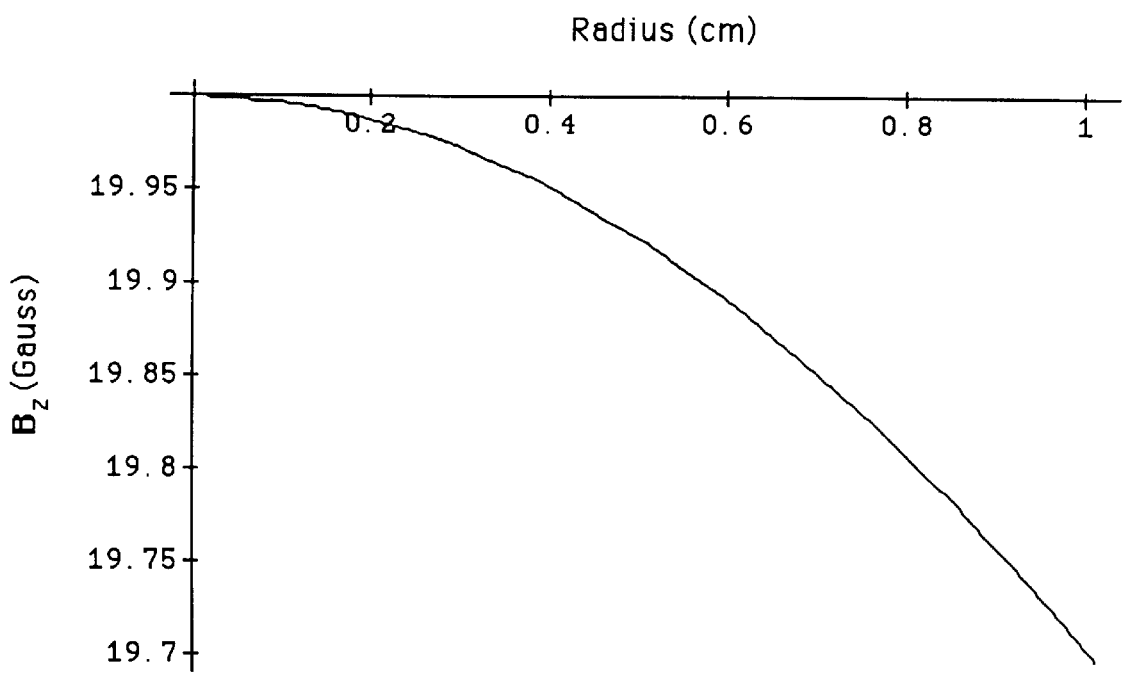
FIG. 6 is the plot of the field of a sphere of dipoles of radius R and magnetic moment $m=10^4$ Gcm$^3$ given by Eq. (IV.16) as a function of radius R where the position of the center of the sphere relative to the detector is the point (0,0,10) in accordance with the invention.

By symmetry considerations, only three distributions of uniform dipoles need to be considered. A magnetic dipole has a field that is cylindrically symmetrical. A ring, a shell, a cylinder, and a sphere of dipoles are the only cases which have this symmetry. A cylinder is a linear combination of rings. Thus, the uniqueness of the dipole field is demonstrated by showing that it is different from that of a ring, a shell, and a sphere. The uniqueness of the dipole from the cases of a ring, a shell, and a sphere of dipoles is demonstrated in APPENDIX I, APPENDIX II, and Appendix IV, respectively. The plot of the three cases of the field of a ring, shell, and a sphere of dipoles each of radius R and magnetic moment m=$10^4$ Gcm$^3$ given by Eq. (I.14), Eq. (II.17), and Eq. (IV.16) of APPENDIX I, APPENDIX II, and APPENDIX IV as a function of radius R where the position of the center of each distribution relative to the detector is the point (0,0,10) is given in FIGS. 2, 4, and 6, respectively. Since the fields vary as a function of radius R, the dipole field is not equivalent to these distributions of dipoles. It is further mathematically proven in APPENDIX III that the field produced by a shell of magnetic dipoles is different from that of a single dipole. All other fields are a linear combination of dipoles. Thus, the dipole is a basis element for the reconstruction of a magnetic susceptibility image. Since each dipole to be mapped gives rise to a unique field and since the total field at a detector is the superposition of the individual unique dipole fields, linear independence is assured; therefore, the ReMSI map or image is unique. In other words, there is only one solution of the ReMSI image for a given set of detector values which spatially measure the superposition of the unique fields of the dipoles. This map can be reconstructed using the algorithms described in the Reconstruction Algorithm Section.

Reconstruction of the Magnetic Susceptibility Map

Figure 9:
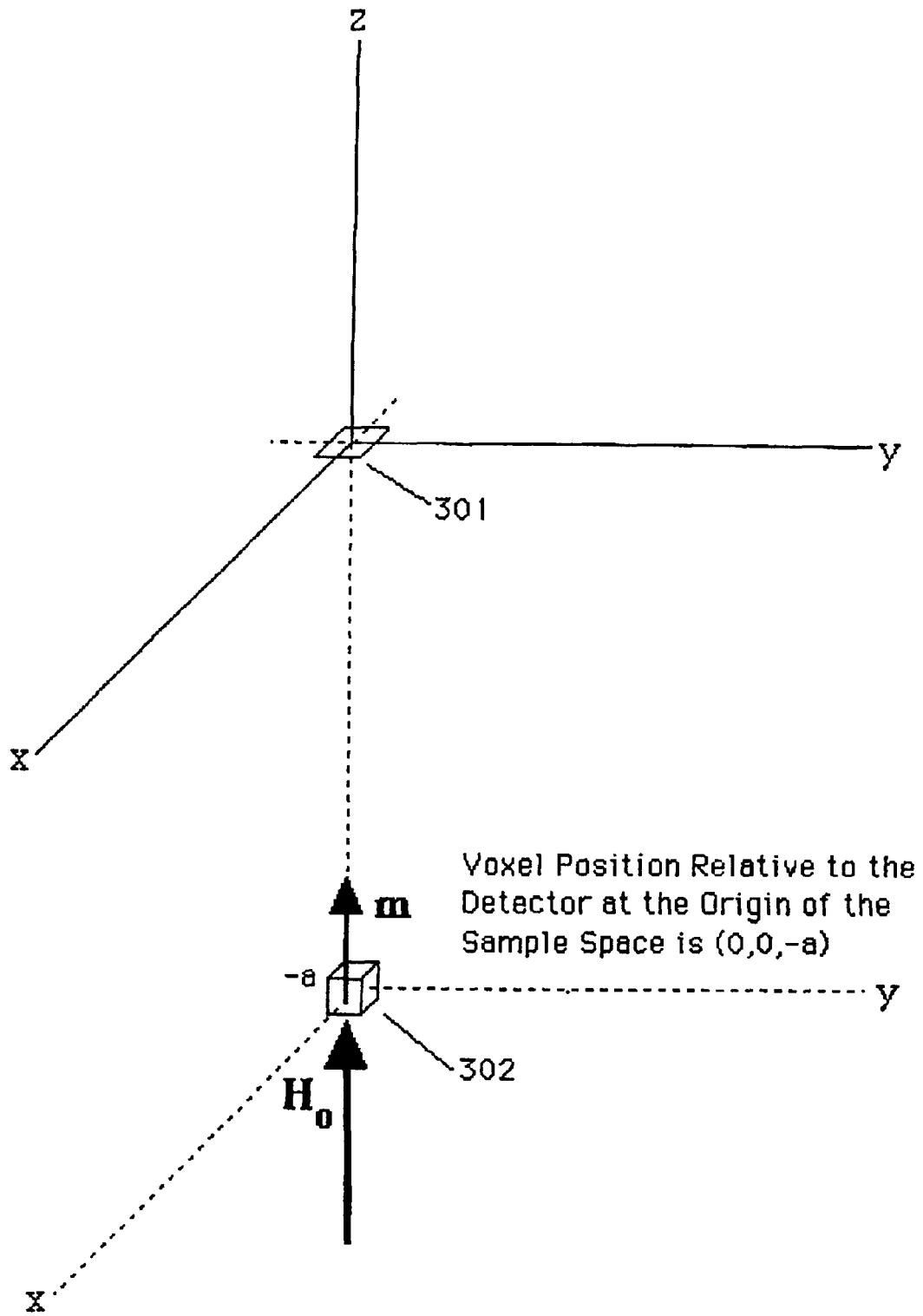
FIG. 9 shows the coordinate system (x, y, z) of Eq. (2) with a primary field $H_0$ and the corresponding magnetic dipole both oriented parallel to the z-axis wherein the z-component of the flux due to the z-oriented dipole is measured at a detector according to Eq. (2) and shows the distances from the voxel to the detector in accordance with the invention.

The volume to be imaged is divided into volume elements called voxels, and the magnetized voxel 302 shown in FIG. 9 with magnetic moment density $\chi B$ is modeled as a magnetic dipole where $\chi$ is the average volume magnetic susceptibility of the voxel and B is the magnetizing flux at the position of the dipole corresponding to a magnetizing field $H_0$. Data comprising the z-component of the magnetic field of a dipole oriented in the z-direction is acquired by detectors 301 in the three dimensional sample space comprising the xy-plane and the positive z-axis as shown in FIG. 9. The magnetic moment, $m_z$, of each voxel within the phantom is given by the product of its volume magnetic susceptibility, $\chi$, the magnetizing flux oriented along the z-axis, $B_z$, and the volume of the voxel, $\Delta V$.

$$m_z = \chi B \Delta V \tag{14}$$

The magnetic moment m of each voxel is a magnetic dipole. And, the phantom can be considered to be a three-dimensional array of magnetic dipoles. At any point extrinsic to the phantom, the z-component of the secondary flux, B', from any single voxel is $$B = m_z 2z^2 - x^2 - \frac{y^2}{(x^2 + y^2 + z^2)^{5/2}} \quad (15)$$

where x, y, and z are the distances from the center of the voxel to the sampling point. It is shown in APPENDICES I–IV that no geometric distribution of magnetic dipoles can give rise to Eq. (2). Therefore, the flux of each magnetic dipole (voxel contribution) forms a basis set for the flux of the array of dipoles which comprise the magnetic susceptibility map of the phantom.

Eq. (2) is a system function which gives the magnetic flux output in response to a magnetic dipole input at the origin. The phantom is an array of spatially advanced and delayed dipoles weighted according to the magnetic susceptibility of each voxel; this is the input function. The secondary flux is the superposition of spatially advanced and delayed flux, according to Eq. (2); this is the output function. Thus, the response of space to a magnetized phantom is given by the convolution of Eq. (2) with the series of weighted, spatially advanced and delayed dipoles representing the susceptibility map of the phantom. The discrete signals are recorded by a detector array over the sample space comprising the xy-plane and the positive z-axis.

In an embodiment of the present invention, nuclear magnetic resonance (NMR) is the means to measure the secondary magnetic field to provide the input to the magnetic susceptibility reconstruction algorithm. In this case, the measured secondary (RF) field is transverse to the magnetic flux including the local contribution due to the magnetic susceptibility of the voxel. The RF field is detected in the near zone where $r<<\lambda$ (or $kr<<1$), and the near fields are quasi-stationary, oscillating harmonically as $e^{-i\omega t}$, but otherwise static in character. Thus, the transverse RF magnetic field of each voxel is that of a dipole, the maximum amplitude is given by Eq. (2) wherein the Larmor frequency of each voxel is shifted due to its magnetic susceptibility, and $m_z$, the magnetic moment along the z-axis, of Eq. (2) corresponds to the bulk magnetization M of each voxel. The reconstruction may be multiplexed by using the NMR signals as the input. The NMR frequency is determined by the magnetizing flux which includes a contribution from the magnetic susceptibility of the voxel. Each voxel or voxels which have a unique local magnetic flux will have a unique a NMR frequency. The spatial variation of the intensity of the transverse RF signal of this unique frequency is the input for the reconstruction algorithm. This procedure is performed either in parallel or series for each data set of signals of each unique frequency. The magnetic susceptibility image is the superposition of the independent images, each of which corresponds to a unique frequency.

Frequency Multiplexing by Nuclear Magnetic Resonance Measurement of the Secondary Field Over the Sample Space The NMR active nuclei including protons posses both angular momentum and a magnetic moment. When nuclei are placed in a static magnetic field $H_0$, they precess about the field at a frequency proportional to the magnitude of $H_0$. The bulk magnetization M of each voxel comprises the vector sum of the magnetic moments from all of the nuclei in each voxel. If the precessing nuclei are then subjected to an additional rotating (RF) field $H_1$, which is synchronous with the precession, their magnetic moments and thus M will precess about $H_1$ and rotate away from the primary field $H_0$ by an angle $\phi$ in a coordinate frame which rotates at the Larmor frequency [3]. The precession about $H_1$ continues as long as $H_1$ exists. The final value of $\phi$ then depends on the strength of $H_1$, which determines the precession rate, and the time for which it is turned on. The nuclei absorb energy as they change their orientation. This is known as nuclear magnetic resonance (NMR). The temperature of the nuclei or nuclear spin system rises during absorption of energy. When the $H_1$ field is removed, the spin system cools down until it is in thermal equilibrium with its environment. The exponential relaxation of the spin system temperature to that of the surrounding lattice is called spin-lattice relaxation and has a time constant $T_1$ where a time constant is defined as the time it takes for 63% of the relaxation to occur. The NMR signal may also decay because the nuclei initially in phase following the $H_1$ pulse get out of alignment with each other or dephase by local interactions with the magnetic fields of neighbor nuclei. The dephasing of the NMR signal is due to differing precession rates effected by the local interactions and is described by an exponential time constant $T_2$. The main source of NMR image ( also called magnetic resonance images (MRI)) contrast is $T_1$ and $T_2$ which depend on tissue types. In an embodiment of the present invention, $T_1$ and $T_2$ are used to provide image contrast as described in the Contrast Section.

In other words, when nuclei are placed in a static magnetic field $H_0$ and then subjected to an additional rotating (RF) field $H_1$, which is synchronous with their precession, M will precess about $H_1$ and rotate away from the primary field $H_0$ by an angle $\phi$. The magnitude of M is a maximum initially and decays with time. This occurs by emission of the same multipolarity radiation that it absorbed and by transfer of energy to the surrounding lattice. The intensity of the radiation is a function of M and the coordinate position relative to the RF emitting voxel. In the present invention, the measurement of the intensity of the RF signal is performed over time and space. The signal as a function of time at a given detector position is Fourier transformed to give the spectrum. The magnetic susceptibility of each voxel is determined from the shift of the Larmor frequency due to the presence of the voxel in the magnetizing field. The intensity variation of the transverse RF field over space is used to determine the coordinate location of each voxel.

The nature of the RF field can be determined from Maxwell's equations applied to a sinusoidal current. With a sinusoidal current $J(x')$ confined to small region compared with a wavelength, the solution of the vector potential $A(x)$ is [4]

$$A(x) = \frac{1}{c} \int J(x') \frac{e^{ik|x-x'|}}{|x-x'|} d^3 x' \quad (16)$$

where $k=\omega/c$ is the wavenumber, and a sinusoidal time dependence is understood. The magnetic induction is given by $$B = \Delta \times A \quad (17)$$

while, outside the source, the electric field is $$E = i/k \Delta \times B \quad (18)$$

For a source of dimension d, the fields in the far zone defined by $d<<\lambda<<r$ are transverse to the radius vector and fall off as $r^{-1}$, typical of radiation fields. For the near zone where $r<<\lambda$ (or $kr<<1$), the exponential in Eq. (16) can be replaced by unity. Then the vector potential is given by $$\lim_{kr \to 0} A(x) = \frac{1}{c} \sum_{l,m} \frac{4\pi}{2l+1} \frac{Y_{lm}(\theta, \phi)}{r^{l+1}} \int J(x') r'^{l} Y_{lm}^*(\theta', \phi') d^3x' \quad (19)$$

This shows that the near fields are quasi-stationary, oscillating harmonically as $e^{i\omega t}$, but otherwise static in character.

Nuclear magnetic resonance (NMR), which is commonly called magnetic resonance imaging (MRI), is a means to measure the primary and secondary magnetic fields to provide the input to the magnetic susceptibility reconstruction algorithm. The proton gyromagnetic ratio $\gamma_p/2\pi$ is $$\gamma_p/2\pi = 42.57602 \text{ MHzT}^{-1} \quad (20)$$

The NMR frequency f is the product of the proton gyromagnetic ratio given by Eq. (20) and the magnetic flux B.

$$f = \gamma_p/2\pi B = 42.57602 \text{ MHz } T^{-1} B \quad (21)$$

A typical flux for a superconducting NMR imaging magnet is 0.25 T. According to Eq. (21) this corresponds to a radio frequency (RF) of 10.6 MHz which corresponds to a wavelength of 28.3 m. In the present invention, each RF antennae of an array is located at a distance of about 10 cm from the voxels within the image space. Thus, the RF field is detected in the near zone where $r<<\lambda$ (or $kr<<1$), and the near fields according to Eq. (19) are quasi-stationary, oscillating harmonically as $e^{-i\omega t}$, but otherwise static in character. The transverse RF magnetic field of each voxel is that of a RF dipole, the maximum amplitude is given by Eq. (2) wherein the Larmor frequency of each voxel is shifted due to its magnetic susceptibility, and $m_z$, the magnetic moment along the z-axis, of Eq. (2) corresponds to the bulk magnetization M of each voxel.

The magnetic susceptibility gives rise to a magnetic moment and a secondary magnetic field at the position of the voxel as well as external to the object to be imaged. In fact, magnetic susceptibility has been imaged by conventional MRI under extraordinary conditions [5]. In the case of NMR detection of this secondary field according to the present invention, the transverse RF field is measured. An array of miniature RF antennas point samples the dipole component (Eq. (2)) of the RF signal due to the perpendicularly oriented magnetic susceptibility moment of each voxel over the sample space such as the half space above the object to be imaged. The magnetic susceptibility of each voxel is determined from the shift of the Larmor frequency due to the presence of the voxel in the magnetizing field. The intensity variation of the transverse RF field over space is used to determine the coordinate location of each voxel. The RF field is the near field which is a dipole (with a maximum amplitude given by Eq. (2)) that serves as a basis element to form a unique reconstruction. The geometric system function corresponding to a dipole which determines the spatial intensity variations of the RF field is a band-pass for $k_\rho = k_z$. In the limit, each volume element is reconstructed independently in parallel with all other volume elements such that the scan time is no greater than the nuclear free induction decay (FID) time.

In the case of NMR detection, the RF frequency signal from a magnetized object (Eq. (21)) is due to the total flux B which is the sum of the flux from the primary magnetizing field $\mu_0 H$ and the secondary flux $\mu_0_\chi H$ from the magnetic susceptibility $\chi$ of the voxel:

$$B = \mu_0(1+\chi)H \quad (22)$$

where $\mu_0$ is the permeability of free space and H is the primary magnetizing field strength. Eq. (22) expressed in the form of Eq. (1) is $$m_z = (1+\chi)B\Delta V \quad (23)$$

where $\mu_0 H$ is the magnetizing flux and $(1+\chi)$ is herein defined as the total magnetic susceptibility. It can be seen from Eq. (23) that the total magnetic susceptibility map can be determined from the total magnetic moment map if the magnetizing flux map is known. Since $\chi \approx 10^{-4}-10^{-5}<<1$, the magnetic susceptibility $\chi$ causes a small perturbation to the magnetizing flux. Thus, the magnetizing flux must be stable to at least the magnitude of the signal contribution due to the magnetic susceptibility. A feature of superconducting magnets is their extreme stability. The object to be imaged is magnetized with a highly stable magnet such as a superconducting magnet. In this case, a magnetic field stability of $10^{-8}\%$ over a month's time is feasible. It can further be seen from Eq. (21) and Eq. (23) that the total magnetic moment map can be determined from the NMR frequencies as input. Since $\chi \approx 10^{-4}-10^{-5}<<1$, the magnetic susceptibility $\chi$ causes a small perturbation to each NMR frequency (Eqs. (21) and (22)). However, extremely high frequency resolution is routine. The frequency resolution of RF signals exceeds $10^{-8}\%$. Small antennas measure the RF signals as point samples without significant decrease in the signal to noise ratio relative to large antennas by using impedance matching while minimizing resistive losses by using superconducting reactance elements, for example. In an embodiment, cross talk between antennas is ameliorated or eliminated by time multiplexing the signal detection over the array of antennas.

In an embodiment, the strength and duration of the rotating $H_1$ (RF) field that is resonant with the protons of the magnetized volume and is oriented perpendicularly to the direction of the magnetizing field is applied such that the final precession angle of the magnetization is 90° ($\phi$=90°) such that the RF dipole is transverse to the static magnetizing field and perpendicular to the RF magnetic field detector 20a as shown in FIG. 11. The transverse RF field is a dipole. The intensity is determined for each frequency at each detector for at least one synchronized (common) time period or short time interval (the period corresponding to the Larmor frequency is $10^{-8}-10^{-7}$ sec compared to the $T_1$ (spin/lattice) and $T_2$ (spin/spin) relaxation times of 1–5 sec) to form a matrix for each frequency of the intensity as a function detector position in sample space (i.e. spatial variation of the intensity at a determined common time point). The magnetic moment corresponding to each frequency is given by Eq. (21). Thus, each matrix comprises the intensity variation over the sample space of the RF field of the bulk magnetization M of each voxel having the corresponding magnetic moment. The rotating NMR coordinates and the stationary NMR coordinates are both shown in FIG. 11. According to Eq. (2), the signal as a function of time which is Fourier transformed arises from each transverse RF magnetic dipole oriented in the $x_R y_R$-plane (rotating NMR coordinates) which is periodically parallel to the y-axis and rotates about the primary field $H_0$ oriented parallel to the z-axis at the Larmor frequency (stationary NMR coordinates). For the stationary NMR case, the y-axis corresponds to the z-axis of Eq. (2), and $m_z$, the magnetic moment along the z-axis, of Eq. (2) corresponds to the bulk magnetization M of each voxel.

In addition, the spectrum comprises an additional component corresponding to the measurement of the RF magnetic dipole which is periodically parallel to the x-axis and rotates about the primary field $H_0$ oriented parallel to the z-axis at the Larmor frequency wherein the x-axis of the stationary NMR coordinates corresponds to the x-axis of Eq. (2). The components rotate at the same frequency but are orthogonal. The orthogonality corresponds to a phase angle of the Fourier transform of 90°; thus, the spectrum contains a real and an imaginary part at the each Larmor frequency. The magnitude of the amplitude of the signal due to the dipole oriented parallel to the y-axis (z-axis of Eq. (2)) exceeds that of the dipole oriented parallel to the x-axis (x-axis of Eq. (2)). In an embodiment, the spatial variation over the detector array of the component at each Larmor frequency with the maximum amplitude is used to determine the coordinate location of each voxel using the geometric system function of the detection of the z-component of a z-oriented dipole as given in the Reconstruction Algorithm Section. This geometric system function is a band-pass for $k_\rho = k_z$ In another embodiment, the spatial variation over the detector array of the lesser magnitude orthogonal component at each Larmor frequency is used to determine the coordinate location of each voxel using the corresponding geometric system function as described in the Reconstruction Algorithm Section. The system function for the case of the minor orthogonal component in terms of the coordinates given in FIG. 9, corresponds to the detection of the x-component of a z-oriented dipole. The geometric system function is given by the function of the x-component of the flux B' from a z-oriented dipole at any point extrinsic to the image space, from any single voxel:

$$B' = m_z 3 \frac{xz}{(x^2 + y^2 + z^2)^{5/2}} \quad (24)$$

where x, y, and z are the distances from the center of the voxel to the sampling point and $m_z$ is the magnetic moment along the z-axis corresponding to the bulk magnetization M of each voxel for the NMR case.

The magnetic susceptibility map is obtained by first reconstructing the magnetic moment map. The ReMSI scan performed on the object to be imaged including a human comprises the following steps:

The primary or magnetizing field is first determined over the image space in the absence of the object to be imaged. In one embodiment, NMR of a proton containing homogeneous phantom of known susceptibility such as water is determined on a point by point basis to map the primary field, or the magnetic flux at multiple points is obtained simultaneously using the reconstruction algorithm described herein via determining the magnetic moment map over all or a portion of the image space, and then determining the field using the known magnetic susceptibility of the phantom.

The magnetic moments of nuclei including protons of the object to be imaged that are aligned by the primary field are further aligned by a radio frequency (RF) pulse or series of pulses.

The strength and duration of the rotating $H_1$ (RF) field that is resonant with the protons of the magnetized volume and is oriented perpendicularly to the direction of the magnetizing field is applied such that the final precession angle of the magnetization is 90° ($\phi=90°$) such that the RF dipole is transverse to the primary magnetizing field and perpendicular to the RF magnetic field detector.

The nuclei precess and emit RF energy at the frequency determined by the total magnetic flux at the voxel which is the superposition of the primary (applied flux) and the secondary (magnetic susceptibility flux).

The precessing nuclei undergo a free induction decay as they emit energy.

The magnetic intensity is time harmonic according to the magnetic flux at each voxel. The time dependent signals are Fourier transformed to give the spectrum. The magnetic moment corresponding to each frequency is determined (Eq. (21)).

The transverse RF field is a dipole. The maximum intensity is determined for each frequency at each detector for at least one synchronized (common) time period or short time interval to form a matrix for each frequency of the intensity as a function detector position in sample space (i.e. spatial variation of the intensity at a determined common time point). Thus, each matrix comprises the intensity variation over the sample space of the RF field of the bulk magnetization M of each voxel having the corresponding magnetic moment. (Typically, if more than one voxel has the same magnetic susceptibility and the magnetization field is uniform, then they will have essentially an equivalent bulk magnetization M. In this case and the case that only one voxel gives rise to a given Larmor frequency, the matrix comprising the intensity variation over the sample space of the RF field of the bulk magnetization M of each voxel having the corresponding magnetic moment is essentially the matrix comprising the intensity variation over the sample space of the secondary field due to the magnetic susceptibility with each term multiplied by a constant.)

The Fourier transform algorithm given in the Fourier Transform Reconstruction Algorithm Section is performed on each frequency component over the detector array to map the bulk magnetization M of each voxel having the corresponding magnetic moment to a spatial location or locations over the image space. The later case applies if the same magnetic moment is at more than one position in the image.

In one embodiment, the voxels with a finite bulk magnetization M above a certain threshold or at an edge in the map are assigned the magnetic susceptibility (magnetic moment) determined from the shift of the Larmor frequency due to the presence of the voxel(s) in the uniform (nonuniform) magnetizing field. The other voxels are assigned a zero value. This procedure is repeated for all Larmor frequencies. In the limit with sufficient Larmor frequency resolution, each volume element is reconstructed independently in parallel with all other volume elements such that the scan time is no greater than the nuclear free induction decay (FID) time.

In the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)).

The total magnetic susceptibility map is the superposition of the separate maps for each magnetic moment corresponding to a unique Larmor frequency which is plotted and displayed.

The quality of the image (i.e. the signal to noise ratio of the image) can be increased by repeating the reconstruction over multiple time points wherein each data set of a given time point is the set of matrices of the intensity variation over the sample space of the RF field of the bulk magnetization M of each voxel having the corresponding magnetic moment at that synchronized (common) time point.

System Construction

Figure 8:
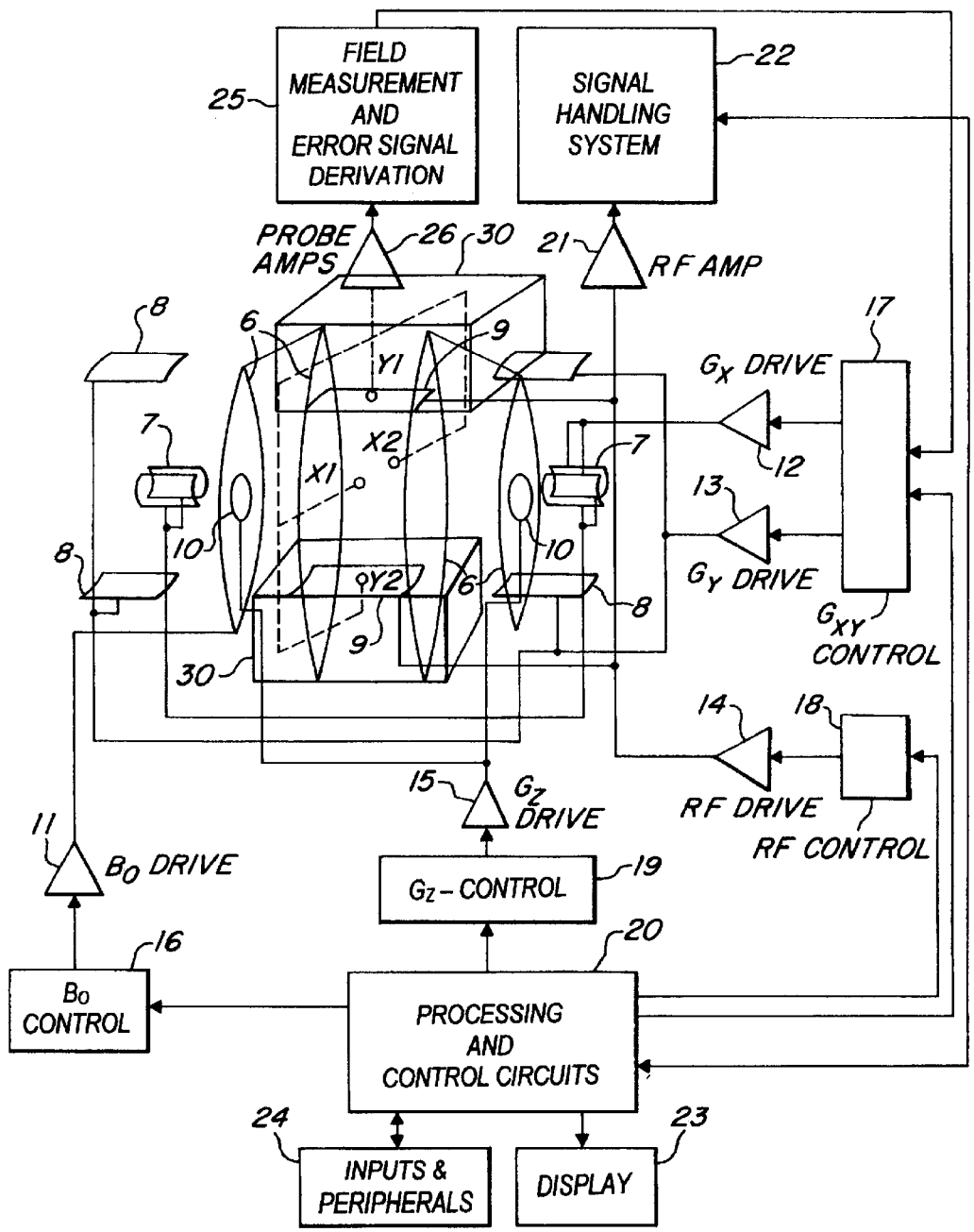
FIG. 8 shows another embodiment of the magnetic susceptibility system in accordance with the teachings of the present invention.

The ReMSI system 110 of FIG. 1*a* and the system of FIG. 8 includes (1) a magnet including a superconducting magnet to magnetize a volume of an object or tissue to be imaged, (2) a magnetometer to determine the primary or magnetizing flux over the image space in the absence of the object to be imaged, (3) a two or three dimensional detector array which is translated over the third dimension or a three dimensional detector array wherein each detector is selectively responsive to a single component of the secondary magnetic field which is produced by the magnetized voxels of the object including tissue where the component of the field to which the detector is responsive determines the geometric system function which is used in the reconstruction algorithm discussed in the Reconstruction Algorithm Section, and the detectors ideally point sample the secondary magnetic field at the Nyquist rate over the spatial dimensions which uniquely determine the susceptibility map which is reconstructed from the measurements, 4.) an analogue to digital converter to digitize the secondary magnetic field measurements, 5.) a reconstruction algorithm processor including a Fourier transform processor to map the magnetic moments to the image coordinates and convert each magnetic moment map into a magnetic susceptibility map, and 6.) image processors and a display such that the ReMSI image can be rotated in space to be displayed from any perspective as a three dimensional or two dimensional (tomographic) image.

Magnetizing Field

In an embodiment of the present invention, the applied magnetizing field which permeates the object to be imaged including tissue is confined only to that region which is to be imaged. The confined field limits the source of signal only to the volume of interest; thus, the volume to be reconstructed is limited to the magnetized volume which sets a limit to the computation required, and eliminates end effects of signal originating outside of the edges of the detector array. In the NMR case, the field having a steep gradient at the edges limits the imaged region by providing a range of Larmor frequencies wherein the data is rejected at a threshold Larmor frequency.

A magnetic field gradient can be applied in the direction perpendicular to the plane of the detector array described below to alter the dynamic range of the detected signal, as described in the Altering the Dynamic Range Provided by the System Function Section or in other orientations to improve the image quality. The magnetizing means can also possess a means to add a component of modulation to the magnetizing field at frequencies below those which would induce eddy currents in the tissue. Such modulation would cause an in-phase modulation of the RF secondary magnetic field signal which can be filtered to improve the signal to noise ratio, or the modulation over space can be used to encode spatial information.

Dynamic Range

As described in the Nyquist Theorem with the Determination of the Spatial Resolution Section, the system function which effects a dependence of the signal on the inverse of the separation distance between a detector and a dipole cubed band-passes the magnetic susceptibility function; however, the resulting signals are of large dynamic range requiring at least a 12-bit A/D converter. A 12 bit A/D converter is sufficient with a magnetizing design which exploits the dependence of the signal on the strength of the local magnetizing field. In an embodiment of the case shown in FIG. 9, a quadratic magnetizing field along the z-axis is applied in the z-direction such that the fall-off of the signal of a dipole with distance is compensated by an increase in the signal strength due to a quadratically increasing local magnetizing field. The reconstruction algorithm is as discussed in the Reconstruction Algorithm Section; however, each element of the matrix containing the magnetic moment values is divided by the corresponding element of the matrix containing the values of the flux magnetizing the corresponding magnetic susceptibility. These operations are described in detail in the Altering the Dynamic Range Provided by the System Function Section. Eq. (2) shows that the field at the detector drops off as the cube of the distance from the voxel of tissue. By applying a voxel magnetizing field that increases as the cube of the distance from the detector to the voxel, the field at the detector becomes independent of the distance from the voxel. In this case, the field is given by $$B_z = B_0 [a^2 + z_n^2]^{3/2} \tag{25}$$

where $a_0$ and $B_0$ are constants and $z_n$ is the distance from the detector to the voxel. Thus, a magnetizing field that increases as the distance cubed from the detector "levels" the magnitude of signals from voxels at different locations relative to the detector.

In the NMR case shown in FIG. 11, a quadratic magnetizing field along the y-axis is applied in the z-direction such that the fall-off of the signal of a dipole with distance is compensated by an increase in the signal strength due to a quadratically increasing local magnetizing field. The reconstruction algorithm is as discussed in the Reconstruction Algorithm Section; however, each element of the matrix containing the magnetic moment values is divided by the corresponding element of the matrix containing the values of the flux magnetizing the corresponding magnetic susceptibility. These operations are described in detail in the Altering the Dynamic Range Provided by the System Function Section. Eq. (2) shows that the transverse dipole field at the detector drops off as the cube of the distance from the voxel of tissue. By applying a voxel magnetizing field that increases as the cube of the distance from the detector to the voxel, the field at the detector becomes independent of the distance from the voxel. In this case, the field is given by $$B_z = B_0 [a^2 + y_n^2]^{3/2} \tag{26}$$

where $a_0$ and $B_0$ are constants and $y_n$ is the distance from the detector to the voxel. Thus, a magnetizing field that increases as the distance cubed from the detector "levels" the magnitude of signals from voxels at different locations relative to the detector.

Detector Array

The ReMSI imager comprises a detector array of multiple detector elements which are arranged in a plane. The array is a two dimensional detector array which is translated over the third dimension during the scan, or it is a three dimensional detector array. The individual detectors of the array respond to a single component of the secondary magnetic field which is produced by the magnetized object including tissue where the component of the field to which the detector is responsive determines the geometric system function which is used in the reconstruction algorithm discussed in the Reconstruction Algorithm Section. The detectors ideally point sample the secondary magnetic field at the Nyquist rate over the spatial dimensions which uniquely determine the susceptibility map which is reconstructed from the measurements. The magnetic field detectors include superconducting quantum interference devices (SQUIDs) wherein the SQUIDs are cooled below the critical temperature after the primary field is turned on and stabilized [6]. Thus, they link the flux of the primary field and are responsive to the secondary field only. Micromagnetic field sensors that are used to detect the primary field in the absence of the object to be scanned and to measure the secondary field have been developed that are based on galvanometric effects due to the Lorentz force on charge carriers. In specific device configurations and operating conditions, the various galvanomagnetic effects (Hall voltage, Lorentz deflection, magnetoresistive, and magnetoconcentration) emerge. Semiconductor magnetic field sensors include MAGFETs, magnetotransitors (MT), Van der Pauw devices, integrated bulk Hall devices including the vertical MT (VMT), and the lateral MT (LMT), silicon on saphire (SOS) and CMOS magnetodiodes, the magnetounijunction transistor (MUJT), and the carrier domain magnetometer (CDM), magnetic avalanche transistors (MAT), optoelectronic magnetic field sensors, and magnetoresistive magnetic field sensors. In the case of NMR measurement of the secondary field (and/or the primary field), the detector array comprises RF antennas described in the NMR Primary Magnet, Gradient Magnets, RF Generator, RF Transmitter, and RF Receiver Section.

Figure 10:
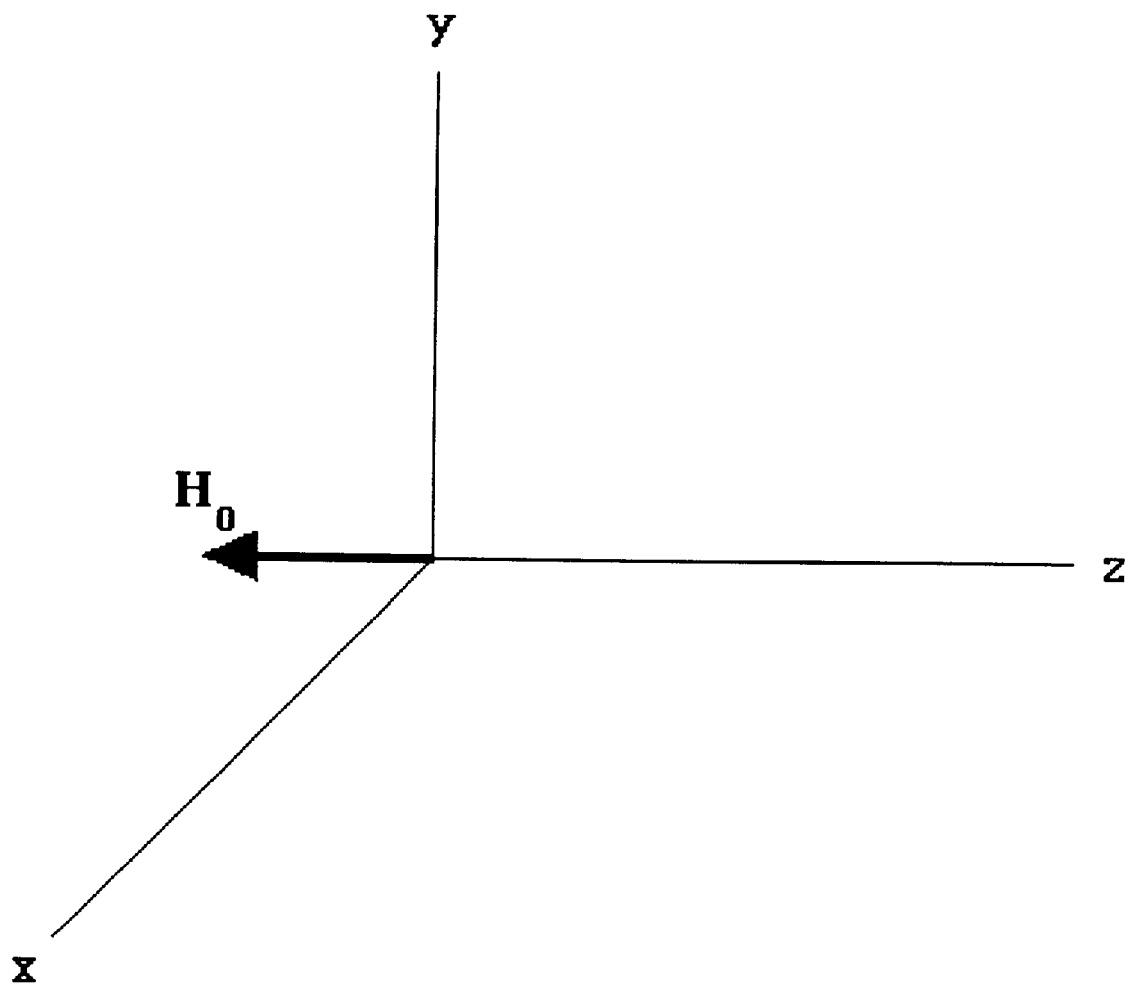
FIG. 10 shows the stationary coordinate system of the magnetic susceptibility system of FIG. 8 corresponding to the coordinate system of FIG. 9 in accordance with the present invention.

NMR Primary Magnet, Gradient Magnets, RF Generator, RF Transmitter, and RF Receiver The NMR embodiment of the ReMSI apparatus used to generate, and measure the secondary field and reconstruct the magnetic susceptibility map is shown in FIG. 8, and the corresponding coordinate system is shown in FIG. 10. The apparatus comprises 1.) a magnet including a superconducting magnet to magnetize a volume of an object or tissue to be imaged, 2.) a means (magnetometer) to determine the primary or magnetizing flux over the image space in the absence of the object to be imaged. In one embodiment, NMR of a proton containing homogeneous phantom of known susceptibility such as water is determined on a point by point basis to map the primary field, or the magnetic flux at multiple points is obtained simultaneously using the reconstruction algorithm described herein via determining the magnetic moment map over all or a portion of the image space, and then determining the field using the known magnetic susceptibility of the phantom, 3.) a radio frequency (RF) generator and transmitter including an antennae such as saddle coils to excite the protons of the magnetized volume, 4.) a means including an antennae coil to sample the dipole component (z-component in terms of Eq. (2)) of the RF secondary magnetic field at the Nyquist rate in time over the proton free induction decay, 5.) a detector array of elements of the means to sample the time signals including an antennae array which is selectively responsive to the dipole component (z-component of Eq. (2)) of the RF magnetic field of the magnetic moments of the protons which are aligned along the transverse axis to ideally point sample the secondary magnetic field at the Nyquist rate over the spatial dimensions which uniquely determine the susceptibility map which is reconstructed from the measurements, 6.) an analogue to digital converter to digitize the RF signals, 7.) a time Fourier transform processor to convert the signal at each detector over time into its spectrum, 8.) a reconstruction algorithm processor including a Fourier transform processor to convert frequencies into magnetic moments, map the magnetic moments to the image coordinates in parallel, convert each magnetic moment map into a magnetic susceptibility map, and superimpose the magnetic susceptibility maps of all the magnetic moments, and 9.) image processors and a display such that the ReMSI image can be rotated in space to be displayed from any perspective as a three dimensional or two dimensional (tomographic) image.

The primary magnet is that typical of a magnetic resonance imaging apparatus. The primary magnetizing field is in the z-direction as shown in FIG. 10, usually coaxial with the patient's body. However, in an another embodiment the primary magnetizing field is in the direction which is perpendicular to the patient's body. An open primary magnet design is preferable such as a Helmholtz coil design to accommodate the three dimensional RF antennae array. A further field is applied to have a gradient in the z-direction (FIG. 10). This provides a unique total value field in a chosen volume of the patient including a cross-sectional slice of the patient. A rotating RF field $H_1$, of frequency chosen to cause resonance in the slice is then applied. Thus, only the molecules in the slice resonate. The resonance signal from the slice can then be detected. In another embodiment, the NMR (Larmor) frequency from each voxel is essentially determined by the magnitude of the magnetizing flux at the voxel position. Thus, the magnetizing flux provides a carrier frequency. The primary magnetic field has a sharp gradient at the edges of the image space wherein the Larmor frequencies outside of a selected range are rejected as arising from voxels outside of the image volume.

The ReMSI imager comprises a RF generator 14 and 18 and RF transmitter coils 9 shown in FIG. 8 which provide the rotating $H_1$ (RF) field that is resonant with the protons of the magnetized volume and is oriented perpendicularly to the direction of the magnetizing field as shown in FIG. 11. When the precessing nuclei are subjected to the additional rotating (RF) field $H_1$, which is synchronous with the precession, their magnetic moments and thus M precesses about $H_1$ and rotate away from the primary field $H_0$ by an angle $\phi$ in a coordinate frame which rotates at the Larmor frequency [3]. The precession about $H_1$ continues as long as $H_1$ exists. The final value of $\phi$ then depends on the strength of $H_1$, which determines the precession rate, and the time for which it is turned on. In an embodiment, the strength and duration of $H_1$ is such that $\phi=90°$ such that the dipole is oriented in the $x_R y_R$-plane of FIG. 11. A rotating coordinate frame is traditionally used to explain the physics of NMR [3]. Thus, is terms of the traditional NMR coordinate designation as described by Patz [3] and Hounsfield [7] shown in FIG. 11, the $x_R$-axis and $y_R$-axis rotate about the primary field $H_0$ oriented parallel to the $z_R$-axis at the Larmor frequency relative to the stationary NMR coordinate system (x, y, z) shown in FIG. 10. Thus, the additional rotating (RF) field $H_1$ and the transverse RF magnetic field are stationary in the rotating NMR coordinate system, but rotate at the Larmor frequency in the stationary NMR coordinate system. Both the rotating and stationary coordinate systems are shown in FIG. 11. In an embodiment, the rotating $H_1$ (RF) field is along the $y_R$-axis and rotates the magnetization vector by the angle $\phi=90°$ to into the $x_R y_R$-plane. In terms of the reconstruction by the present invention, the system function of the field corresponding to the rotated magnetization vector is equivalent to that of the detection of the z-component of a z-oriented dipole. The y-axis is the unique axis of the NMR system shown in FIG. 8 and the stationary NMR coordinates shown in FIGS. 10 and 11 that corresponds to the unique axis of the Fourier Transform Reconstruction Algorithm Section, the z-axis shown in FIG. 9, and the magnetization axis is the z-axis. The magnetization axis of the NMR rotating coordinates [3,7] is the $z_R$-axis shown in FIG. 11. The measured transverse RF magnetic dipole oriented in the xy-plane is periodically parallel to the y-axis and rotates about the primary field $H_0$ oriented parallel to the z-axis at the Larmor frequency.

The RF transmitter includes saddle coils. The RF receiver is a three dimensional array, or two arrays 180° from each other, or two orthogonal pairs of arrays, wherein each member of a pair is 180° from each other. The detector ideally point samples the RF field at the Nyquist rate described in the Reconstruction Algorithm Section. In one embodiment shown in FIG. 11, each detector 20a is a coil antennae perpendicular to the y-axis and selective to the y-component of the RF secondary magnetic field arising from each voxel 14a magnetized in the z-axis direction. This two dimensional array is translated along the y-axis during a scan where readings of the secondary magnetic field are obtained as a function of the translation. In another embodiment shown in FIG. 12, the array 401 is three dimensional comprising multiple parallel two dimensional arrays 402 wherein each two dimensional array has a plurality of antennae coils 403 which detect the RF field from each magnetized voxel 404.

Figure 12:
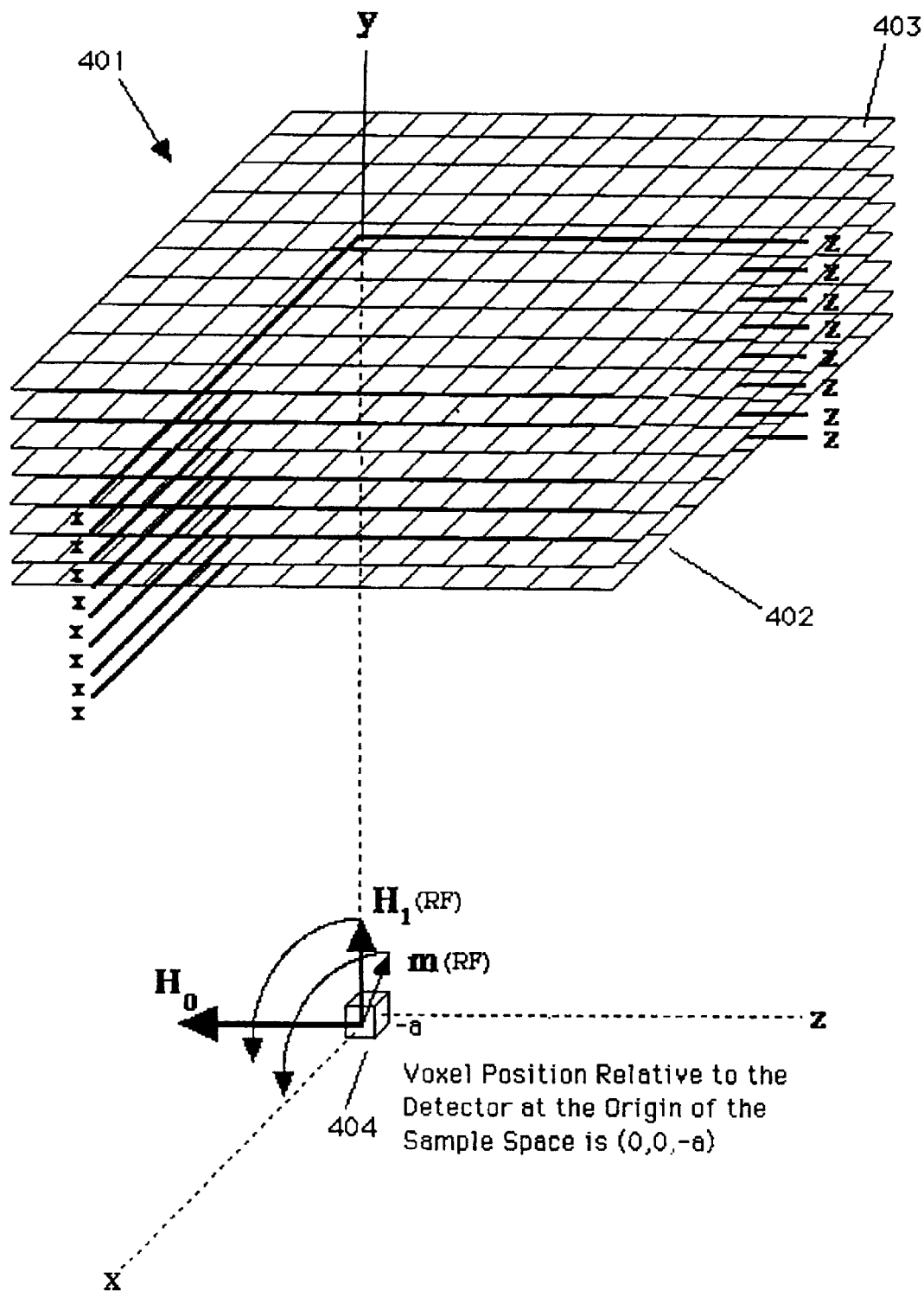
FIG. 12 is a schematic of the three dimensional detector (antennae) array with respect to the stationary NMR coordinate system of FIG. 10 which corresponds to the coordinate systems shown in FIGS. 9 and 11 in accordance with the present invention.

In another embodiment, the rotating $H_1$ (RF) field shown in FIG. 11 is along the $x_R$-axis and rotates the magnetization vector by the angle $\phi=90°$ to project into the $x_R y_R$-plane. In terms of the reconstruction by the present invention, the system function of the field corresponding to the rotated magnetization vector is equivalent to that of the detection of the z-component of a z-oriented dipole. The x-axis is the unique axis of the NMR system shown in FIG. 8 and the stationary NMR coordinates shown in FIGS. 10 and 11 that corresponds to the unique axis of the Fourier Transform Reconstruction Algorithm Section, the z-axis shown in FIG. 9, and the magnetization axis is the z-axis. The magnetization axis of the NMR rotating coordinates [3,7] is the $z_R$-axis shown in FIG. 11. The detector array receives similar signals as those produced by the transmitter, and both are perpendicular to the x-axis. Each detector is a coil antennae perpendicular to the x-axis and selective to the x-component of the RF secondary magnetic field arising from voxels magnetized in the z-axis direction. This two dimensional array is translated along the x-axis during a scan where readings of the secondary magnetic field are obtained as a function of the translation. In another embodiment, the array is three dimensional comprising multiple parallel two dimensional arrays 402 as shown in FIG. 12 with the exception that the array 401 is perpendicular to the x-axis. The measured transverse RF magnetic dipole oriented in the xy-plane is periodically parallel to the x-axis and rotates about the primary field $H_0$ oriented parallel to the z-axis at the Larmor frequency. A linear combination of the cases of rotation of the RF magnetization along the $x_R$-axis and the $y_R$-axis is within the scope of the present invention and may be adopted in a manner straightforward to those skilled in the NMR art to apply the fields and detectors described for this invention.

The method described herein may be performed on a suitable NMR examining apparatus such as that shown in simplified form in FIG. 8, and the corresponding coordinate system is shown in FIG. 10. Illustrated schematically only are coils 6, which provide $B_0$, the steady primary field 7, which provide $G_x$, the field gradient in the x-axis direction as shown, 8 which provide the $G_y$, the field gradient in the y-axis direction as shown, 9 which provide the RF field, and 10, which provide $G_z$, the field gradient in the z-axis direction as shown. The coils are driven by $B_0$, $G_x$, $G_y$, RF, and $G_z$ drive amplifiers 11, 12, 13, 14, and 15 respectively, controlled by $B_0$, $G_{xy}$, RF, and $G_z$ control circuits 16, 17, 18, and 19, respectively. These circuits can take suitable forms which will be well known to those with experience of NMR equipment and other apparatus using coil induced magnetic fields. The circuits are controlled by a central processing and control unit 20 to achieve the desired primary field, field gradients, and RF field to rotate the magnetization vector such that it is perpendicular to coil 9.

The RF coils are two saddle shaped coils 9 which are driven in parallel to provide the rotating RF field. The FID signals sensed are received in this example by the three dimensional array of RF coils 30 and are amplified by an RF amplifier 21 before being applied to signal handling circuits 22. The three dimensional detector array 30 is shown in more detail in FIG. 12 as the three dimensional detector array 401. The circuits 22 are arranged to make any appropriate calibrations and corrections but essentially transmit the signals to the processing circuits to provide the required representation of the examined volume. These circuits can conveniently be combined with the circuits which control the primary field, field gradients, and RF field and thus are included in the circuits indicated at 20. The picture thus obtained is viewed on a display 23, such as a television monitor, and this may include inputs and other peripherals 24 for the provision of commands and instructions to the machine, or other forms of output.

The apparatus also includes field measurement and error signal circuits 25 which receive signals via amplifiers 26 from field probes $X_1$, $X_2$, $Y_1$, and $Y_2$ shown.

The patient 27 is inserted in the tubular former of $G_x$ and $G_y$ coils 7, 8 and is supported there by a suitable couch or other supporting means. Such supports may be readily provided in any suitable form.

The coils 7, 8 are two sets of coils axially displaced, each set comprising two pairs of saddle coils the pair 7 being at 90° to the pair 8. These coils are themselves inserted into the central aperture in $B_0$ coils 6 which in an embodiment are wound in four parts connected in series to provide an approximately circular configuration which is well known to be desirable for production of a uniform field. Further details of the coil winding will not be given since suitable coils can readily be devised, by those with the appropriate skills, to provide the fields required.

The appropriate stores provide the amplitude and duration signals which are converted to analogue form in digital to analogue converters (DAC's) and applied to respective coil drive circuits x, y, z, RF. The respective drive circuits, which can take any form well known for driving field coils, provide the specified currents to the appropriate coil for the specified duration. The apparatus and circuits described so far may be adopted to provide different gradients and RF fields, by appropriately adjusting the stored sequences and profile data. Similarly other known NMR apparatus which are capable of applying a steady magnetic field, a pulsed RF field, and $G_x$, $G_y$, and $G_z$ field gradients to a body, may be adopted in a manner straightforward to those skilled in the NMR art to apply the fields described for this invention.

With the basic signal handling system of the present invention, the FID signals from the signal sensing coils of the detector array 30 (shown in more detail in FIG. 12 as coils 403 of the three dimensional detector array 401) are amplified in an RF amplifier and applied via an analogue to digital converter (ADC) to a store such as a random access memory (RAM). The data is then processed according to the procedure given in the Reconstruction Algorithm Section.

Reconstruction Algorithm

In the reconstruction process described herein, the secondary field may be in the same or in a transverse orientation relative to the primary field. In each case, the orientation of the secondary dipole field and the measured secondary dipole field component are according to Eq. (2). The relationship of the coordinate systems of the present invention are shown in FIGS. 9, 10, and 11. The primary and secondary fields are parallel and stationary in FIG. 9 versus transverse in the rotating and stationary NMR coordinates shown in FIGS. 10, 11, and 12. The relationship of the coordinate system of the reconstruction method of the NMR system used herein to that of the coordinate system of Eq. (2) shown in FIG. 9 is according to FIG. 11. The magnetization axis of Eq (2) is the z-axis; whereas, the magnetization axis of the stationary NMR coordinates is the z-axis shown in FIG. 10, and the magnetization axis of the NMR rotating coordinates [3,7] is the $z_R$-axis shown in FIG. 11. Regarding Eq. (2) and the reconstruction algorithm in the NMR case, the z-component of Eq. (2) is substituted with the stationary NMR y-component, the y-component is substituted with the stationary NMR z-component, and the x-component is substituted with the stationary NMR x-component. For example, in the NMR case shown in FIGS. 8, 10, 11, and 12, Step 7 of the Reconstruction Algorithm of the Fourier Transform Reconstruction Algorithm Section is equivalent to the general case except for the coordinate designations and the relationship between the magnetic moment of a static secondary field and the bulk magnetization M of the RF field wherein $m_z$, the magnetic moment along the z-axis, of Eq. (2) corresponds to the bulk magnetization M of each voxel:

7) Divide each element of Matrix C by $$\frac{\pi}{2y_n^2}$$

to correct for the restriction that the sample space is defined as y greater than zero, y>0. This operation creates Matrix D which is the bulk magnetization M map.

$$\frac{C(x, y, z)}{\frac{\pi}{2y_n^2}} = D(x, y, z)$$

In one embodiment, the voxels with a finite bulk magnetization M above a certain threshold or at an edge in the map are assigned the magnetic susceptibility (magnetic moment) determined from the shift of the Larmor frequency due to the presence of the voxel(s) in the uniform (nonuniform) magnetizing field. The other voxels are assigned a zero value. This procedure is repeated for all Larmor frequencies. In the limit with sufficient Larmor frequency resolution, each volume element is reconstructed independently in parallel with all other volume elements such that the scan time is no greater than the nuclear free induction decay (FID) time. In the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)). The total magnetic susceptibility map is the superposition of the separate maps for each magnetic moment corresponding to a unique Larmor frequency which is plotted and displayed.

In summary, the magnetic moment is known from the Larmor frequency. The NMR method then determines the voxel position(s) using the measurements of the spatial variations of RF field wherein each set of measurements over the detector array corresponding to a given frequency can be normalized to some convenient magnitude. The bulk magnetization M map is transformed into a magnetic susceptibility map.

The reconstruction algorithm can be a reiterative, a matrix inversion, or a Fourier Transform algorithm. For all reconstruction algorithms, the volume to be imaged is divided into volume elements called voxels, and the magnetized voxel with magnetic moment χB is modeled as a magnetic dipole where χ is the magnetic susceptibility of the voxel and B is the magnetizing flux at the position of the dipole. The reconstruction may be multiplexed by using the NMR signals as the input. The transverse RF magnetic field of each voxel is that of a dipole, the maximum amplitude is given by Eq. (2) wherein the Larmor frequency of each voxel is shifted due to its magnetic susceptibility, and $m_z$, the magnetic moment along the z-axis, of Eq. (2) corresponds to the bulk magnetization M of each voxel. The NMR frequency is determined by the magnetizing flux which includes a contribution from the magnetic susceptibility of the voxel. Each voxel or voxels which have a unique local magnetic flux will have a unique a NMR frequency. The spatial variation of the intensity of the transverse RF signal of this unique frequency is the input for the reconstruction algorithm. This procedure is performed either in parallel or series for each data set of signals of each unique frequency. The magnetic susceptibility image is the superposition of the independent images, each of which corresponds to a unique frequency. The general steps are: 1.) The magnetic susceptibility (magnetic moment) of each voxel(s) is determined from the shift of the Larmor frequency due to the presence of the voxel(s) in the uniform (nonuniform) magnetizing field. 2.) The measurements of the spatial variations of the transverse RF field of a given frequency is used to determine the coordinate location of each voxel(s). Thus, each matrix comprises the intensity variation over the sample space of the RF field of the bulk magnetization M of each voxel having the corresponding magnetic moment. 3.) In the case that the magnetizing field is uniform, the magnetic susceptibility map is determined directly, but in the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)). 4.) The total magnetic susceptibility map is the superposition of the separate maps for each magnetic moment corresponding to a unique Larmor frequency which is plotted and displayed.

A matrix inversion reconstruction algorithm is to use the geometric system function to determine the spatial intensity variation of the transverse RF field over the detector array, to invert the corresponding matrix, and to multiply the signal over the detector array by the inverted matrix to give the voxel sources. For example, a matrix inversion reconstruction algorithm is to determine a coefficient for each voxel mathematically (Eq. (30)) or by calibration which when multiplied by the bulk magnetization M of each voxel is that voxel's contribution to the signal at a given detector at a given Larmor frequency. This is repeated for every detector, and those coefficients are used to determine a matrix which, when multiplied by a column vector of the bulk magnetization M values of the voxels, gives the voltage signals at the detectors. This matrix is inverted and stored in memory. Voltages as a function of time are recorded over the detector array. The signal as a function of time is Fourier transformed to give the spectrum. The intensity variations over the detector array at each Larmor frequency are multiplied by the inverse matrix, to generate the bulk magnetization M map. In one embodiment, the voxels with a finite bulk magnetization M above a certain threshold or at an edge in the map are assigned the magnetic susceptibility (magnetic moment) determined from the shift of the Larmor frequency due to the presence of the voxel(s) in the uniform (nonuniform) magnetizing field. The other voxels are assigned a zero value. This procedure is repeated for all Larmor frequencies. In the limit with sufficient Larmor frequency resolution, each volume element is reconstructed independently in parallel with all other volume elements such that the scan time is no greater than the nuclear free induction decay (FID) time. In the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)). The total magnetic susceptibility map is the superposition of the separate maps for each magnetic moment corresponding to a unique Larmor frequency which is plotted and displayed.

A reiterative reconstruction algorithm is to use the geometric system function to determine the system of linear equations which gives the spatial intensity variation of the transverse RF field over the detector array for each Larmor frequency. Voltages as a function of time are recorded over the detector array. The signal as a function of time is Fourier transformed to give the spectrum. The sources of the RF field are the voxels of the image space each having a magnetic susceptibility $\chi$ and a magnetic moment contribution $\mu_0 \chi H$ (Eq. (22)) which determines the Larmor frequency, and a bulk magnetization M at a given location which determines the intensity and spatial variation of the RF field over the sample space. The system of linear equations relates the voltage at each frequency at each detector to the bulk magnetization M of each voxel which contributes signal to the detector at a given Larmor frequency due to its magnetic susceptibility $\chi$ and magnetic moment contribution $\mu_0 \chi H$ (Eq. (22)). For each Larmor frequency, each of these equations is the sum over all voxels of the bulk magnetization M value of each voxel times its weighting coefficient for a given detector which is set equal to the voltage at the given detector. The coefficients are determined mathematically (Eqs. (30), (21), (22), and (23)), or they are determined by calibration. The bulk magnetization M for each voxel is estimated, and the signals at each detector are calculated using these values in the linear equations. The calculated values are compared to the scanned values and a correction is made to M of each voxel. This gives rise to a second, or recomputed, estimate for M of each voxel at each Larmor frequency. The signal value from this second estimate is computed and corrections are made as previously described. This is repeated until the correction for each reiteration approaches a predefined limit which serves to indicate that the reconstruction is within reasonable limits of error. The reiterative procedure is repeated for all Larmor frequencies. The total magnetic susceptibility map is the superposition of the separate maps for each magnetic moment corresponding to a unique Larmor frequency which is plotted and displayed.

Figure 13:
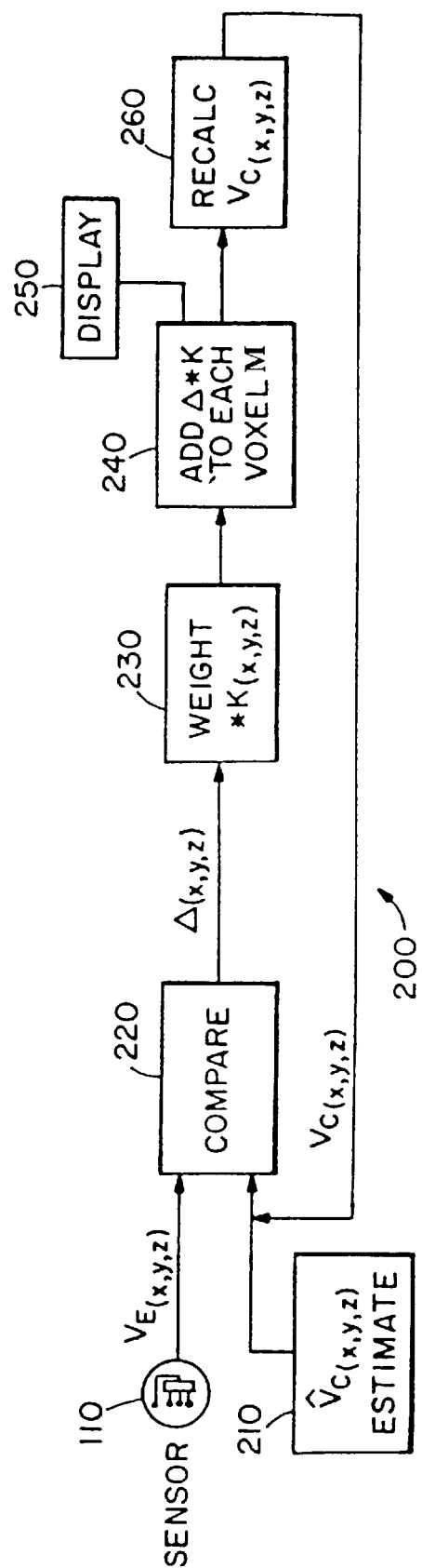
FIG. 13 shows the general process of reconstruction by reiteration performed by the processor of FIGS. 1 and 8.

The general process of reconstruction by reiteration is shown according to the steps of FIG. 13 (and is implemented in processor 20 in FIG. 8). The image displayed according to the process 200 is directly related to the bulk magnetization M of voxel sections of the object examined, the image is merely a mapping of the magnetic susceptibility in three dimensions which determines the Larmor frequency. Accordingly, signals produced by the RF magnetic sensors 110, in terms of volts as a function of Larmor frequency, are a direct result of the bulk magnetization M of the voxel elements. Therefore, a reference voltage is generated at 210 from which the actual or measured sensor voltages is subtracted at 220. The reference voltages are modeled by assuming a signal contribution from each voxel element to each sensor. Therefore, the signals are summed separately for each sensor at each frequency according to a weighted contribution of the voxel elements over the x, y, and z-axes in terms of the coordinates of Eq. (2) and FIG. 9 according to a model of the tissue to be examined. The resulting modeled or calculated voltage signals are compared at step 220, providing a difference or A signal, weighted at step 230 to produce a weighted difference signal, which is then added to the previously estimated bulk magnetization M value for each voxel element at step 240. The resulting level, available in three dimensions corresponding to the axes x, y, and z, is selectively displayed on the display at step 250. Having adjusted the estimated bulk magnetization M for each voxel, the calculated bulk magnetization M is recalculated at step 260, the resulting estimated sensor voltage is then compared to the actual sensor voltage at step 220, the process 200 being repeated until the difference is reduced to a tolerable value. In one embodiment, as the final step or as input to step 220, the voxels with a finite bulk magnetization M above a certain threshold or at an edge in the map are assigned the magnetic susceptibility (magnetic moment) determined from the shift of the Larmor frequency due to the presence of the voxel(s) in the uniform (nonuniform) magnetizing field. The other voxels are assigned a zero value. This procedure is repeated for all Larmor frequencies. In the limit with sufficient Larmor frequency resolution, each volume element is reconstructed independently in parallel with all other volume elements such that the scan time is no greater than the nuclear free induction decay (FID) time. In the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)). The total magnetic susceptibility map is the superposition of the separate maps for each magnetic moment corresponding to a unique Larmor frequency which is plotted and displayed.

In terms of the coordinates of Eq. (2) and FIG. 9, the reconstruction algorithm using Fourier Transforms (FFT) involves exploiting the FFT to solve Eq. (30) given below. The FFT algorithm is given below and is followed by a discussion of the resolution of the magnetic susceptibility map in the Nyquist Theorem with the Determination of the Spatial Resolution Section. For the case that follows, data is acquired in the x, y, and z-directions, but in general, data is acquired over the dimensions which uniquely determine the magnetic susceptibility map. Also, the present analysis is for measuring the z-component of the magnetic field of a dipole oriented in the z-direction; however, the analysis applies to the other two orthogonal components where the geometric system function for the z-component of the z-oriented dipole is replaced by the geometric system function for the x or y-components of the magnetic field produced by the dipole where the geometric system function is defined below as the impulse response of the detector to the given component of the field of a dipole of given orientation. The sample space, or space over which the secondary RF field is measured, is defined in the present example as the three-dimensional space comprising the entire xy-plane and the positive z-axis, as shown in FIG. 9. Other sample spaces are valid and each requires special consideration during the reconstruction as described below. The discrete voltages recorded from an infinite detector array in the xy-plane which is translated to infinity along the z-axis starting from the origin where the detector array is responsive to the z-component of the secondary magnetic field is given by Eq. (2), where the voltage at any point in space produced by dipoles advanced in the z-direction and advanced or delayed in the x and y-directions relative to the origin is given by the following Eq. (29), where the voltage response is $C_0$ times the secondary magnetic flux strength in the case shown in FIG. 9.

The spatial variation of the normalized RF signal at each Larmor frequency is used in the NMR case shown in FIG. 11. The relationship of the coordinate designations of Eq. (2) and FIG. 9 versus the NMR system and the relationship between the magnetic moment of a static secondary field and the bulk magnetization M of the RF field is given in the Reconstruction Algorithm Section and in the Fourier Transform Reconstruction Algorithm which follows.

Fourier Transform Reconstruction Algorithm

In terms of the coordinates of Eq. (2) and FIG. 9, the volume to be imaged is divided into volume elements called voxels and the magnetized voxel with magnetic moment density $\chi B$ is modeled as a magnetic dipole where $\chi$ is the average volume magnetic susceptibility of the voxel and B is the magnetizing flux at the position of the dipole. Data comprising the z-component of the magnetic field of a dipole oriented in the z-direction is acquired in the three dimensional sample space comprising the xy-plane and the positive z-axis. The magnetic moment, $m_z$, of each voxel within the phantom is given by the product of its volume magnetic susceptibility, $\chi$, the magnetizing flux oriented along the z-axis, $B_z$, and the volume of the voxel, $\Delta V$.

$$m_z = \chi B \Delta V \tag{27}$$

The magnetic moment of each voxel is a magnetic dipole. And the phantom can be considered to be a three-dimensional array of magnetic dipoles. At any point extrinsic to the phantom, the z-component of the secondary flux, B, from any single voxel is $$B' = m_z \frac{2z^2 - x^2 - y^2}{(x^2 + y^2 + z^2)^{5/2}} \tag{28}$$

where x, y, and z are the distances from the center of the voxel to the sampling point. It is shown in APPENDICES I–IV that no geometric distribution of magnetic dipoles can give rise to Eq. (2). Therefore, the flux of each magnetic dipole (voxel contribution) forms a basis set for the flux of the array of dipoles which comprise the magnetic susceptibility map of the phantom.

Eq. (2) is a system function which gives the magnetic flux output in response to a magnetic dipole input at the origin. The phantom is an array of spatially advanced and delayed dipoles weighted according to the magnetic susceptibility of each voxel; this is the input function. The secondary flux is the superposition of spatially advanced and delayed flux, according to Eq. (2); this is the output function. Thus, the response of space to a magnetized phantom is given by the convolution of Eq. (2) with the series of weighted, spatially advanced and delayed dipoles representing the susceptibility map of the phantom. The discrete voltages recorded by a detector array over the sample space comprising the xy-plane and the positive z-axis are $$V[x, y, z] = C_o \sum_{n_3=0}^{+l_3/k} \sum_{n_2=-l_2/2k}^{+l_2/2k} \sum_{n_1=-l_1/2k}^{+l_1/2k} \frac{\chi_{n_1,n_2,n_3}[2[z+n_3k_3]^2 - [y-n_2k_2]^2 - [x-n_1k_1]^2]}{[[x-n_1k_1]^2 + [y-n_2k_2]^2 + [z+n_3k_3]^2]^{5/2}} \tag{29}$$

where the flux magnetizing each voxel is unity, the volume element is made unity, and the voltage response of each detector is $C_0$ times the secondary magnetic flux strength. The variables of Eq. (29) are defined as follows:

$\chi_{n_1,n_2,n_3}$ the magnetic susceptibility of the voxel located at the position defined by the Dirac delta function, $\delta(x-n_1k_1, y-n_2k_2, z-n_3k_3)$ $k_1, k_2, k_3$ dipole spacing in the x, y, and z-directions, respectively $l_1, l_2, l_3$ the dimensions of the image space, the total distance in the x, y, and z-directions, respectively, for which the magnetic susceptibility of the voxels is nonzero $s_1, s_2, s_3$ the detector spacing in the x, y, and z-directions, respectively The voltage signals recorded at the detector array over the sample space is $$v[m_1, m_2, m_3] = \tag{30}$$

$$\sum_{m_3=0}^{\infty} \sum_{m_2=-\infty}^{\infty} \sum_{m_1=-\infty}^{\infty} C_o \delta[x - m_1 s_1, y - m_2 s_2, z - m_3 s_3]$$

$$\left[ \sum_{n_3=0}^{+l_3/k} \sum_{n_2=-l_2/2k}^{+l_2/2k} \sum_{n_1=-l_1/2k}^{+l_1/2k} \frac{[2z^2 - x^2 - y^2]}{[x^2 + y^2 + z^2]^{5/2}} \otimes \chi_{n_1,n_2,n_3} \right.$$

$$\left. \delta[x - n_1 k_1, y - n_2 k_2, z - n_3 k_3] \right]$$

Eq. (30) can be represented symbolically as follows $$s = C_0[g \times [h(x) f] \times u(z)] \tag{31}$$

where $C_0$ is the proportionality constant between the signal voltage and the output flux strength, s is the discrete function of voltage signals recorded of the secondary flux over the sample space, g is the secondary magnetic flux sampling function given as follows:

$$g = \sum_{m_3=0}^{\infty} \sum_{m_2=-\infty}^{\infty} \sum_{m_1=-\infty}^{\infty} \delta[x - m_1 s_1, y - m_2 s_2, z - m_3 s_3] \tag{32}$$

In Eq. (31), h is the system function which is also defined as the geometric system function given as follows:

$$\frac{2z^2 - x^2 - y^2}{(x^2 + y^2 + z^2)^{5/2}} \tag{33}$$

The system function is the impulse response of the detector array where the external magnetizing flux is set equal to unity. [If the magnetizing field is nonuniform, then the magnetic susceptibility (magnetic moment) values determined from this Fourier transform algorithm (Eq. (62)) must be divided by the strength of the magnetic flux magnetizing the corresponding voxel on a voxel by voxel basis. This procedure is described in detail in the Altering the Dynamic Range Provided by the System Function Section.] In Eq. (31), f is the magnetic susceptibility function given as $$f = \sum_{n_3=0}^{+l_3/k} \sum_{n_2=-l_2/2k}^{+l_2/2k} \sum_{n_1=-l_1/2k}^{+l_1/2k} \chi_{n_1,n_2,n_3} \delta[x-n_1k_1, y-n_2k_2, z-n_3k_3] \quad (34)$$

In Eq. (31), u(z) is the unitary z function which is one for positive z and zero otherwise. The function g discretizes the continuous voltage function V given by Eq. (29) which is the function h convolved with the function f then multiplied by the function u(z). The discrete voltages recorded over the sample space are used in a Fourier transform algorithm derived herein to reconstruct the magnetic susceptibility image. Consider the function s of Eq. (30) which is given as follows:

$$s = (h \otimes f) \times u(z) \quad (35)$$

Eq. (35) is equivalent to the function h convolved with the function f then multiplied by the function u(z). The function S which is the Fourier transform of s is given as follows:

$$S = (H \times F) \otimes U(k_z) \quad (36)$$

The function S is equivalent to the resultant function of the function H, the Fourier transform of the system function—h, multiplied by the function F, the Fourier transform of the magnetic susceptibility function—f, convolved with the function $U(k_z)$, the Fourier transform of the unitary z function—u(z). The Fourier transform of the magnetic susceptibility function—f (Eq. (34))

$$f = \sum_{n_3=0}^{+l_3/k} \sum_{n_2=-l_2/2k}^{+l_2/2k} \sum_{n_1=-l_1/2k}^{+l_1/2k} \chi_{n_1,n_2,n_3} \delta[x-n_1k_1, y-n_2k_2, z-n_3k_3] \quad (37)$$

is $$F = \sum_{z_n=0}^{-l_3} \sum_{y_n=-l_2/2k}^{+l_2/2k} \sum_{x_n=-l_1/2k}^{+l_1/2k} \chi_{n_1,n_2,n_3} e^{-j[k_x x_n + k_y y_n + k_z z_n]} \quad (38)$$

where $x_n = n_1 k_1$; $y_n = n_2 k_2$; $z_n = -n_3 k_3$. The Fourier transform of u(z)=1 for z≧0 and u(z)=1 for z<0 is [8]

$$U(k_z) = \frac{1}{2}\delta(k_z) + \frac{1}{jk_z} \quad (39)$$

The Fourier transform of the system function (See APPENDIX V)

$$h = \frac{2z^2 - x^2 - y^2}{(x^2+y^2+z^2)^{5/2}} = \frac{2z^2 - \rho^2}{(\rho^2+z^2)^{5/2}} \quad (40)$$

is $$H[k_\rho, k_z] = \frac{4\pi k_\rho^2}{k_\rho^2 + k_z^2} \quad (41)$$

$$H[k_x, k_y, k_z] = \frac{4\pi[k_x^2 + k_y^2]}{k_x^2 + k_y^2 + k_z^2} \quad (42)$$

where $$k_x = 2\pi f_x = 2\pi 1/x$$

$$k_y = 2\pi f_y = 2\pi 1/y$$

$$k_z = 2\pi f_z = 2\pi 1/z \quad (43)$$

The resultant function of the product of the functions H (Eq. (41)) and F (Eq. (38)) then convolved with the function $U(k_z)$ (Eq. (39)) is $$S = HF \otimes U[k_z] = \quad (44)$$

$$\frac{2\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} +$$

$$\frac{1}{jk_z} \otimes \frac{4\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

The result is given as follows, and the derivation appears in APPENDIX VI.

$$S = \quad (45)$$

$$\frac{1}{2}HF + \sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} \left[\frac{-2\pi k_\rho^2}{k_\rho^2 + k_z^2}\right] +$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

$$\left\{ \frac{\pi k_\rho^2}{2[k_\rho^2 + jk_\rho k_z]} e^{-k_\rho|z_n|} + \frac{\pi k_\rho^2}{2[k_\rho^2 - jk_z k_\rho]} e^{+k_\rho|z_n|} \right\}$$

Substitution of the Fourier transform of the system function, H (Eq. (41)), the Fourier transform of the magnetic susceptibility function, F (Eq. (38)), and factoring out $k_\rho^2$ in the second term gives $$S = \left[\frac{2\pi k_\rho^2}{k_\rho^2 + k_z^2} - \frac{2\pi k_\rho^2}{k_\rho^2 + k_z^2}\right] \quad (46)$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]} +$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_x x_n + k_y y_n + k_z z_n]}$$

$$\left\{ \frac{\pi}{2\left[1 + j\frac{k_z}{k_\rho}\right]} e^{-k_\rho|z_n|} + \frac{\pi}{2\left[1 - j\frac{k_z}{k_\rho}\right]} e^{+k_\rho|z_n|} \right\}$$

Multiplication by the complex conjugates gives $$S = \frac{\pi}{2}\sum_{z_n=0}^{-l_3}\sum_{y_n=-l_2/2}^{+l_2/2}\sum_{x_n=-l_1/2k}^{+l_1/2} \chi_{n_1,n_2,n_3} e^{-j[k_x x_n + k_y y_n + k_z z_n]} \quad (47)$$

$$\left\{\frac{1}{\left[1+j\frac{k_z}{k_\rho}\right]}\frac{\left[1-j\frac{k_z}{k_\rho}\right]}{\left[1-j\frac{k_z}{k_\rho}\right]}e^{-k_\rho|z_n|} + \frac{1}{\left[1-j\frac{k_z}{k_\rho}\right]}\frac{\left[1+j\frac{k_z}{k_\rho}\right]}{\left[1+j\frac{k_z}{k_\rho}\right]}e^{+k_\rho|z_n|}\right\}$$

Factoring out the common terms gives $$S = \frac{\pi k_\rho^2}{2(k_\rho^2 + k_z^2)}\sum_{z_n=0}^{-l_3}\sum_{y_n=-l_2/2}^{+l_2/2}\sum_{x_n=-l_1/2}^{+l_1/2} \chi_{n_1,n_2,n_3} \quad (48)$$

$$e^{-j[k_x x_n + k_y y_n + k_z z_n]}\left[\left[1+j\frac{k_z}{k_\rho}\right]e^{+k_\rho|z_n|} + \left[1-j\frac{k_z}{k_\rho}\right]e^{-k_\rho|z_n|}\right]$$

Combining exponential terms gives $$S = \frac{\pi k_\rho^2}{2(k_\rho^2 + k_z^2)}\left[e^{-k_\rho|z_n|} + e^{+k_\rho|z_n|} + j\frac{k_z}{k_\rho}[e^{+k_\rho|z_n|} - e^{-k_\rho|z_n|}]\right]; z_n < 0 \quad (49)$$

The function S divided by the function H is $$\frac{S}{H} = \frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n + k_y y_n + k_z z_n]} \quad (50)$$

$$\left[e^{-k_\rho|z_n|} + e^{+k_\rho|z_n|} + j\frac{k_z}{k_\rho}[e^{+k_\rho|z_n|} - e^{-k_\rho|z_n|}]\right] z_n < 0$$

The inverse Fourier transform of the function S divided by the function H is given as follows, where the symbol $F^{-1}(Q)$ is defined as the inverse Fourier transform of the function Q.

$$F^{-1}\left[\frac{S}{H}\right] = \quad (51)$$

$$F^{-1}\left\{\frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n + k_y y_n + k_z z_n]}\left[e^{-k_\rho|z_n|} + e^{+k_\rho|z_n|} + j\frac{k_z}{k_\rho}[e^{+k_\rho|z_n|} - e^{-k_\rho|z_n|}]\right]\right\}; z_n < 0$$

The inverse Fourier transform of the function F is $$F^{-1}(F) = f = \sum_{z_n}\sum_{y_n}\sum_{x_n}\chi_{n_1,n_2,n_3}\delta[x-x_n, y-y_n, z-z_n] \quad (52)$$

Specifically, the inverse Fourier transform of the function F in terms of the dipole spacing is $$F^{-1}\left\{\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n + k_y y_n + k_z z_n]}\right\} = \quad (53)$$

$$\sum_{z_n=0}^{-l_3}\sum_{y_n=-l_2/2k}^{+l_2/2k}\sum_{x_n=-l_1/2k}^{+l_1/2k} \chi_{n_1,n_2,n_3}\delta[x-n_1k, y-n_2k, z-n_3k]$$

Consider the general Fourier transform pair in cylindrical coordinates:

$$g(r,\theta,z) \Longleftrightarrow G(s,\phi,\omega) \quad (54)$$

Under circular symmetry, that is when g is independent of θ (and hence G independent of φ) the inverse Fourier transform is [9]

$$h(r,z) = 2\pi\int_0^\infty\int_{-\infty}^\infty H(s,\omega)J_0(2\pi sr)e^{j2\pi\omega z} s\,ds\,d\omega \quad (55)$$

The inverse Fourier transform of Eq. (51):

$$F^{-1}\left\{\frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n + k_y y_n + k_z z_n]}\right. \quad (56)$$

$$\left.\left[e^{-k_\rho|z_n|} + e^{+k_\rho|z_n|} + j\frac{k_z}{k_\rho}[e^{+k_\rho|z_n|} - e^{-k_\rho|z_n|}]\right]\right\}; z_n < 0$$

given by Eq. (53) and Eq. (55) is $$= \frac{1}{8}\sum_{n_3=0}^{+l_3/k}\sum_{n_2=-l_2/2k}^{+l_2/2k}\sum_{n_1=-l_1/2k}^{+l_1/2k} \chi_{n_1,n_2,n_3}\delta[x-n_1k, y-n_2k, z-n_3k] \quad (57)$$

$$\begin{cases} 2\pi\int_{-\infty}^\infty\int_0^\infty e^{-k_\rho|z_n|}J_0[k_\rho\rho]k_\rho dk_\rho e^{jk_z z}dk_z + \\ 2\pi\int_{-\infty}^\infty\int_0^\infty e^{+k_\rho|z_n|}J_0[k_\rho\rho]dk_\rho k_\rho e^{jk_z z}dk_z + \\ j2\pi\int_{-\infty}^\infty\int_0^\infty e^{+k_\rho|z_n|}J_0[k_\rho\rho]dk_\rho k_z e^{jk_z z}dk_z - \\ j2\pi\int_{-\infty}^\infty\int_0^\infty e^{-k_\rho|z_n|}J_0[k_\rho\rho]k_\rho dk_z e^{jk_z z}dk_z \end{cases}$$

The solution of Eq. (57) appears as follows, and the derivation appears in APPENDIX VII.

$$F^{-1}\left\{\frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n + k_y y_n + k_z z_n]}\right. \quad (58)$$

$$\left.\left[e^{-k_\rho|z_n|} + e^{+k_\rho|z_n|} + j\frac{k_z}{k_\rho}[e^{+k_\rho|z_n|} - e^{-k_\rho|z_n|}]\right]\right\} =$$

$$\frac{\pi}{2}\sum_{n_3=0}^{+l_3/k}\sum_{n_2=-l_2/2k}^{+l_2/2k}\sum_{n_1=-l_1/2k}^{+l_1/2k} \chi_{n_1,n_2,n_3}$$

$$\delta[x-n_1k, y-n_2k, z-n_3k]\otimes\left[\delta[z]\frac{z_n}{[z_n^2+\rho^2]^{3/2}}\right]$$

Inverse Transform 1

Thus, the inverse Fourier transform of S/H (Eq. (51)) is given by Eq. (58).

$$F^{-1}\left[\frac{S}{H}\right] = \qquad (59)$$

$$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_xx_n+k_yy_n+k_zz_n]}\right.$$

$$\left.\left[e^{-k_\rho|z_n|}+e^{+k_\rho|z_n|}+j\frac{k_z}{k_\rho}[e^{+k_\rho|z_n|}-e^{-k_\rho|z_n|}]\right]\right\} =$$

$$\frac{\pi}{2}\sum_{n_3=0}^{+l_3/k}\sum_{n_2=-l_2/2k}^{+l_2/2k}\sum_{n_1=-l_1/2k}^{+l_1/2k}\chi_{n_1,n_2,n_3}$$

$$\delta[x-n_1k, y-n_2k, z-n_3k] \otimes \left[\delta[z]\frac{z_n}{[z_n^2+\rho^2]^{3/2}}\right]$$

The convolution replaces each coordinate with a spatially shifted coordinate.

$$F^{-1}\left[\frac{S}{H}\right] = \qquad (60)$$

$$\frac{\pi}{2}\sum_{z_n}\sum_{y_n}\sum_{x_n}\chi_{n_1,n_2,n_3}\delta[z-z_n]\left[\frac{z_n}{[z_n^2+[x-x_n]^2+[y-y_n]^2]^{3/2}}\right]$$

The result of the evaluation of Eq. (60) at each coordinate $x_n, y_n, z_n$ is $$F^{-1}\left[\frac{S}{H}\right]_{|x_n,y_n,z_n} = \chi_{n_1,n_2,n_3}\left[\frac{\pi}{2z_n^2}\right] \qquad (61)$$

Solving for the magnetic susceptibility of each dipole gives $$\chi_{n_1,n_2,n_3} = F^{-1}\left[\frac{S}{H}\right]_{|x_n,y_n,z_n} \frac{1}{\frac{\pi}{2z_n^2}} \qquad (62)$$

The solution of the magnetic susceptibility of each dipole of the magnetic susceptibility function follows from Eq. (62). Discrete values of the voltages produced at the detector array due to the secondary magnetic field are recorded during a scan which represent discrete values of function s (Eqs. (30–31)); thus, in the reconstruction algorithm that follows, discrete Fourier and Inverse Fourier transforms replace the corresponding continuous functions of Eq. (62) of the previous analysis.

Discrete values of H of Eqs. (41–43), the Fourier transform of the system function, replace the values of the continuous function. Furthermore, each sample voltage of an actual scan is not truly a point sample, but is equivalent to a sample and hold which is obtained by inverting the grid antennae matrices or which is read directly from a micro-antennae as described in the Finite Detector Length Section. The spectrum of a function discretely recorded as values, each of which is equivalent to a sample and hold, can be converted to the spectrum of the function discretely recorded as point samples by dividing the former spectrum by an appropriate sinc function. This operation is performed and is described in detail in the Finite Detector Length Section. From these calculated point samples, the magnetic susceptibility function is obtained following the operations of Eq. (62) as given below.

Reconstruction Algorithm

1) Record the voltages over the sample space.
2) Invert the detector grid matrices defined by the non-common areas of the overlapping elements of the detector array described in the Finite Detector Length Section to obtain the sample and hold voltages which form Matrix A (if micro-antennas are used, form Matrix A of the recorded voltages directly).
3) Three-dimensionally Fourier transform Matrix A, using a discrete Fourier transform formula such as that which appears in McC. Siebert [10] to form Matrix A* of elements at frequencies corresponding to the spatial recording interval in each direction.

$$A(x,y,z) => A^*(k_x,k_y,k_z)$$

4) Multiply each element of Matrix A* by a value which is the inverse of the Fourier transform of a square wave evaluated at the same frequency as the element where the square wave corresponds to a sample and hold operation performed on the continuous voltage function produced at the detector array by the secondary field. This multiplication forms matrix A** which is the discrete spectrum of the continuous voltage function discretely point sampled (See the Finite Detector Length Section for details of this operation).

$$A^*(k_x,k_y,k_z) \times \frac{1}{\text{sinc}(k_x,k_y,k_z)} = A^{**}(k_x,k_y,k_z)$$

5) Multiply each element of Matrix A** by the value which is the inverse (reciprocal) of the Fourier transform of the system function evaluated at the same frequency as the element to form Matrix B.

$$A^{**}(k_x,k_y,k_z) \times \frac{1}{H(k_x,k_y,k_z)} = B(k_x,k_y,k_z)$$

6) Inverse three-dimensionally Fourier transform Matrix B using the discrete inverse Fourier transform formula such as that which appears in McC. Siebert [10] to form Matrix C whose elements correspond to the magnetic susceptibility of the dipoles at the points of the image space of spatial interval appropriate for the frequency spacing of points of Matrix B.

$$B(k_x,k_y,k_z) => C(x,y,z)$$

7) Divide each element of Matrix C by $$\frac{\pi}{2z_n^2}$$

to correct for the restriction that the sample space is defined as z greater than zero (z>0). This operation creates Matrix D which is the magnetic susceptibility map.

$$\frac{C(x,y,z)}{\frac{\pi}{2z_n^2}} = D(x,y,z)$$

(If the magnetizing field is not constant, then further divide each element by the value of the magnetizing field at the position of the corresponding magnetic susceptibility element.)

7*) In the NMR case shown in FIGS. 8, 10, 11, and 12, Step 7 of the Reconstruction Algorithm of the Fourier Transform Reconstruction Algorithm Section is equivalent to the general case except for the coordinate designations and the relationship between the magnetic moment of a static secondary field and the bulk magnetization M of the RF field:

Divide each element of Matrix C by $$\frac{\pi}{2y_n^2}$$

to correct for the restriction that the sample space is defined as y greater than zero, y>0. This operation creates Matrix D which is the bulk magnetization M map.

$$\frac{C(x, y, z)}{\frac{\pi}{2y_n^2}} = D(x, y, z)$$

(In one embodiment, the voxels with a finite bulk magnetization M above a certain threshold or at an edge in the map are assigned the magnetic susceptibility (magnetic moment) determined from the shift of the Larmor frequency due to the presence of the voxel(s) in the uniform (nonuniform) magnetizing field. The other voxels are assigned a zero value. This procedure is repeated for all Larmor frequencies. In the limit with sufficient Larmor frequency resolution, each volume element is reconstructed independently in parallel with all other volume elements such that the scan time is no greater than the nuclear free induction decay (FID) time. In the case that the primary field is nonuniform, the magnetic moment map is determined, then the magnetic susceptibility map of each magnetic moment is given by dividing the magnetic moment map by the primary magnetic field map on a voxel by voxel basis and by subtracting one from each term (Eq. (23)).

8) Plot the magnetic susceptibility function with the same spatial interval in each direction as the sampling interval in each direction.

8*) In the NMR case shown in FIGS. 8, 10, 11, and 12, Step 8 of the Reconstruction Algorithm of the Fourier Transform Reconstruction Algorithm Section is equivalent to the general case except for the coordinate designations, the relationship between the magnetic moment of a static secondary field and the bulk magnetization M of the RF field, and the determination of the magnetic susceptibility of the mapped voxels by the Larmor frequency (Eqs. (20–23)) in the NMR case:

Plot the magnetic susceptibility function corresponding to the Larmor frequency for the mapped voxels with the same spatial interval in each direction as the sampling interval in each direction over all Larmor frequencies (i.e. the total magnetic susceptibility map is the superposition of the separate maps for each magnetic moment corresponding to a unique Larmor frequency which is plotted and displayed).

(The above steps for each Larmor frequency relate generally to the program implementation shown in the listing of the Exemplary Reconstruction Program as follows. The above Steps 1 and 2 relate to the Data Statements beginning at lines 50; and Step 3 relates to the X, Z and Y FFT operations of lines 254, 455 and 972, respectively. Steps 4 and 5 are implemented by the processes of lines 2050, 2155 and 2340; and Step 6 relates to the X, Y and Z inverse transform of lines 3170, 3422 and 3580, respectively. Step 7 and 7* relates to the correction and normalization process of line 4677.)

Exemplary Reconstruction Program

```
10! ReMSI ALGORITHM
25 OPEN "ReMSIPROTOTYPEI.LIS" FOR OUTPUT AS #1
26 C=.05
27 DIM X(9,9,9)
28 FOR W=1 TO 9 STEP 1
29 FOR T=1 TO 9 STEP 1
30 FOR S=1 TO 9 STEP 1
31 X(W,T,S)=0
32 NEXT S
33 NEXT T
34 NEXT W
35 X(5,5,6)=1
36 DIM DI(9,9)
37 PRINT #1, "DIPOLE PHANTOM"
40 FOR Q=1 TO 9 STEP 1
41 FOR R=1 TO 9 STEP 1
42 FOR U=1 TO 9 STEP 1
43 LET H=X(U,R,Q)
44 LET DI(U,R)=H
45 NEXT U
46 NEXT R
47 MAT PRINT #1,DI,
48 NEXT Q
50 DATA 0,0,0,0,0,0,0,0,0,0,0,0,0
52 DATA 0,0,0,0,0,-.6,-.9,-1.1,-1.2,-1.8,5.7,3.5,.4,-.4,-.5,-.7,-.6,.7
54 DATA 4.2,19.7,7.8,.1,-.9,-.3,-.4,-.7,.7,13.9,25.65,10.1,.9,-.8,-.3,-.6
56 DATA -.4,2.7,10.7,12.4,5.6,2.6,-.5,-.3,-.5,-.6,-.6,.3,3.7,.9,-.5,-1.0
58 DATA 0,0,0,0,0,0,0,0,0,0,0,0,0,0,0,0,0,0,0,0,0,0,0,0,0,0,0,0,0,0
60 DATA 0,0,-.5,-.8,-.8,-1.0,-1.2,-.8,6.9,.2,-.2,-.4,-.6,-.6,1.2,4.1,12.7,0,.6
62 DATA -.6,-.3,-.5,-.7,-.3,3.7,9.05,7.6,1.3,-.5,-.3,-.4,-.2,2.7,4.3,10.6,.8
64 DATA 1.7,-.4,-.3,-.5,-.4,-.1,1.1,1.1,1.7,.2,-.6,0,0,0,0,0,0,0,0,0,0
66 DATA 0,0,0,0,0,0,0,0,0,0,0,0,0,0,0,0,0,0,0,0,-.5,-.6,-.6,-.5,-.5
68 DATA .3,2.5,.1,-.1,-.3,-.4,-.3,1.3,3.9,8.1,1.7,.9,-.3,-.3,-.4,-.6,-.8,1.5
70 DATA 1.65,4.7,1.3,-.3,-.2,-.2,.1,2.1,3.5,7.1,.7,.7,-.3,-.2,-.4,-.2,.2,1.2
72 DATA 1.1,1.4,.4,-.3,0,0,0,0,0,0,0,0,0,0,0,0,0,0,0,0,0,0,0
74 DATA 0,0,0,0,0,0,0,0,0,-.4,-.5,0,-.1,-.1,1.7,1.5,.2,-.1,-.2,-.2,0,1.3,3.1
76 DATA 4.1,3.4,.9,0,-.2,-.3,-.4,-.4,1.1,.65,2.9,1.1,-.2,-.1,-.1,.2,1.2,1.6
78 DATA 4.9,.1,.5,-.3,-.2,-.3,-.1,0,.3,1.3,.6,.1,-.1,0,0,0,0,0,0,0,0,0,0,0
80 DATA 0,0,0,0,0,0,0,0,0,0,0,0,0,0,0,0,0,0,0,0,0,-.3,-.2,.1,.9,1.6,1.6
82 DATA .4,0,0,-.1,-.1,.2,1.0,2.2,2.7,3.7,.5,0,-.2,-.2,-.2,-..1,.6,.25,1.6,.7
84 DATA -.2,-.1,-.1,.1,.7,.9,2.8,0,.3,-.2,-.1,-.2,-.1,0,.2,.3,.3,0,-.1,0,0,0
```

```
85  DATA 0,0,0,0,0,0,0,0,0,0,0,0,0,0
86  DATA 0,0,0,0,0,0,0,0,0,0,0,0,0,0,0,0,0,-.2,-.1,.1,1.0,
    1.4,1.3,.2,0,0
88  DATA -.1,0,.2,.7,1.5,2.0,2.9,.3,0,-.1,-.1,.1,0,.7,.25,.9,.4,-
    .1,0,0,.1,.5
90  DATA .5,1.3,0,.2,-.1,0,-.1,0,.1,.2,.1,.2,0,-.1,0,0,0,0,0,0,
    0,0,0,0,0,0
92  DATA 0,0,0,0,0,0,0,0,0,0,0,0,0,0,0,0,0,0,0,-.1,0,.1,
    .8,.9,1.0,.1,0,0
94  DATA 0,0,.2,.5,1.1,1.3,2.0,.3,0,0,-.1,0,0,.3,.15,.6,.2,-.1,0,
    0,.1,.4,.3,.9
96  DATA 0,.2,-.1,0,-.1,.1,.1,.1,.2,0,0,0,0,0,0,0,0,0,0,
    0,0,0,0,0
98  DATA 0,0,0,0,0,0,0,0,0,0,0,0,0,0,0,0,0,-.1,0,0,.7,.7,
    .6,.1,0,.1
100 DATA 0,1,.2,.3,.6,.8,1.0,.2,0,0,-.1,0,0,.1,.15,.3,1.1,0,0,
    0,0,.2,.2,.5
102 DATA 0,.1,-.1,0,0,0,.1,.1,.1,.1,0,0,0,0,0,0,0,0,0,0,
    0,0,0,0,0,0
104 DATA 0,0,0,0,0,0,0,0,0,0,0,0,0,0,0,0,0,0,.5,.4,.4,
    .1,0,0,0,0,.1,.1
106 DATA .4,.5,.6,.1,0,0,0,0,0,0,.05,.1,0,0,0,0,0,.1,.1,.3,0,
    .1,-.1,0,0,0,0
108 DATA .1,0,0,0,0,0,0,0,0,0,0,0,0,0,0,0,0,0,0
120 DIM V(9,9,9)
130 FOR Z=1 TO 9 STEP 1
140 FOR Q=1 TO 9 STEP 1
145 FOR U=1 TO 9 STEP 1
147 READ V(Z,Q,U)
222 NEXT U
223 NEXT Q
224 NEXT Z
225 PRINT #1, "VOLTAGE DATA"
226 DIM VO(9,9)
227 FOR Q=1 TO 9 STEP 1
228 FOR R=1 TO 9 STEP 1
229 FOR U=1 TO 9 STEP 1
230 LET H=V(U,R,Q)
231 LET VO(U,R)=H
232 NEXT U
233 NEXT R
234 MAT PRINT #1, VO,
235 NEXT Q
254 !FFT THE ROWS OF SAMPLED VOLTAGES IN THE X DIRECTION
255 DIM MR(9)
256 DIM MI(9)
257 DIM R(9)
258 DIM RV(9,9,9)
259 DIM IV(9,9,9)
260 FOR V=0 TO 9 STEP 1
270 FOR M=1 TO 9 STEP 1
280 FOR N=1 TO 9 STEP 1
290 LET Y=V(M,N,V)
300 LET R(N)=Y
305 NEXT N
310 EXTERNAL SUB FFT(DIM(),DIM(),DIM())
320 CALL FFT(R(),MR(),MI())
330 FOR N=1 TO 9 STEP 1
340 LET Y=MR(N)
350 LET RV(M,N,V)=Y
360 NEXT N
370 FOR N=1 TO 9 STEP 1
380 LET G=MI(N)
390 LET IV(M,N,V)=G
400 NEXT N
410 NEXT M
415 NEXT V
417 DIM RVO(9,9)
419 DIM IVO(9,9)
420 PRINT #1,"RV"
421 FOR Q=1 TO 9 STEP 1
422 FOR R=1 TO 9 STEP 1
423 FOR U=1 TO 9 STEP 1
424 LET H=RV(U,R,Q)
425 LET RVO(U,R)=H
426 NEXT U
427 NEXT R
428 MAT PRINT #1, RVO,
429 NEXT Q
430 PRINT #1, "IV"
431 FOR Q=1 TO 9 STEP 1
432 FOR R=1 TO 9 STEP 1
433 FOR U=1 TO 9 STEP 1
434 LET H=IV(U,R,Q)
435 LET IVO(U,R)=H
436 NEXT U
437 NEXT R
438 MAT PRINT #1, IVO,
439 NEXT Q
455 !FFT THE COLUMNS OF THE SAMPLED VOLTAGE IN THE Z DIRECTION
460 DIM RRV(9,9,9)
470 DIM IRV(9,9,9)
475 FOR V=1 TO 9 STEP 1
480 FOR N=1 TO 9 STEP 1
490 FOR M=1 TO 9 STEP 1
500 LET Y=RV(M,N,V)
510 LET R(M)=Y
520 NEXT M
530 CALL FFT(R(),MR(),MI())
540 FOR M=1 TO 9 STEP 1
550 LET H=MR(M)
560 LET RRV(M,N,V)=H
570 NEXT M
580 FOR M=1 TO 9 STEP 1
590 LET G=MI(M)
600 LET IRV(M,N,V)=G
610 NEXT M
620 NEXT N
625 NEXT V
626 DIM RRVO(9,9)
627 DIM IRVO(9,9)
630 PRINT #1, "RRV"
631 FOR Q=1 TO 9 STEP 1
632 FOR R=1 TO 9 STEP 1
633 FOR U=1 TO 9 STEP 1
634 LET H=RRV(U,R,Q)
637 LET RRVO(U,R)=H
638 NEXT U
639 NEXT R
640 MAT PRINT #1, RRVO,
641 NEXT Q
650 PRINT #1, "IRV"
651 FOR Q=1 TO 9 STEP 1
653 FOR R=1 TO 9 STEP 1
654 FOR U=1 TO 9 STEP 1
655 LET H=IRV(U,R,Q)
656 LET IRVO(U,R)=H
657 NEXT U
658 NEXT R
659 MAT PRINT #1, IRVO,
660 NEXT Q
661 DIM RIV(9,9,9)
```

```
662 DIM IIV(9,9,9)
685 FOR V=1 TO 9 STEP 1
690 FOR N=1 TO 9 STEP 1
700 FOR M=1 TO 9 STEP 1
710 LET Y=IV(M,N,V)
760 LET R(M)=Y
770 NEXT M
830 CALL FFT(R(),MR(),MI())
840 FOR M=1 TO 9 STEP 1
850 LET H=MR(M)
860 LET RIV(M,N,V)=H
870 NEXT M
872 FOR M=1 TO 9 STEP 1
873 LET G=MI(M)
874 LET IIV(M,N,V)=G
875 NEXT M
876 NEXT N
877 NEXT V
878 DIM RIVO(9,9)
879 DIM IIVO(9,9)
880 PRINT #1, "RIV"
881 FOR Q=1 TO 9 STEP 1
882 FOR R=1 TO 9 STEP 1
883 FOR U=1 TO 9 STEP 1
884 LET H=RIV(U,R,Q)
885 LET RIVO(U,R)=H
886 NEXT U
887 NEXT R
888 MAT PRINT #1, RIVO,
889 NEXT Q
890 PRINT #1, "IIV"
891 FOR Q=1 TO 9 STEP 1
892 FOR R=1 TO 9 STEP 1
893 FOR U=1 TO 9 STEP 1
894 LET H=IIV(U,R,Q)
895 LET IIVO(U,R)=H
896 NEXT U
897 NEXT R
898 MAT PRINT #1, IIVO,
899 NEXT Q
900 DIM RVA(9,9,9)
901 DIM IVA(9,9,9)
904 DIM RVAO(9,9)
906 DIM IVAO(9,9)
908 FOR Q=1 TO 9 STEP 1
910 FOR R=1 TO 9 STEP 1
911 FOR U=1 TO 9 STEP 1
912 LET H=IIV(U,R,Q)
913 H=(-1)*H
914 LET G=RRV(U,R,Q)
915 LET L=G+H
916 LET RVA(U,R,Q)=L
917 NEXT U
918 NEXT R
919 NEXT Q
920 FOR Q=1 TO 9 STEP 1
921 FOR R=1 TO 9 STEP 1
922 FOR U=1 TO 9 STEP 1
923 LET H=IRV(U,R,Q)
924 LET L=RIV(U,R,Q)
925 LET IVA(U,R,Q)=H+L
927 NEXT U
928 NEXT R
930 NEXT Q
932 PRINT #1, "RVA"
934 FOR Q=1 TO 9 STEP 1
936 FOR R=1 TO 9 STEP 1
938 FOR U=1 TO 9 STEP 1
940 LET H=RVA(U,R,Q)
942 LET RVAO(U,R)=H
944 NEXT U
946 NEXT R
948 MAT PRINT #1, RVAO,
950 NEXT Q
952 PRINT #1, "IVA"
954 FOR Q=1 TO 9 STEP 1
956 FOR R=1 TO 9 STEP 1
958 FOR U=1 TO 9 STEP 1
960 LET H=IVA(U,R,Q)
962 LET IVAO(U,R)=H
964 NEXT U
966 NEXT R
968 MAT PRINT #1, IVAO,
970 NEXT Q
972 !FFT THE ROWS OF THE SAMPLED VOLTAGES IN THE Y DIRECTION
980 DIM RVAY(9,9,9)
990 DIM IRVAY(9,9,9)
992 DIM RVAYO(9,9)
994 DIM IRVAYO(9,9)
1012 FOR M=1 TO 9 STEP 1
1013 FOR N=1 TO 9 STEP 1
1014 FOR V=1 TO 9 STEP 1
1015 LET Y=RVA(M,N,V)
1016 LET R(V)=Y
1017 NEXT V
1018 CALL FFT(R(),MR(),MI())
1019 FOR V=1 TO 9 STEP 1
1020 LET H=MR(V)
1021 LET RVAY (M,N,V)=H
1022 NEXT V
1023 FOR V=1 TO 9 STEP 1
1024 LET G=MI(V)
1025 LET IRVAY(M,N,V)=G
1026 NEXT V
1027 NEXT N
1028 NEXT M
1030 PRINT #1, "RVAY"
1032 FOR Q=1 TO 9 STEP 1
1034 FOR R=1 TO 9 STEP 1
1036 FOR U=1 TO 9 STEP 1
1038 LET H=RVAY(U,R,Q)
1040 LET RVAYO(U,R)=H
1042 NEXT U
1044 NEXT R
1046 MAT PRINT #1,RVAYO,
1048 NEXT Q
1050 PRINT #1, "IRVAY"
1052 FOR Q=1 TO 9 STEP 1
1054 FOR R=1 TO 9 STEP 1
1056 FOR U=1 TO 9 STEP 1
1058 LET H=IRVAY(U,R,Q)
1060 LET IRVAYO(U,R)=H
1062 NEXT U
1064 NEXT R
1066 MAT PRINT #1,IRVAYO,
1068 NEXT Q
1070 DIM RIVY(9,9,9)
1080 DIM IIVY(9,9,9)
1085 DIM RIVYO(9,9)
1086 DIM IIVYO(9,9)
1090 FOR M=1 TO 9 STEP 1
1100 FOR N=1 TO 9 STEP 1
1138 FOR V=1 TO 9 STEP 1
```

```
1139 LET Y=IVA(M,N,V)
1140 LET R(V)=Y
1141 NEXT V
1142 CALL FFT(R(),MR(),MI())
1143 FOR V=1 TO 9 STEP 1
1144 LET H=MR(V)
1145 LET RIVY(M,N,V)=H
1146 NEXT V
1147 FOR V=1 TO 9 STEP 1
1148 LET G=MI(V)
1149 LET IIVY(M,N,V)=G
1150 NEXT V
1151 NEXT N
1152 NEXT M
1153 PRINT #1, "RIVY"
1160 FOR Q=1 TO 9 STEP 1
1162 FOR R=1 TO 9 STEP 1
1164 FOR U=1 TO 9 STEP 1
1166 LET H=RIVY(U,R,Q)
1170 LET RIVYO(U,R)=H
1172 NEXT U
1174 NEXT R
1178 MAT PRINT #1, RIVYO,
1180 NEXT Q
1185 PRINT #1, "IIVY"
1190 FOR Q=1 TO 9 STEP 1
1200 FOR R=1 TO 9 STEP 1
1210 FOR U=1 TO 9 STEP 1
1212 LET H=IIVY(U,R,Q)
1214 LET IIVYO(U,R)=H
1216 NEXT U
1218 NEXT R
1220 MAT PRINT #1,IIVYO,
1222 NEXT Q
1230 DIM YRVA(9,9,9)
1240 DIM YIVA(9,9,9)
1241 FOR Q=1 TO 9 STEP 1
1250 FOR R=1 TO 9 STEP 1
1260 FOR U=1 TO 9 STEP 1
1270 LET L=IIVY(U,R,Q)
1280 LET B=RVAY(U,R,Q)
1290 LET YRVA(U,R,Q)=B–L
1300 NEXT U
1310 NEXT R
1320 NEXT Q
1330 FOR Q=1 TO 9 STEP 1
1340 FOR R=1 TO 9 STEP 1
1345 FOR U=1 TO 9 STEP 1
1350 LET H=RIVY(U,R,Q)
1360 LET L=IRVAY(U,R,Q)
1370 LET YIVA(U,R,Q)=L+H
1380 NEXT U
1390 NEXT R
1400 NEXT Q
1410 PRINT #1, "YRVA"
1412 DIM YRVAO(9,9)
1414 DIM YIVAO(9,9)
1420 FOR Q=1 TO 9 STEP 1
1430 FOR R=1 TO 9 STEP 1
1440 FOR U=1 TO 9 STEP 1
1450 LET H=YRVA(U,R,Q)
1460 LET YRVAO(U,R)=H
1470 NEXT U
1480 NEXT R
1490 MAT PRINT #1,YRVAO,
1500 NEXT Q
1510 PRINT #1, "YIVA"
1520 FOR Q=1 TO 9 STEP 1
1530 FOR R=1 TO 9 STEP 1
1540 FOR U=1 TO 9 STEP 1
1545 LET H=YIVA(U,R,Q)
1550 LET YIVAO(U,R)=H
1560 NEXT U
1570 NEXT R
1580 MAT PRINT #1,YIVAO,
1590 NEXT Q
2050 !GENERATE THE DISCRETE SPECTRUM OF THE
     SYSTEM FUNCTION AND THE SINC
2055 !FUNCTION OF THE SAMPLE AND HOLD COR-
     RESPONDING TO THE FINITE DETECTOR
2057 !DIMENSIONS
2060 DIM SFH(9,9,9)
2061 DIM SFHO(9,9)
2062 DIM SINC (9,9,9)
2063 DIM SINCO(9,9)
2065 LET SFH(4,4,4)=4*PI
2066 FOR M=–4 TO 4 STEP 1
2070 FOR V=–4 TO 4 STEP 1
2080 FOR N=–4 TO 4 STEP 1
2081 H=.04
2082 J=ABS(M)+ABS(N)+ABS(V)
2085 IF J=0 THEN GO TO 2098
2090 T=4*PI*((2*PI*N/9*1/.1)^2+((2*PI*V/9*1/.1)^2))
2092 B=(2*PI*N/9*1/.1)^2+(2*PI*M/9*1/C)^2+(2*PI*V/9*1/.1)^2
2095 LET SFH(M+5,N+5,V+5)=T/B
2098 G=ABS(N)+ABS(V)
2100 IF G=0 THEN GO TO 2114
2101 A=1
2105 IF N=0 THEN GO TO 2107
2106 A=SIN(2*PI*10*N/9*.1)/(PI*N/9*10)
2107 B=1
2108 IF V=0 THEN GO TO 2110
2109 B=SIN(2*PI*10*V/9*.1)/(PI*V/9*10)
2110 H=A*B
2111 IF N=0 THEN H=.2*H
2112 IF V=0 THEN H=.2*H
2114 LET SINC(M+5,N+5,V+5)=H
2130 NEXT N
2131 NEXT V
2132 NEXT M
2135 PRINT #1, "SFH"
2136 FOR Q=1 TO 9 STEP 1
2137 FOR R=1 TO 9 STEP 1
2138 FOR U=1 TO 9 STEP 1
2139 LET S=SFH(U,R,Q)
2140 LET SFHO(U,R)=S
2141 NEXT U
2142 NEXT R
2143 MAT PRINT #1, SFHO,
2144 NEXT Q
2145 PRINT #1, "SINC"
2146 FOR Q=1 TO 9 STEP 1
2147 FOR R=1 TO 9 STEP 1
2148 FOR U=1 TO 9 STEP 1
2149 LET S=SINC(U,R,Q)
2150 LET SINCO(U,R)=S
2151 NEXT U
2152 NEXT R
2153 MAT PRINT #1, SINCO,
2154 NEXT Q
2155 !INVERSE THE DISCRETE SPECTRUM OF THE
     SYSTEM FUNCTION AND THE SINC
2157 !FUNCTION
```

```
2160 DIM HR(9,9,9)
2170 DIM HRO(9,9)
2171 DIM SINCR(9,9,9)
2175 FOR V=1 TO 9 STEP 1
2180 FOR M=1 TO 9 STEP 1
2190 FOR N=1 TO 9 STEP 1
2200 LET Y=SFH(M,N,V)
2201 LET H=SINC(M,N,V)
2210 IF Y=0 THEN GO TO 2212
2211 Y=1/Y
2212 IF H=0 THEN GO TO 2230
2221 H=1/H
2230 LET HR(M,N,V)=Y
2235 LET SINCR(M,N,V)=H
2240 NEXT N
2250 NEXT M
2260 NEXT V
2310 PRINT #1,"HR"
2311 FOR Q=1 TO 9 STEP 1
2312 FOR R=1 TO 9 STEP 1
2313 FOR U=1 TO 9 STEP 1
2314 LET S=HR(U,R,Q)
2315 LET HRO(U,R)=S
2316 NEXT U
2317 NEXT R
2320 MAT PRINT #1,HRO,
2321 NEXT Q
2340 !DIVIDE THE TRANSFORMED DATA BY THE TRANSFORM OF THE SYSTEM FUNCTION
2345 !AND THE SINC FUNCTION
3030 DIM FR(9,9,9)
3050 DIM FI(9,9,9)
3052 DIM FRO(9,9)
3054 DIM FIO(9,9)
3056 FOR V=1 TO 9 STEP 1
3057 FOR M=1 TO 9 STEP 1
3058 FOR N=1 TO 9 STEP 1
3059 T=YRVA(M,N,V)
3060 S=HR(M,N,V)
3062 L=SINCR(M,N,V)
3065 K=S*T*L
3066 LET FR(M,N,V)=K
3067 NEXT N
3068 NEXT M
3070 NEXT V
3080 FOR V=1 TO 9 STEP 1
3081 FOR M=1 TO 9 STEP 1
3082 FOR N=1 TO 9 STEP 1
3083 H=SINCR(M,N,V)
3093 K=HR(M,N,V)
3094 L=YIVA(M,N,V)
3095 E=K*L*H
3096 LET FI(M,N,V)=E
3097 NEXT N
3098 NEXT M
3100 NEXT V
3130 PRINT #1, "FR"
3131 FOR Q=1 TO 9 STEP 1
3132 FOR R=1 TO 9 STEP 1
3133 FOR U=1 TO 9 STEP 1
3134 LET H=FR(U,R,Q)
3135 LET FRO(U,R)=H
3136 NEXT U
3137 NEXT R
3138 MAT PRINT #1, FRO,
3140 NEXT Q
3141 PRINT #1, "FI"
3142 FOR Q=1 TO 9 STEP 1
3143 FOR R=1 TO 9 STEP 1
3144 FOR U=1 TO 9 STEP 1
3145 LET H=FI(U,R,Q)
3146 LET FIO(U,R)=H
3156 NEXT U
3157 NEXT R
3158 MAT PRINT #1, FIO,
3160 NEXT Q
3170 !INVERSE TRANSFORM THE ROWS IN THE X DIRECTION
3180 DIM RF(9,9,9)
3185 DIM RFO(9,9)
3187 DIM MIFO(9,9)
3190 DIM MIF(9,9,9)
3195 DIM I(9)
3196 FOR V=1 TO 9 STEP 1
3200 FOR M=1 TO 9 STEP 1
3210 FOR N=1 TO 9 STEP 1
3220 LET Y=FR(M,N,V)
3230 LET R(N)=Y
3240 NEXT N
3250 FOR N=1 TO 9 STEP 1
3260 LET Y=FI(M,N,V)
3270 LET I(N)=Y
3280 NEXT N
3285 EXTERNAL SUB IFT(DIM(),DIM(),DIM(),DIM())
3290 CALL IFT(R(),I(),MR(),MI())
3300 FOR N=1 TO 9 STEP 1
3310 LET Y=MR(N)
3320 LET RF(M,N,V)=Y
3330 NEXT N
3340 FOR N=1 TO 9 STEP 1
3350 LET Y=MI(N)
3360 LET MIF(M,N,V)=Y
3370 NEXT N
3380 NEXT M
3385 NEXT V
3390 PRINT #1, "RF"
3391 FOR Q=1 TO 9 STEP 1
3392 FOR R=1 TO 9 STEP 1
3393 FOR U=1 TO 9 STEP 1
3394 LET H=RF(U,R,Q)
3395 LET RFO(U,R)=H
3396 NEXT U
3397 NEXT R
3400 MAT PRINT #1, RFO,
3405 NEXT Q
3410 PRINT #1," MIF "
3411 FOR Q=1 TO 9 STEP 1
3412 FOR R=1 TO 9 STEP 1
3413 FOR U=1 TO 9 STEP 1
3414 LET H=MIF(U,R,Q)
3415 LET MIFO(U,R)=H
3416 NEXT U
3417 NEXT R
3420 MAT PRINT #1, MIFO,
3421 NEXT Q
3422!INVERSE TRANSFORM THE ROWS IN THE Y DIRECTION
3430 DIM RFY(9,9,9)
3432 DIM MIFY(9,9,9)
3433 DIM RFYO(9,9)
3434 DIM MIFYO(9,9)
3435 FOR M=1 TO 9 STEP 1
3440 FOR N=1 TO 9 STEP 1
3450 FOR V=1 TO 9 STEP 1
```

```
3460 LET Y=RF(M,N,V)
3470 LET R(V)=Y
3480 NEXT V
3490 FOR V=1 TO 9 STEP 1
3500 LET Y=MIF(M,N,V)
3510 LET I(V)=Y
3520 NEXT V
3525 EXTERNAL SUB IFT(DIM(),DIM(),DIM(),DIM())
3526 CALL IFT(R(),I(),MR(),MI())
3527 FOR V=1 TO 9 STEP 1
3528 LET Y=MR(V)
3529 LET RFY(M,N,V)=Y
3530 NEXT V
3531 FOR V=1 TO 9 STEP 1
3532 LET Y=MI(V)
3533 LET MIFY(M,N,V)=Y
3534 NEXT V
3535 NEXT N
3536 NEXT M
3537 PRINT #1, "RFY"
3538 FOR Q=1 TO 9 STEP 1
3539 FOR R=1 TO 9 STEP 1
3540 FOR U=1 TO 9 STEP 1
3541 LET H=RFY(U,R,Q)
3542 LET RFYO(U,R)=H
3543 NEXT U
3544 NEXT R
3545 MAT PRINT #1, RFYO,
3546 NEXT Q
3547 PRINT #1, "MIFY"
3550 FOR Q=1 TO 9 STEP 1
3555 FOR R=1 TO 9 STEP 1
3560 FOR U=1 TO 9 STEP 1
3565 LET H=MIFY(U,R,Q)
3566 LET MIFYO(U,R)=H
3567 NEXT U
3568 NEXT R
3570 MAT PRINT #1,MIFYO,
3575 NEXT Q
3580 !INVERSE TRANSFORM THE COLUMNS IN THE Z DIRECTION
3581 DIM F(9,9,9)
3590 DIM FO(9,9)
3592 FOR V=1 TO 9 STEP 1
3593 FOR N=1 TO 9 STEP 1
3594 FOR M=1 TO 9 STEP 1
3600 LET Y=RFY(M,N,V)
4546 LET R(M)=Y
4547 NEXT M
4548 FOR M=1 TO 9 STEP 1
4549 LET Y=MIFY(M,N,V)
4550 LET I(M)=Y
4552 NEXT M
4553 EXTERNAL SUB IFTZ(DIM(),DIM(),DIM(),DIM())
4554 CALL IFTZ(R(),I(),MR(),MI())
4556 FOR M=1 TO 9 STEP 1
4557 LET Y=MR(M)
4559 LET F(M,N,V)=Y
4600 NEXT M
4602 NEXT N
4604 NEXT V
4605 PRINT #1, "F"
4610 FOR Q=1 TO 9 STEP 1
4620 FOR R=1 TO 9 STEP 1
4630 FOR U=1 TO 9 STEP 1
4635 LET H=F(U,R,Q)
4640 LET FO(U,R)=H
4650 NEXT U
4660 NEXT R
4666 MAT PRINT #1,FO,
4670 NEXT Q
4677 !CORRECT FOR THE U(Z) CONVOLUTION AND NORMALIZE THE RECONSTRUCTION
4678 DIM CF(9,9,9)
4780 DIM CFO(9,9)
4809 FOR V=1 TO 9 STEP 1
4810 FOR N=1 TO 9 STEP 1
4871 LET K=F(1,N,V)
4873 K=K/10E8
4974 LET CF(1,N,V)=K
5915 NEXT N
6616 NEXT V
6617 FOR V=1 TO 9 STEP 1
6620 FOR M=2 TO 9 STEP 1
6630 FOR N=1 TO 9 STEP 1
6640 LET K=F(M,N,V)
6642 P=0.5*PI/(M-1)^2/C^2
6650 K=K/P
6660 LET CF(M,N,V)=K
6670 NEXT N
6680 NEXT M
6681 NEXT V
6690 PRINT #1, "RECONSTRUCTION"
6691 FOR Q=1 TO 9 STEP 1
6692 FOR R=1 TO 9 STEP 1
6693 FOR U=1 TO 9 STEP 1
6694 LET H=CF(U,R,Q)
6695 H=H/CF(5,5,6)
6696 LET CFO(U,R)=H
6697 NEXT U
6698 NEXT R
6700 MAT PRINT #1,CFO,
6705 NEXT Q
6710 END
6722 SUB FFT(R(),MR(),MI())
6726 FOR M=1 TO 9 STEP 1
6730 A=0
6740 FOR N=1 TO 9 STEP 1
6750 LET H=R(N)
6760 B=H*COS(2*PI*(M-5)*(N-5)/9)
6770 A=A+B
6780 NEXT N
6790 A=A/9
6800 LET MR(M)=A
6810 NEXT M
6820 FOR M=1 TO 9 STEP 1
6830 A=0
6840 FOR N=1 TO 9 STEP 1
6880 LET H=R(N)
6890 H=-H
6900 B=H*SIN(2*PI*(M-5)*(N-5)/9)
6910 A=A+B
6920 NEXT N
6930 A=A/9
6935 LET MI(M)=A
6940 NEXT M
6950 END SUB
6960 SUB IFT(R(),I(),MR(),MI())
6970 DIM MRR(9)
6980 DIM MRI(9)
6990 DIM MIR(9)
7000 DIM MII(9)
7010 FOR N=1 TO 9 STEP 1
7020 A=0
```

```
7030 FOR M=1 TO 9 STEP 1
7040 LET G=R(M)
7050 B=G*COS(2*PI*(M-5)*(N-5)/9)
7060 A=A+B
7070 NEXT M
7080 LET MRR(N)=A
7090 NEXT N
7100 FOR N=1 TO 9 STEP 1
7110 A=0
7120 FOR M=1 TO 9 STEP 1
7130 LET G=R(M)
7140 B=G*SIN(2*PI*(M-5)*(N-5)/9)
7150 A=A+B
7160 NEXT M
7170 LET MRI(N)=A
7180 NEXT N
7190 FOR N=1 TO 9 STEP 1
7200 A=0
7210 FOR M=1 TO 9 STEP 1
7220 LET G=I(M)
7230 B=G*COS(2*PI*(M-5)*(N-5)/9)
7240 A=A+B
7250 NEXT M
7260 LET MIR(N)=A
7270 NEXT N
7280 FOR N=1 TO 9 STEP 1
7290 A=0
7300 FOR M=1 TO 9 STEP 1
7310 LET G=I(M)
7320 B=G*SIN(2*PI*(M-5)*(N-5)/9)
7330 A=A+B
7340 NEXT M
7350 LET MII(N)=A
7360 NEXT N
7365 MAT MII=(-1)*MII
7375 MAT MR=MRR+MII
7385 MAT MI=MIR+MRI
7400 END SUB
7410 SUB IFTZ(R(),I(),MR(),MI())
7420 DIM MRR(9)
7430 DIM MRI(9)
7440 DIM MIR(9)
7450 DIM MII(9)
7460 FOR N=1 TO 9 STEP 1
7470 A=0
7480 FOR M=1 TO 9 STEP 1
7490 LET G=R(M)
7500 B=G*COS(2*PI*(M-5)*(-N+1)/9)
7510 A=A+B
7520 NEXT M
7530 LET MRR(N)=A
7540 NEXT N
7550 FOR N=1 TO 9 STEP 1
7560 A=0
7570 FOR M=1 TO 9 STEP 1
7580 LET G=R(M)
7590 B=G*SIN(2*PI*(M-5)*(-N+1)/9)
7600 A=A+B
7610 NEXT M
7620 LET MRI(N)=A
7630 NEXT N
7640 FOR N=1 TO 9 STEP 1
7641 A=0
7642 FOR M=1 TO 9 STEP 1
7650 LET G=I(M)
7660 B=G*COS(2*PI*(M-5)*(-N+1)/9)
7670 A=A+B
7680 NEXT M
7690 LET MIR(N)=A
7700 NEXT N
7710 FOR N=1 TO 9 STEP 1
7720 A=0
7730 FOR M=1 TO 9 STEP 1
7740 LET G=I(M)
7750 B=G*SIN(2*PI*(M-5)*(-N+1)/9)
7760 A=A+B
7770 NEXT M
7780 LET MII(N)=A
7790 NEXT N
7795 MAT MII=(-1)*MII
7800 MAT MR=MRR+MII
7810 MAT MI=MRI+MIR
7880 END SUB
$
```

In an embodiment, the matrix inversion and/or the reiterative algorithms are used in combination with the Fourier Transform Algorithm. For example, in the case of NMR measurement of the secondary field, the Fourier Transform Algorithm is used to calculate a series of first magnetic moment or magnetic susceptibility maps for each Larmor frequency. The peak(s) or edges of each image are detected by using a cut-off level for the magnetic susceptibility assigned to a voxel or the value of the derivative of the magnetic susceptibility as a function of voxel position, respectively. The magnetic susceptibility of the voxel(s) corresponding to the peaks or edges are set equal to the magnet susceptibility corresponding to the Larmor frequency (Eqs. (20–23)) and the remaining voxels are assigned a zero value. The signal at each detector is calculated using Eq. (2). Each calculated signal is compared to the actual signal and the error is determined. The error is back projected over the voxels using the Fourier Transform Algorithm, Matrix Inversion Algorithm, or Reiterative Algorithm and added to the preceding corrected series of magnetic moment or magnetic susceptibility maps for each Larmor frequency. The procedure is reiteratively until it stabilizes. This reconstruction feature wherein the magnetic susceptibility is determined independently (via by the Larmor frequency) from the spatial reconstruction (via the geometric system function), the reconstruction is digital versus analogue. In terms of the signal to noise ratio, the superiority of digital over analogue is generally known to those skilled in the art of signal processing.

The Nyquist Theorem with the Determination of the Spatial Resolution

The derivation of Eq. (30) demonstrates that the system function behaves as a filter of the spectrum of the magnetic susceptibility function. It is well known in the art of signal processing that if such a filter passes all frequencies for which an input function has significant energy, then the input function can be recovered completely from samples of the filtered function taken at the Nyquist rate. This premise embodies the Nyquist Sampling Theorem. The spectrum of the system function (Eq. (2)) is derived in APPENDIX V and shown in FIG. 1c. This function is a band-pass for all frequencies of the magnetic susceptibility function where $k_\rho$ and $k_z$ are comparable. Thus, the magnetic susceptibility function can be recovered by sampling the continuous voltage function given by Eq. (29) at the Nyquist rate, twice the highest frequency of the magnetic susceptibility function, in each spatial dimension over the sample space for which the function has appreciable energy. Sampling operations other than the present operation and the negligible error encountered by not sampling over the entire sample space are discussed in McC. Siebert [11] and the references therein disclosed which are all incorporated herein by reference. In the absence of noise, the spectrum of the magnetic susceptibility function can be completely recovered if the detector spacing frequency is equal to the Nyquist rate which is twice the highest frequency of the magnetic susceptibility function, and this represents the limit of resolution. However, the density of the detector spacing is limited by noise. The three-dimensional magnetic susceptibility map is a reconstruction from independent recordings at independent detector spatial locations relative to the voxels of the image space where two detector signals are independent if they are sufficiently spatially displaced from each other such that the difference in signal between the two detectors due to a test voxel is above the noise level. The resolution based on signal-to-noise arguments is discussed in the Contrast and Limits of Resolution Section.

Contrast and Limits of Resolution

The ability to visualize a structure in a noise-free environment depends, among other factors, on the local contrast C, which is defined as $$C = \frac{\Delta I}{I} \tag{63}$$

where I is the average background intensity and $\Delta I$ is the intensity variation in the region of interest. The contrast for ReMSI is typically greater than 20%, which compares favorably with computed tomography where the contrast of soft tissue is about 0.1%. The main source of NMR image (also called magnetic resonance images (MRI)) contrast is $T_1$ and $T_2$ which depend on tissue types. In an embodiment, $T_1$ and $T_2$ pulse sequences are provided by magnetic field gradient coils and are used to alter the intensity of the secondary RF field as a function of time to provide image contrast. The contrast may be increased by using RF pulse sequences to polarize the protons which encode $T_1$ (spin/lattice) and $T_2$ (spin/spin) relaxation time information in the data of the secondary RF field in a manner straightforward to those skilled in the NMR art to apply the fields and detectors described for this invention. In an embodiment, the intensity of the bulk magnetization M of each voxel having the corresponding magnetic moment is plotted for each Larmor frequency rather than the magnetic susceptibility wherein $T_1$ (spin/lattice) and $T_2$ (spin/spin) relaxation times encode contrast via intensity variations that are tissue specific and dependent on $T_1$ and/or $T_2$.

Contrast, however, is not a fundamental limit on visualization since it can be artificially enhanced by, for example, subtracting part of the background or raising the intensity pattern to some power. Noise, however, represents a fundamental limitation on the ability to visualize structures. The signal-to-noise ratio, a basic measure of visualization, is determined by the ratio of the desired intensity variations to the random intensity variations, which are governed by the statistical properties of the system. The signal-to-noise ratio (SNR) is defined as $$SNR = \frac{\Delta I}{\theta_I} = C \frac{\bar{I}}{\theta_I} \tag{64}$$

where $\theta_I$ is the standard deviation of the background intensity representing the rms value of the intensity fluctuations.

The noise properties of the ReMSI phenomenon involve additive noise only principally from thermal (1/f) noise in the RF measurement circuits of the antennas of the detector array and from the fluctuations of the primary magnetic field.

It can be seen from Eq. (23) that the total magnetic susceptibility map can be determined from the total magnetic moment map if the magnetizing flux map is known. Since $\chi \approx 10^{-4}$–$10^{-5} \ll 1$, the magnetic susceptibility $\chi$ causes a small perturbation to the magnetizing flux. Thus, the magnetizing flux must be stable to at least the magnitude of the signal contribution due to the magnetic susceptibility. A feature of superconducting magnets is their extreme stability. The object to be imaged is magnetized with a highly stable magnet such as a superconducting magnet. In this case, a magnetic field stability of $10^{-8}\%$ over a month's time is feasible. The magnetizing means can also possess a means to add a component of modulation to the magnetizing field at frequencies below those which would induce eddy currents in the tissue which would contribute significant noise to the secondary magnetic field signal. Such modulation would cause an in-phase modulation of the RF secondary magnetic field signal which can be detected and filtered to improve the signal to noise ratio, or the modulation over space can be used to encode spatial information.

It can further be seen from Eqs. (20–23) that the total magnetic moment map can be determined from the NMR frequencies as input. Since $\chi \approx 10^{-4}$–$10^{-5} \ll 1$, the magnetic susceptibility $\chi$ causes a small perturbation to each NMR frequency (Eqs. (20–23)). However, extremely high frequency resolution is routine. The frequency resolution of RF signals exceeds $10^{-8}\%$. Small antennas measure the RF signals as point samples without significant decrease in the signal to noise ratio relative to large antennas by using impedance matching while minimizing resistive losses by using superconducting reactance elements, for example. In an embodiment, cross talk between antennas is ameliorated or eliminated by time multiplexing the signal detection over the array of antennas. External sources of RF noise can be ameliorated by placing the ReMSI scanner in a shielded room (Faraday cage). The quality of the image (i.e. the signal to noise ratio of the image) can be increased by repeating the reconstruction over multiple time points wherein each data set of a given time point is the set of matrices of the intensity variation over the sample space of the RF field of the bulk magnetization M of each voxel having the corresponding magnetic moment at that synchronized (common) time point. Sources of detector error are random, and the noise averages out as the number of detectors increases. Typically, the noise is suppressed by a factor of the inverse square root of the number of detectors. Thus, the effective limit of flux detection is increased by a factor of the square root of the number of detectors for a constant SNR.

Figure 3:
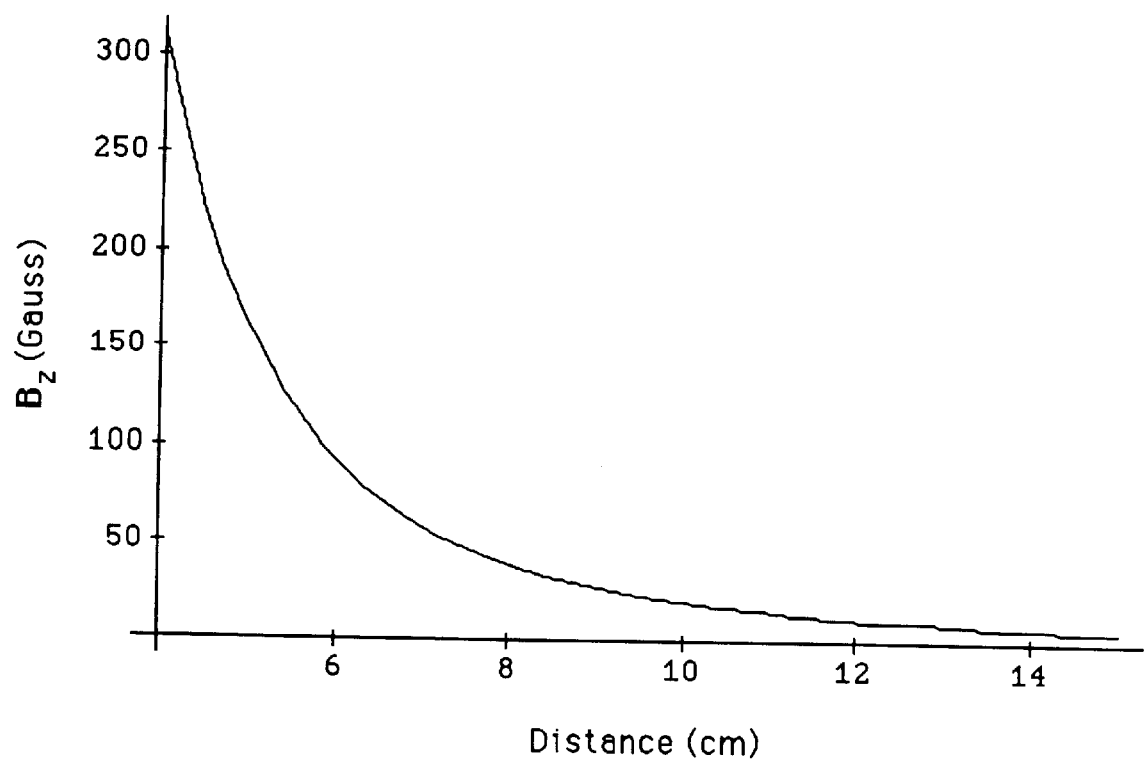
FIG. 3 is the plot of the field of a ring of dipoles of radius R=0.2 cm and magnetic moment $m=10^4$ Gcm$^3$ given by Eq. (I.14) as a function of the distance between the detector at the origin and the center of the ring at the points (0,0, z=4 cm to z=15 cm) in accordance with the invention.
Figure 5:
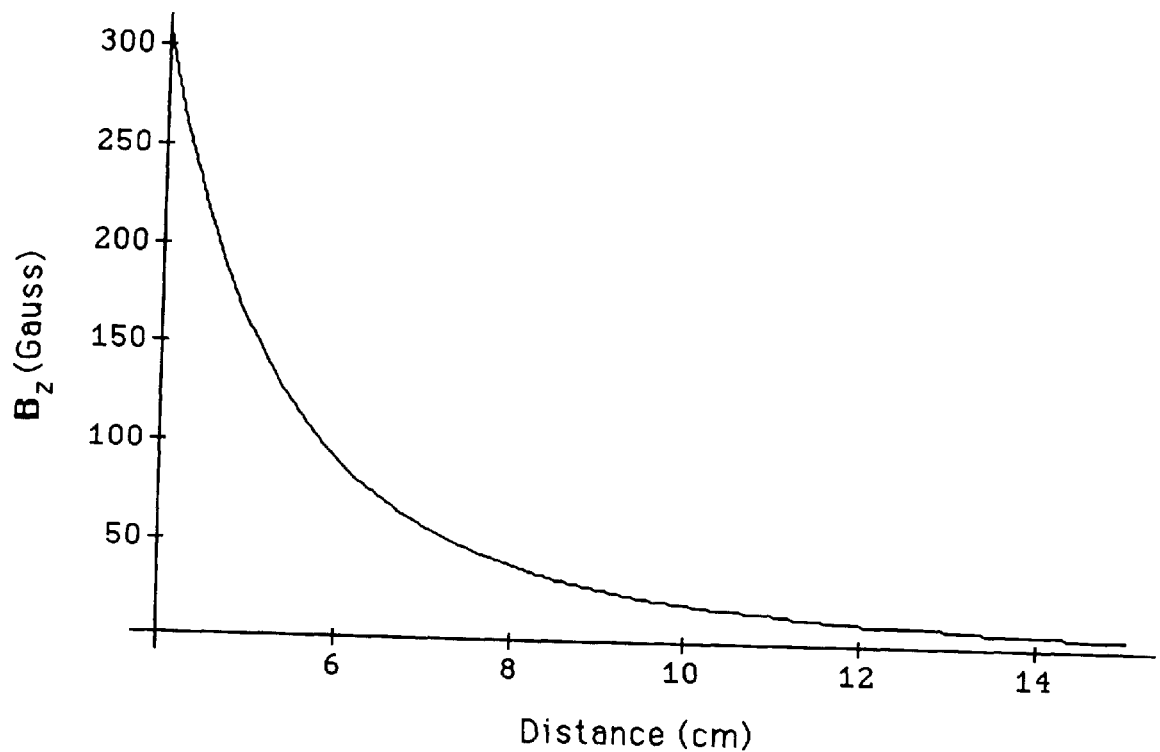
FIG. 5 is the plot of the field of a shell of dipoles of radius R=0.2 cm and magnetic moment $m=10^4$ Gcm$^3$ given by Eq. (II.17) as a function of the distance between the detector at the origin and the center of the shell at the points (0,0, z=4 cm to z=15 cm) in accordance with the invention.
Figure 7:
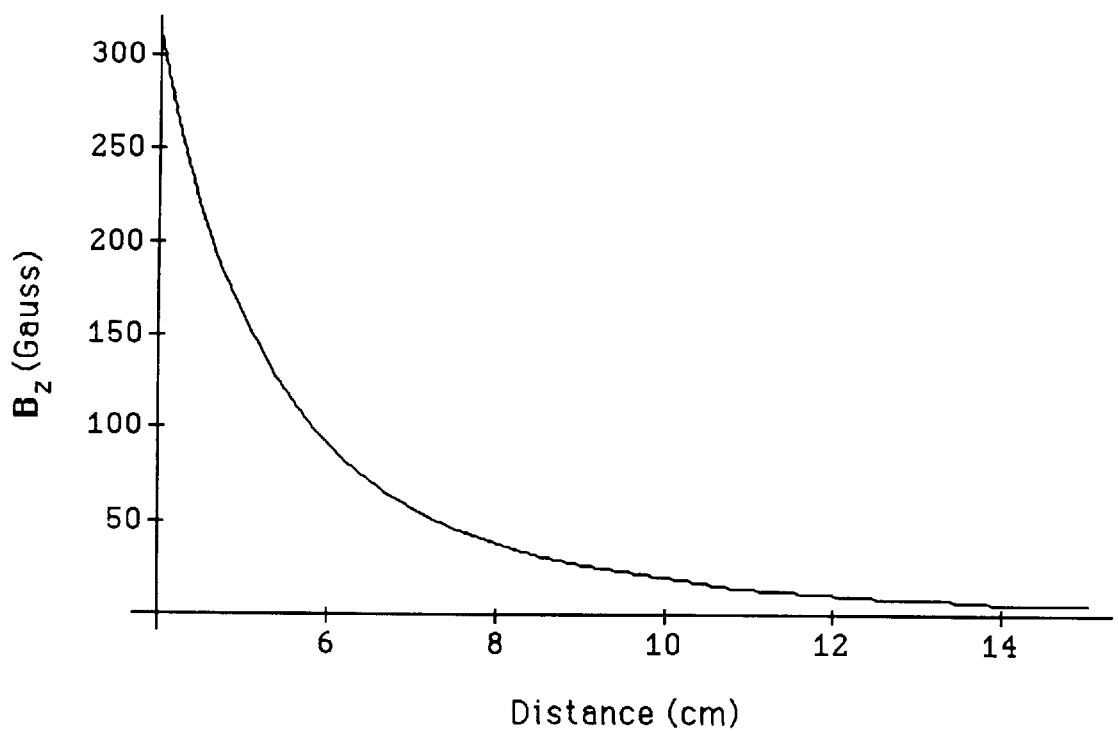
FIG. 7 is the plot of the field of a sphere of dipoles of radius R=0.2 cm and magnetic moment $m=10^4$ Gcm$^3$ given by Eq. (IV.16) as a function of the distance between the detector at the origin and the center of the sphere at the points (0,0, z=4 cm to z=15 cm) in accordance with the invention.

The resolution depends on the extent that the field of the ring, shell, or sphere of dipoles differs from that of a single dipole at the center. The plot of the three cases of the field of a ring, shell, and a sphere of dipoles each of radius R and magnetic moment m=$10^4$ Gcm$^3$ given by Eq. (I.14), Eq. (II.17), and Eq. (IV.16) of APPENDIX I, APPENDIX II, and APPENDIX IV, respectively, as a function of radius R where the position of the center of the ring, shell, and sphere relative to the detector is the point (0,0,10) is given in FIGS. 2, 4, and 6, respectively. The plot of the three cases of the field of a ring, shell, and sphere of dipoles of radius R=0.2 cm and magnetic moment m=$10^4$ Gcm$^3$ given by Eq. (I.14), Eq. (II.17), and Eq. (IV.16) of APPENDIX I, APPENDIX II, and APPENDIX IV, respectively, as a function of the distance between the detector at the origin and the center of the ring, shell, and sphere at the points (0,0, z=4 cm to z=15 cm) is shown in FIGS. 3, 5, and 7, respectively. From FIGS. 2–7, it can be appreciated that the detector must be able to resolve three to four significant figures in order to reconstruct a map of 0.2 cm resolution with a field depth of 15 cm.

Finite Detector Length

The system function, h, of the Reconstruction Algorithm Section is the impulse response for a point detector. The following analysis will concern the impulse response for an NMR detector which has finite dimensions. Consider a detector array 401 as shown in FIG. 12 comprising multiple parallel planes 402 wherein each plane has a plurality of antennae coils 403 wherein each has an area A. The signal at any coil 403 is given by the integral of Eq. (29) over the area of the coil. This is the impulse response which is the system function which replaces h for a finite area detector. The Fourier Transform of this system function contains an argument of a product of the detector area A and the spatial frequency variables. Reconstruction could be performed as previously described in the Reconstruction Algorithm Section where this system function is substituted for the system function for a point detector. In the limit of zero area, the measurement is that of a point sample. Thus, another approach is to use the linearity of the superposition of magnetic flux to gain a higher signal to noise ratio advantage by taking the difference of relatively large signals as opposed to performing the measurements with miniature antennas. In this case, the set of n coils each of area A of each plane comprise a grid of n blocks each of area a<<A formed by the absence of common area overlap of one or more of the coils. The signal of each element of the grid of area a can be solved by the set of linear difference equations of the signals of coils each of area A that corresponds to the noncommon area for the overlapping coils. The solution of the signals due to the grid elements can be obtain using a computer by matrix inversion.

The resulting values represent the average signal for each grid center location. The effect of this data processing operation on the spectrum can be modeled as a sample and hold, where the voltages at the centers of the grid elements are sampled by multiplying by a picket fence of delta functions spaced s units apart which are convolved with d, a square wave function in the x-direction and the y-direction of width s units where the coordinates of Eq. (2) and FIG. 9 are used. In the frequency domain, this data processing operation causes the spectrum of the signal function s to be multiplied by D, the Fourier Transform of the square wave function of width s units, to form function S*. If this multiplication does not multiply S, the Fourier Transform of the signal function, s, by zero for any frequency less than its bandwidth, then S can be recovered from S* by multiplying S* with the inverse of the Fourier transform of the sample and hold square wave function, a two dimensional sinc function for the x and y-directions. This analysis applies to all axes in which direction the detectors have finite length. Furthermore, z-sampling is achieved by translating the array in the z-direction by interval distances at which points discrete signals are recorded or by using multiple parallel plane detector arrays spaced at the sampling interval along the z-axis. However, if the signals are not sampled at discrete z-points, but each sample point is the integral resultant of the signal acquired continuously over a z-displacement of q units which is much greater than the dimension of the detector in the z-direction, then the corresponding sample and hold square wave has a width of q units.

Altering the Dynamic Range Provided by the System Function

The system function used in the Reconstruction Algorithm Section was the geometric system function, h, given as follows:

$$h = \frac{2z^2 - x^2 - y^2}{(x^2 + y^2 + z^2)^{5/2}} \tag{65}$$

This function is the impulse response at the detector array of the z-component of the magnetic field of a z-oriented dipole where the coordinates of Eq. (2) and FIG. 9 are used. The geometric system function convoluted with the advanced and delayed dipoles, which is represented by the function f (Eq. (34)) defined in the said section, gives the function of the secondary flux when the tissue is magnetized with a constant magnetic field of unity. When the tissue is magnetized with a magnetic field whose function is not unity, the solution of Eq. (30) gives the magnetic moment of the voxel which is the product of the magnetic susceptibility and the external flux magnetizing the voxel. To obtain the magnetic susceptibility of the voxel, the solved magnetic moment is divided by the magnitude of the flux magnetizing the voxel.

Consider the NMR case where a quadratic magnetizing field gradient is applied along the y-axis in the z-direction with the coordinates shown in FIGS. 10, 11 and 12 where the magnetizing field strength increases with distance from the detector array. A function of such a field is given as follows:

$$B_z = B_0[a^2 + y_n^2]^{3/2} \tag{66}$$

where $a_0$ and $B_0$ are constants and $y_n$ is the distance from the detector to the voxel. The system function in this case is given by the product of h and Eq. (66). And, the function of the secondary magnetic flux is given by the convolution of the function f (Eq. (34)) with the product of h and Eq. (66), where the advance of each dipole in the z-direction which appears in the function f (Eq. (34)) is substituted with the equivalent NMR coordinate, $y_n$ of Eq. (66), which reduces this part of the function to a constant. Thus, it follows that the solution of Eq. (30) of the Reconstruction Algorithm Section is the magnetic moment of the voxel and that the magnetic susceptibility is given by dividing the said solution by the magnetizing flux. The purpose of applying a field gradient is to change the dynamic range of the signals of the secondary magnetic field. It was demonstrated in the Contrast and Limits of Resolution Section that the signal-to-noise ratio produced at the detector by the voxels determines the limits of resolution. The application of a gradient of magnetizing field which compensates for the drop-off of signal as a function of distance from the array improves the resolution relative to that which is possible in its absence. The gradient levels the signal as a function of distance. In effect, it prevents the contributions produced by voxels in close proximity to the array from dominating the detector signal such that contributions of distant voxels are lost in the relative error. Thus, the limits of resolution are determined by the SNR of the detectors.

In the absence of detector noise, the greater the variation of the signal as a function of position along the z-axis (y-axis in the NMR case), the greater the accuracy of the reconstruction. Noise considerations versus depth resolution are weighed to determine the steepness of the magnetizing gradient if any which leads to an improvement in image quality.

It will thus be seen that the invention efficiently attains the objects set forth above, among those made apparent from the preceding description. Since certain changes may made in the above constructions without departing from the scope of the invention, it is intended that all matter contained in the above description or shown in the accompanying drawings be interpreted as illustrative and not in a limiting sense. In particular, optical methods of detection of magnetic resonance are within the scope of the present invention.

It is also to be understood that the following claims are to cover all generic and specific features of the invention described herein, and all statements of the scope of the invention which, as a matter of language, might be said to fall therebetween.

APPENDIX I

Integration of a RING of Dipoles

Derivation of the Field Produced by a Ring of Magnetic Dipoles

The $\bar{z}$-component of the magnetic field due to a dipole or a loop of current of radius R with dipole moment $m=i\pi R^2$ at the origin is given as follows:

$$B_z = m\left[\frac{2z^2 - x^2 - y^2}{(x^2 + y^2 + z^2)^{5/2}}\right] \tag{I.1}$$

The $\bar{z}$-component of the magnetic field at the position (x,y,z) due to a ring of dipoles of radius R with dipole density $$\frac{m}{2\pi R}$$

centered at the origin is $$B_z = \frac{m}{2\pi R}\int_0^{2\pi} \frac{(2(z-z')^2 - (x-x')^2 - (y-y')^2)R d\phi}{((x-x')^2 + (y-y')^2 + (z-z')^2)^{5/2}} \tag{I.2}$$

wherein (x',y',z') is a variable which corresponds to the position of each individual dipole of the ring. The relationship between Cartesian coordinates and cylindrical coordinates with z'=0 is $$r = \sqrt{x^2 + y^2 + z^2} \quad R = \sqrt{x'^2 + y'^2 + z'^2} \tag{I.3}$$
$$x' = R\cos\phi$$
$$y' = R\sin\phi$$

Substitution of Eq. (I.3) into Eq. (I.2) gives $$B_z = \frac{m}{2\pi}\int_0^{2\pi} \frac{(2z^2 - (x - R\cos\phi)^2 - (y - \sin\phi)^2)d\phi}{((x - R\cos\phi)^2 + (y - R\sin\phi)^2 + z^2)^{5/2}} \tag{I.4}$$

Multiplying out terms gives $$B_z = \frac{m}{2\pi}\int_0^{2\pi} \frac{\begin{aligned}(2z^2 - (x^2 + R^2\cos^2\phi - 2xR\cos\phi) - \\ (y^2 + R^2\sin^2\phi - 2yR\sin\phi))d\phi\end{aligned}}{((x^2 - R^2\cos^2\phi - 2xR\cos\phi) + (y^2 + R^2\sin^2\phi - 2yR\sin\phi) + z^2)^{5/2}} \tag{I.5}$$

Substitution of Eq. (I.3) in the denominator and using the associative relationship and the trigonometric identity, $\cos^2\alpha+\sin^2\alpha=1$ in the denominator gives $$B_z = \frac{m}{2\pi}\int_0^{2\pi} \frac{\begin{aligned}(2z^2 - (x^2 + R^2\cos^2\phi - 2xR\cos\phi) - \\ (y^2 + R^2\sin^2\phi - 2yR\sin\phi))d\phi\end{aligned}}{(r^2 + R^2 - 2R(x\cos\phi + y\sin\phi))^{5/2}} \tag{I.6}$$

The denominator can be approximated using the following relationship $$(a+b)^n \cong a^n + nba^{n-1} \tag{I.7}$$

where $$a = r^2 + R^2 \tag{I.8}$$

$$b = -2R(x\cos\phi + y\sin\phi) \tag{I.9}$$

and $$n = -5/2 \tag{I.10}$$

This case gives the far field where a<<b and/or r>>R. Using Eqs. (I.7–I.10) gives $$(r^2 + R^2 - 2R(x\cos\phi + y\sin\phi))^{-5/2} \cong \tag{I.11}$$
$$\frac{1}{(r^2 + R^2)^{5/2}} + \frac{5R}{(r^2 + R^2)^{7/2}}(x\cos\phi + y\sin\phi)$$

Substitution of Eq. (I.11) into Eq. (I.6) gives $$B_z = \frac{m}{2\pi}\int_0^{2\pi} 2z^2\left[\frac{1}{(r^2 + R^2)^{5/2}} + \frac{5R}{(r^2 + R^2)^{7/2}}\left(\begin{array}{c}x\cos\phi + \\ y\sin\phi\end{array}\right)\right]d\phi \tag{I.12}$$

$$-\frac{m}{2\pi}\int_0^{2\pi}\left[\frac{x^2}{(r^2 + R^2)^{5/2}} + \frac{R^2\cos^2\phi}{(r^2 + R^2)^{5/2}} - \frac{2xR\cos\phi}{(r^2 + R^2)^{5/2}}\right]d\phi$$

$$-\frac{m}{2\pi}\int_0^{2\pi}\left[\begin{array}{c}\frac{5Rx^3\cos\phi}{(r^2 + R^2)^{7/2}} + \frac{5Rx^2y\sin\phi}{(r^2 + R^2)^{7/2}} + \\ \frac{5R^3x\cos^3\phi}{(r^2 + R^2)^{7/2}} + \frac{5R^3y\cos^2\phi\sin\phi}{(r^2 + R^2)^{7/2}} - \\ \frac{10x^2R^2\cos^2\phi}{(r^2 + R^2)^{7/2}} - \frac{10xyR^2\cos\phi\sin\phi}{(r^2 + R^2)^{7/2}}\end{array}\right]d\phi$$

$$-\frac{m}{2\pi}\int_0^{2\pi}\left[\frac{y^2}{(r^2 + R^2)^{5/2}} + \frac{R^2\sin^2\phi}{(r^2 + R^2)^{5/2}} - \frac{2yR\sin\phi}{(r^2 + R^2)^{5/2}}\right]d\phi$$

-continued $$-\frac{m}{2\pi}\int_0^{2\pi}\begin{bmatrix}\frac{5Ry^2x\cos\phi}{(r^2+R^2)^{7/2}}+\frac{5Ry^3\sin\phi}{(r^2+R^2)^{7/2}}+\\ \frac{5R^3x\cos\phi\sin^2\phi}{(r^2+R^2)^{7/2}}+\frac{5R^3y\sin^3\phi}{(r^2+R^2)^{7/2}}-\\ \frac{10R^2xy\cos\phi\sin\phi}{(r^2+R^2)^{7/2}}-\frac{10R^2y^2\sin^2\phi}{(r^2+R^2)^{7/2}}\end{bmatrix}d\phi$$

The integration of Eq. (I.12) gives $$B_z=\frac{m}{2\pi}\begin{Bmatrix}\frac{4\pi z^2}{(r^2+R^2)^{5/2}}-\frac{2\pi x^2}{(r^2+R^2)^{5/2}}-\frac{\pi R^2}{(r^2+R^2)^{5/2}}+\\ \frac{10\pi x^2R^2}{(r^2+R^2)^{7/2}}-\frac{2\pi y^2}{(r^2+R^2)^{5/2}}-\\ \frac{\pi R^2}{(r^2+R^2)^{5/2}}+\frac{10\pi R^2y^2}{(r^2+R^2)^{7/2}}\end{Bmatrix} \quad (I.13)$$

Collecting terms gives
Ring of Dipoles:

$$B_z\cong m\left\{\left[\frac{2z^2-x^2-y^2}{(r^2+R^2)^{5/2}}\right]-\left[\frac{R^2}{(r^2+R^2)^{5/2}}\right]+\left[\frac{5R^2(x^2+y^2)}{(r^2+R^2)^{7/2}}\right]\right\} \quad (I.14)$$

Eq. (I.14) demonstrates that the magnetic field of a ring of dipoles is not equal to that of a single dipole at the origin. The ring radius, R, appears in the denominator of each term. The first term is the magnetic field of a dipole at the origin only when the variable corresponding to the radius of the ring, R, is zero. The second and third terms are additional perturbations of the field of a dipole at the origin whose magnitude is a function of the radius of the ring. The second and third terms vanish only when the radius of the ring is zero. A ring of dipoles has a field that is cylindrically symmetrical. A shell, a cylinder, and a sphere of dipoles are the only other cases which have this symmetry. A cylinder is a linear combination of rings. Thus, the uniqueness of the dipole field is demonstrated by showing that it is different from that of a ring, a shell, and a sphere. The present result that the field of a dipole is different for that of a ring of dipoles as well as the same result in the cases of a shell and a sphere of dipoles shown in APPENDIX II and APPENDIX IV, respectively, demonstrate that dipole field is unique. All other fields are a linear combination of dipoles. Thus, the dipole is a basis element for the reconstruction of a magnetic susceptibility image. The resolution depends on the extent that the field of the ring of dipoles differs from that of a single dipole at the origin. The plot of the field of a ring of dipoles of radius R and magnetic moment $m=10^4$ Gcm$^3$ given by Eq. (I.14) as a function of radius R is given in FIG. 2. The position of the center of the ring relative to the detector is the point (0,0,10). The plot of the field of a ring of dipoles of radius R=0.2 cm and magnetic moment $m=10^4$ Gcm$^3$ given by Eq. (I.14) as a function of the distance between the detector at the origin and the center of the ring at the points (0,0, z=4 cm to z=15 cm) is shown in FIG. 3. From FIGS. 2 and 3 it can be appreciated that the detector must be able to resolve three to four significant figures in order to reconstruct a map of 0.2 cm resolution with a field depth of 15 cm.

APPENDIX II

Integration of a Spherical Shell of Dipoles

Derivation of the Field Produced by a Shell of Magnetic Dipoles

The $\bar{z}$-component of the magnetic field due to a dipole or a loop of current of radius R with dipole moment $m=i\pi R^2$ at the origin is given as follows:

$$B_z=m\left[\frac{2z^2-x^2-y^2}{(x^2+y^2+z^2)^{5/2}}\right] \quad (II.1)$$

The $\bar{z}$-component of the magnetic field at the position (x,y,z) due to a shell of dipoles of radius R with dipole density $$\frac{m}{4\pi R^2}$$

centered at the origin is $$B_z=\frac{m}{4\pi R^2}\int_0^{2\pi}\int_0^{\pi}\frac{(2(z-z')^2-(x-x')^2-(y-y')^2)R^2\sin\phi d\phi d\theta}{((x-x')^2+(y-y')^2+(z-z')^2)^{5/2}} \quad (II.2)$$

wherein (x',y',z') is a variable which corresponds to the position of each individual dipole of the shell. The relationship between Cartesian coordinates and spherical coordinates is $$\rho=\sqrt{x^2+y^2+z^2} \quad R=\sqrt{x'^2+y'^2+z'^2} \quad (II.3)$$
$$x=\rho\sin\phi\cos\theta \quad x'=R\sin\phi\cos\theta$$
$$y=\rho\sin\phi\sin\theta \quad y'=R\sin\phi\sin\theta$$

Substitution of Eq. (II.3) into Eq. (II.2) gives $$B_z=\frac{m}{4\pi R^2}\int_0^{2\pi}\int_0^{\pi}\frac{\begin{array}{c}(2(z-R\cos\phi)^2-(x-R\sin\phi\cos\theta)^2-\\ (y-R\sin\phi\sin\theta)^2)R^2\sin\phi d\phi d\theta\end{array}}{\begin{array}{c}((x-R\sin\phi\cos\theta)^2+(y-R\sin\phi\sin\theta)^2+\\ (z-R\cos\phi)^2)^{5/2}\end{array}} \quad (II.4)$$

Multiplying out terms gives $$B_z=\frac{m}{4\pi R^2} \quad (II.5)$$

$$\int_0^{2\pi}\int_0^{\pi}\frac{\begin{array}{c}(2z^2-4zR\cos\phi+2R^2\cos^2\phi-x^2+2xR\sin\phi\cos\theta-\\ R^2\sin^2\phi\cos^2\theta-y^2+2yR\sin\phi\sin\theta-\\ R^2\sin^2\phi\sin^2\theta)R^2\sin\phi d\phi d\theta\end{array}}{\begin{array}{c}(x^2-2xR\sin\phi\cos\theta+R^2\sin^2\phi\cos^2\theta+y^2-\\ 2yR\sin\phi\sin\theta+R^2\sin^2\phi\sin^2\theta+z^2-\\ 2zR\cos\phi+R^2\cos^2\phi)^{5/2}\end{array}}$$

Multiplying out the $R^2\sin\phi$ term gives $$B_z=\frac{m}{4\pi R^2}\int_0^{2\pi}\int_0^{\pi}\frac{\begin{array}{c}(2R^2z^2\sin\phi-4zR^3\sin\phi\cos\phi+2R^4\cos^2\phi\sin\phi-\\ x^2R^2\sin\phi+2xR^3\sin^2\phi\cos\theta-\\ R^4\sin^3\phi\cos^2\theta-y^2R^2\sin\phi+2yR^3\sin^2\phi\sin\theta-\\ R^4\sin^3\phi\sin^2\theta)d\phi d\theta\end{array}}{\begin{array}{c}(x^2-2xR\sin\phi\cos\theta+R^2\sin^2\phi\cos^2\theta+y^2-\\ 2yR\sin\phi\sin\theta+R^2\sin^2\phi\sin^2\theta+z^2-\\ 2zR\cos\phi+R^2\cos^2\phi)^{5/2}\end{array}} \quad (II.6)$$

Substitution of Eq. (II.3) in the denominator gives $$B_z = \frac{m}{4\pi R^2} \int_0^{2\pi} \int_0^{\pi} \frac{\begin{array}{c}(2R^2z^2\sin\phi - 4zR^3\sin\phi\cos\phi + 2R^4\cos^2\phi\sin\phi - \\ x^2R^2\sin\phi + 2xR^3\sin^2\phi\cos\theta - \\ R^4\sin^3\phi\cos^2\theta - y^2R^2\sin\phi + 2yR^3\sin^2\phi\sin\theta - \\ R^4\sin^3\phi\sin^2\theta)d\phi d\theta\end{array}}{\begin{array}{c}(\rho^2 - 2xR\sin\phi\cos\theta + R^2\sin^2\phi\cos^2\theta - \\ 2yR\sin\phi\sin\theta + R^2\sin^2\phi\sin^2\theta - \\ 2zR\cos\phi + R^2\cos^2\phi)^{5/2}\end{array}} \quad (II.7)$$

Using the associative relationship and using the trigonometric identity, $\cos^2\alpha + \sin^2\alpha = 1$ in the denominator gives $$B_z = \frac{m}{4\pi R^2} \int_0^{2\pi} \int_0^{\pi} \frac{\begin{array}{c}(2R^2z^2\sin\phi - 4zR^3\sin\phi\cos\phi + 2R^4\cos^2\phi\sin\phi - \\ x^2R^2\sin\phi + 2xR^3\sin^2\phi\cos\theta - \\ R^4\sin^3\phi\cos^2\theta - y^2R^2\sin\phi + 2yR^3\sin^2\phi\sin\theta - \\ R^4\sin^3\phi\sin^2\theta)d\phi d\theta\end{array}}{(\rho^2 + R^2 - 2xR\sin\phi\cos\theta - 2yR\sin\phi\sin\theta - 2zR\cos\phi)^{5/2}} \quad (II.8)$$

The denominator can be approximated using the following relationship $$(a+b)^n \cong a^n + nba^{n-1} \quad (II.9)$$

where $$a = \rho^2 + R^2 \quad (II.10)$$

$$b = -2xR\sin\phi\cos\theta - 2yR\sin\phi\sin\theta - 2zR\cos\phi \quad (II.11)$$

and $$n = -5/2 \quad (II.12)$$

This case gives the far field where $a \ll b$ and/or $\rho \gg R$. Using Eqs. (II.8–II.12) gives $$(\rho^2 + R^2 - 2xR\sin\phi\cos\theta - 2yR\sin\phi\sin\theta - 2zR\cos\phi)^{-5/2} \cong \quad (II.13)$$
$$\frac{1}{(\rho^2+R^2)^{5/2}} + \frac{5R}{(\rho^2+R^2)^{7/2}}(x\sin\phi\cos\theta + y\sin\phi\sin\theta + z\cos\phi)$$

Substitution of Eq. (II.13) into Eq. (II.8) gives $$B_z = \frac{m}{4\pi R^2} \quad (II.13)$$
$$\int_0^{2\pi} \int_0^{\pi} \left[ \frac{2R^2z^2\sin\phi}{(\rho^2+R^2)^{5/2}} + \frac{10R^3z^2\sin\phi}{(\rho^2+R^2)^{7/2}}(x\sin\phi\cos\theta + y\sin\phi\sin\theta + z\cos\phi) - \frac{4zR^3\sin\phi\cos\phi}{(\rho^2+R^2)^{5/2}} - \frac{20zR^4\sin\phi\cos\phi}{(\rho^2+R^2)^{7/2}}\right.$$
$$(x\sin\phi\cos\theta + y\sin\phi\sin\theta + z\cos\phi) + \frac{2R^4\cos^2\phi\sin\phi}{(\rho^2+R^2)^{5/2}} +$$
$$\frac{10R^5\cos^2\phi\sin\phi}{(\rho^2+R^2)^{7/2}}(x\sin\phi\cos\theta + y\sin\phi\sin\theta + z\cos\phi) -$$
$$\frac{x^2R^2\sin\phi}{(\rho^2+R^2)^{5/2}} + \frac{5x^2R^3\sin\phi}{(\rho^2+R^2)^{7/2}}$$
$$(x\sin\phi\cos\theta + y\sin\phi\sin\theta + z\cos\phi) + \frac{2xR^3\sin^2\phi\cos\theta}{(\rho^2+R^2)^{5/2}} -$$
$$\frac{10xR^4\sin^2\phi\cos\theta}{(\rho^2+R^2)^{7/2}}(x\sin\phi\cos\theta + y\sin\phi\sin\theta + z\cos\phi) -$$
$$\frac{R^4\sin^3\phi\cos^2\theta}{(\rho^2+R^2)^{5/2}} - \frac{5R^5\sin^3\phi\cos^2\theta}{(\rho^2+R^2)^{7/2}}$$
$$(x\sin\phi\cos\theta + y\sin\phi\sin\theta + z\cos\phi) - \frac{y^2R^2\sin\phi}{(\rho^2+R^2)^{5/2}} -$$
$$\frac{5y^2R^3\sin\phi}{(\rho^2+R^2)^{7/2}}(x\sin\phi\cos\theta + y\sin\phi\sin\theta + z\cos\phi) +$$
$$\frac{2yR^3\sin^2\phi\sin\theta}{(\rho^2+R^2)^{5/2}} + \frac{10yR^4\sin^2\phi\sin\theta}{(\rho^2+R^2)^{7/2}}$$
$$(x\sin\phi\cos\theta + y\sin\phi\sin\theta + z\cos\phi) - \frac{R^4\sin^3\phi\sin^2\theta}{(\rho^2+R^2)^{5/2}} -$$
$$\left. \frac{5R^5\sin^3\phi\sin^2\theta}{(\rho^2+R^2)^{7/2}}(x\sin\phi\cos\theta + y\sin\phi\sin\theta + z\cos\phi) \right] d\phi d\theta$$

The integral of a sum is equal to the sum of the integrals.

$$B_z = \frac{m}{4\pi R^2} \left\{ \int_0^{2\pi}\int_0^{\pi} \left[ \frac{2R^2z^2\sin\phi}{(\rho^2+R^2)^{5/2}} + \frac{10R^3z^2\sin\phi}{(\rho^2+R^2)^{7/2}}(x\sin\phi\cos\theta + y\sin\phi\sin\theta + z\cos\phi)\right]d\phi d\theta - \right. \quad (II.15)$$
$$\int_0^{2\pi}\int_0^{\pi}\left[\frac{4zR^3\sin\phi\cos\phi}{(\rho^2+R^2)^{5/2}} + \frac{20zR^4\sin\phi\cos\phi}{(\rho^2+R^2)^{7/2}}(x\sin\phi\cos\theta + y\sin\phi\sin\theta + z\cos\phi)\right]d\phi d\theta +$$
$$\int_0^{2\pi}\int_0^{\pi}\left[\frac{2R^4\cos^2\phi\sin\phi}{(\rho^2+R^2)^{5/2}} + \frac{10R^5\cos^2\phi\sin\phi}{(\rho^2+R^2)^{7/2}}(x\sin\phi\cos\theta + y\sin\phi\sin\theta + z\cos\phi)\right]d\phi d\theta -$$
$$\int_0^{2\pi}\int_0^{\pi}\left[\frac{x^2R^2\sin\phi}{(\rho^2+R^2)^{5/2}} + \frac{5x^2R^3\sin\phi}{(\rho^2+R^2)^{7/2}}(x\sin\phi\cos\theta + y\sin\phi\sin\theta + z\cos\phi)\right]d\phi d\theta +$$
$$\int_0^{2\pi}\int_0^{\pi}\left[\frac{2xR^3\sin^2\phi\cos\theta}{(\rho^2+R^2)^{5/2}} + \frac{10xR^4\sin^2\phi\cos\theta}{(\rho^2+R^2)^{7/2}}(x\sin\phi\cos\theta + y\sin\phi\sin\theta + z\cos\phi)\right]d\phi d\theta -$$
$$\int_0^{2\pi}\int_0^{\pi}\left[\frac{R^4\sin^3\phi\cos^2\theta}{(\rho^2+R^2)^{5/2}} + \frac{5R^5\sin^3\phi\cos^2\theta}{(\rho^2+R^2)^{7/2}}(x\sin\phi\cos\theta + y\sin\phi\sin\theta + z\cos\phi)\right]d\phi d\theta -$$

-continued $$\int_0^{2\pi}\int_0^{\pi}\left[\frac{y^2R^2\sin\phi}{(\rho^2+R^2)^{5/2}}+\frac{5y^2R^3\sin\phi}{(\rho^2+R^2)^{7/2}}(x\sin\phi\cos\theta+y\sin\phi\sin\theta+z\cos\phi)\right]d\phi d\theta +$$

$$\int_0^{2\pi}\int_0^{\pi}\left[\frac{2yR^3\sin^2\phi\sin\theta}{(\rho^2+R^2)^{5/2}}+\frac{10yR^4\sin^2\phi\sin\theta}{(\rho^2+R^2)^{7/2}}(x\sin\phi\cos\theta+y\sin\phi\sin\theta+z\cos\phi)\right]d\phi d\theta -$$

$$\int_0^{2\pi}\int_0^{\pi}\left[\frac{R^4\sin^3\phi\sin^2\theta}{(\rho^2+R^2)^{5/2}}+\frac{5R^5\sin^3\phi\sin^2\theta}{(\rho^2+R^2)^{7/2}}(x\sin\phi\cos\theta+y\sin\phi\sin\theta+z\cos\phi)\right]d\phi d\theta\Bigg\}$$

The integration of Eq. (II.15) gives $$B_z = \frac{m}{4\pi R^2}\Bigg\{\frac{8\pi z^2 R^2}{(\rho^2+R^2)^{5/2}} - \frac{80\pi z^2 R^4}{3(\rho^2+R^2)^{7/2}} + \frac{8\pi R^4}{3(\rho^2+R^2)^{5/2}} - \qquad (II.16)$$

$$\frac{4\pi x^2 R^2}{(\rho^2+R^2)^{5/2}} + \frac{40\pi x^2 R^4}{3(\rho^2+R^2)^{7/2}} - \frac{4\pi R^4}{3(\rho^2+R^2)^{5/2}} -$$

$$\frac{4\pi y^2 R^2}{3(\rho^2+R^2)^{5/2}} + \frac{40\pi y^2 R^4}{3(\rho^2+R^2)^{7/2}} - \frac{4\pi R^4}{3(\rho^2+R^2)^{5/2}}\Bigg\}$$

Collecting terms gives

Shell of Dipoles:

$$B_z = \frac{m}{4\pi R^2}\left\{4\pi R^2\left[\frac{2z^2-x^2-y^2}{(\rho^2+R^2)^{5/2}}\right] - \frac{40\pi R^4}{3}\left[\frac{2z^2-x^2-y^2}{(\rho^2+R^2)^{7/2}}\right]\right\} \qquad (II.17)$$

Eq. (II.17) demonstrates that the magnetic field of a shell of dipoles is not equal to that of a single dipole at the origin. The shell radius, R, appears in the denominator of the first term. The first term is the magnetic field of a dipole at the origin only when the variable corresponding to the radius of the shell, R, is zero. The second term is an additional perturbation of the field of a dipole at the origin whose magnitude is a function of the radius of the shell. The second term vanishes only when the radius of the shell is zero. Thus, the dipole is a basis element for the reconstruction of a magnetic susceptibility image. The resolution depends on the extent that the field of the shell of dipoles differs from that of a single dipole at the origin. The plot of the field of a shell of dipoles of radius R and magnetic moment m=$10^4$ Gcm$^3$ given by Eq. (II.17) as a function of radius R is given in FIG. 4. The position of the center of the shell relative to the detector is the point (0,0,10). The plot of the field of a shell of dipoles of radius R=0.2 cm and magnetic moment m=$10^4$ Gcm$^3$ given by Eq. (II.17) as a function of the distance between the detector at the origin and the center of the shell at the points (0,0,z) is shown in FIG. 5. From FIGS. 4 and 5 it can be appreciated that the detector must be able to resolve three to four significant figures in order to reconstruct a map of 0.2 cm resolution with a field depth of 15 cm.

APPENDIX III

Proof that the Field Produced by a Shell of Magnetic Dipoles is Different from that of a Single Dipole Consider Eq. (II.5).

$$B_z = \frac{m}{4\pi R^2}\int_0^{2\pi}\int_0^{\pi}\frac{\begin{array}{c}(2z^2-4zR\cos\phi+2R^2\cos^2\phi-x^2+2xR\sin\phi\cos\theta-\\ R^2\sin^2\phi\cos^2\theta-y^2+2yR\sin\phi\sin\theta-R^2\sin^2\phi\sin^2\theta)R^2\sin\phi\,d\phi d\theta\end{array}}{\begin{array}{c}(x^2-2xR\sin\phi\cos\theta+R^2\sin^2\phi\cos^2\theta+y^2-2yR\sin\phi\sin\theta+\\ (R^2\sin^2\phi\sin^2\theta+z^2-2zR\cos\phi+R^2\cos^2\phi))^{5/2}\end{array}} \qquad (III.1)$$

The conditions for this integral to equal that of the field of a dipole at the origin are $-4zR\cos\phi+2R^2\cos^2\phi+2xR\sin\phi\cos\theta-R^2\sin^2\phi\cos^2\theta+2yR\sin\phi\sin\theta-R^2\sin^2\phi\sin^2\theta=0$ (III.2)

and $-2xR\sin\phi\cos\theta+R^2\sin^2\phi\cos^2\theta-2yR\sin\phi\sin\theta+R^2\sin^2\phi\sin^2\theta-2zR\cos\phi+R^2\cos^2\phi=0$ (III.3)

Thus, Eq. (III.2) must equal Eq. (III.3).

$-4zR\cos\phi+2R^2\cos^2\phi+2xR\sin\phi\cos\theta-R^2\sin^2\phi\cos^2\theta+2yR\sin\phi\sin\theta-R^2\sin^2\phi\sin^2\theta$
$=-2xR\sin\phi\cos\theta+R^2\sin^2\phi\cos^2\theta-2yR\sin\phi\sin\theta+R^2\sin^2\phi\sin^2\theta-2zR\cos\phi+R^2\cos^2\phi$ (III.4)

Therefore, $-2zR\cos\phi+R^2\cos^2\phi-2R^2\sin^2\phi\cos^2\theta+4x\sin\phi\cos\theta+4yR\sin\phi\sin\theta-2R^2\sin^2\phi\sin^2\theta=0$ (III.5)

Using the associative relationship and the trigonometric identity, $\cos^2\alpha+\sin^2\alpha=1$ as well as factoring out an R in Eq. (III.5) gives $-2zR\cos\phi+R^2\cos^2\phi-2R^2\sin^2\phi+4x\sin\phi\cos\theta+4yR\sin\phi\sin\theta=0$ (III.6)

$-2z\cos\phi+3R\cos^2\phi-2R+4x\sin\phi\cos\theta+4y\sin\phi\sin\theta=0$ (III.7)

For $x\neq 0$, $y\neq 0$, $z\neq 0$, Eq. (III.7) is true only if R=0 which proves that the field of a shell of dipoles centered on the origin is different from that of a single dipole at the origin.

Eq. (III.5) can not be integrated in closed form; however, the integral can be approximated so that the detector tolerances for a given image resolution can be determined. The denominator of Eq. (III.5) can be approximated using the following relationship $(a+b)^n \approx a^n + nba^{n-1}$ (III.8)

where $$a = \rho^2 + R^2 \tag{III.9}$$

$$b = -2xR \sin\phi \cos\theta - 2yR \sin\phi \sin\theta - 2zR \cos\phi \tag{III.10}$$

and $$n = -5/2 \tag{III.11}$$

The result given by Eq. (II.17) is $$B_z = \frac{m}{4\pi R^2}\left\{4\pi R^2\left[\frac{2z^2 - x^2 - y^2}{(\rho^2 + R^2)^{5/2}}\right] - \frac{40\pi R^4}{3}\left[\frac{2z^2 - x^2 - y^2}{(\rho^2 + R^2)^{7/2}}\right]\right\} \tag{III.12}$$

Higher order terms of the approximation given by Eq. (III.8) would contain mixed products of the coordinate variables which would increase the deviation of the derivation of the field a shell of dipoles from that of a single dipole at the origin.

APPENDIX IV

Integration of a Sphere of Dipoles

Derivation of the Field Produced by a Sphere of Magnetic Dipoles

The $\bar{z}$-component of the magnetic field due to a sphere of dipoles is derived using the equation for a Shell of dipoles with the substitution of the dipole density of the sphere $$\frac{3m}{4\pi R^3}$$

where the radius of the sphere is R. The field of a shell of dipoles is given approximately by Eq. (II.17) of the Derivation of the Field Produced by a Shell of Magnetic Dipoles Section $$B_z = \frac{m}{4\pi r^2}\left\{4\pi r^2\left[\frac{2z^2 - x^2 - y^2}{(\rho^2 + r^2)^{5/2}}\right] - \frac{40\pi r^4}{3}\left[\frac{2z^2 - x^2 - y^2}{(\rho^2 + r^2)^{7/2}}\right]\right\} \tag{IV.1}$$

where the radius of the shell is r (The parameter r replaces the constant R of Eq. (II.17) as the radius of the shell.). For small r, the first term of Eq. (IV.1) dominates and is used to approximately calculate the $\bar{z}$-component of the magnetic field due to a sphere of $\bar{z}$-oriented dipoles as follows:

A sphere of dipoles is equivalent to the integral over concentric shells of dipoles each of radius r where $0 \leq r \leq R$. Thus, the $\bar{z}$-component of the magnetic field due to a sphere of dipoles is the integral of the field of the shells given by Eq. (IV.1).

$$B_z = \frac{m}{4/3\pi R^3} 4\pi \int_0^R \left[\frac{2z^2 - x^2 - y^2}{(\rho^2 + r^2)^{5/2}}\right] r^2 dr \tag{IV.2}$$

Let $$r/\rho = \tan\theta; \quad dr = \rho\sec^2\theta d\theta \tag{IV.3}$$

and using the trigonometric identity $$1 + \tan^2\theta = \sec^2\theta \tag{IV.4}$$

Eq. (IV.2) becomes $$B_z = (2z^2 - x^2 - y^2)\frac{m}{\frac{4}{3}\pi R^3}\int_0^R \frac{4\pi}{\rho^2}\frac{\tan^2\theta}{\sec^5\theta}\sec^2\theta d\theta \tag{IV.5}$$

Substitution in of $$\tan\theta = \frac{\sin\theta}{\cos\theta} \tag{IV.6}$$

and $$\sec\theta = \frac{1}{\cos\theta} \tag{IV.7}$$

into Eq. (IV.5) gives $$B_z = (2z^2 - x^2 - y^2)\frac{m}{\frac{4}{3}\pi R^3}\int_0^R \frac{4\pi}{\rho^2}\sin^2\theta\cos\theta d\theta \tag{IV.8}$$

Let $$u = \sin\theta; \quad du = \cos\theta d\theta \tag{IV.9}$$

Substitution of Eq. (IV.9) into Eq. (IV.8) followed by integration gives $$B_z = (2z^2 - x^2 - y^2)\frac{m}{\frac{4}{3}\pi R^3}\frac{4\pi}{\rho^2}\frac{u^3}{3} \tag{IV.10}$$

Substitution of Eq. (IV.9) into Eq. (IV.10) gives $$B_z = (2z^2 - x^2 - y^2)\frac{m}{\frac{4}{3}\pi R^3}\frac{4\pi}{\rho^2}\frac{\sin^3\theta}{3} \tag{IV.11}$$

From Eq. (IV.3)

$$\frac{r}{\rho} = \tan\theta; \quad \sin\theta = \frac{\frac{r}{\rho}}{\sqrt{1 + \left(\frac{r}{\rho}\right)^2}} \tag{IV.12}$$

Substitution of Eq. (IV.12) into Eq. (IV.11) gives $$B_z = (2z^2 - x^2 - y^2)\frac{m}{R^3\rho^5}\frac{r^3}{\left(1 + \left(\frac{r}{\rho}\right)^2\right)^{3/2}}\Big|_0^R \tag{IV.13}$$

Evaluation at the limits of the integral gives $$B_z = (2z^2 - x^2 - y^2)\frac{m}{R^3\rho^5}\frac{r^3}{\left(1 + \left(\frac{r}{\rho}\right)^2\right)^{3/2}}\Big|_0^R \tag{IV.14}$$

Multiplication of Eq. (IV.14) by $$1 = \frac{\left(1+\left(\frac{R}{\rho}\right)^2\right)}{\left(1+\left(\frac{R}{\rho}\right)^2\right)}$$

gives $$B_z = (2z^2 - x^2 - y^2)\frac{m}{R^3\rho^5}\left\{\frac{R^3\left(1+\left(\frac{R}{\rho}\right)^2\right)}{\left(1+\left(\frac{R}{\rho}\right)^2\right)^{5/2}}\right\} \quad \text{(IV.15)}$$

Multiplying out the $\rho^5$ term in the denominator gives
Sphere of Dipoles:

$$B_z = \frac{m(2z^2 - x^2 - y^2)}{(R^2 + \rho^2)^{5/2}}\left(1+\left(\frac{R}{\rho}\right)^2\right) \quad \text{(IV.16)}$$

Eq. (IV.16) demonstrates that the magnetic field of a sphere of dipoles is not equal to that of a single dipole at the origin. The shell radius, R, appears in the denominator of the first term. The first term is the magnetic field of a dipole at the origin only when the variable corresponding to the radius of the shell, R, is zero. The second term is an additional perturbation of the field of a dipole at the origin whose magnitude is a function of the radius of the sphere. The second term vanishes only when the radius of the sphere is zero. Thus, the dipole is a basis element for the reconstruction of a magnetic susceptibility image. The resolution depends on the extent that the field of the sphere of dipoles differs from that of a single dipole at the origin. The plot of the field of a sphere of dipoles of radius R and magnetic moment m=$10^4$ Gcm$^3$ given by Eq. (IV.16) as a function of radius R is given in FIG. 6. The position of the center of the sphere relative to the detector is the point (0,0,10). The plot of the field of a sphere of dipoles of radius R=0.2 cm and magnetic moment m=$10^4$ Gcm$^3$ given by Eq. (IV.16) as a function of the distance between the detector at the origin and the center of the sphere at the points (0,0, z) is shown in FIG. 7. From FIGS. 6 and 7 it can be appreciated that the detector must be able to resolve three to four significant figures in order to reconstruct a map of 0.2 cm resolution with a field depth of 15 cm.

APPENDIX V

Fourier Transform of the System Function

The system function, $h(\rho,\phi,z)$, in cylindrical coordinates is $$h(\rho, \phi, z) = \frac{2z^2 - x^2 - y^2}{[x^2 + y^2 + z^2]^{5/2}} = \frac{2z^2 - \rho^2}{[\rho^2 + z^2]^{5/2}} \quad \text{(V.1)}$$

The spacetime Fourier transform in three dimensions in cylindrical coordinates, $H(k_\rho,\Phi,k_z)$, is given [9] as follows:

$$H(k_\rho, \Phi, k_z) = \quad \text{(V.2)}$$

-continued $$\int_{-\infty}^{\infty}\int_0^{2\pi}\int_0^{\infty} h(\rho, \phi, z)\exp(-i2\pi[k_\rho\rho\cos(\Phi - \phi) + k_z z])\rho d\rho d\phi dz$$

With circular symmetry [9]

$$H(k_\rho, k_z) = 2\pi \int_0^{\infty}\int_{-\infty}^{\infty} h(\rho, z)J_o(k_\rho\rho)e^{-iwz}\rho d\rho dz \quad \text{(V.3)}$$

The Fourier transform of the system function is given by the substitution of Eq. (V.1) into Eq. (V.3).

$$H = \int_{-\infty}^{\infty} 2\pi \int_0^{\infty} \frac{2z^2 - \rho^2}{[\rho^2 + z^2]^{5/2}}J_o[k_\rho\rho]\rho d\rho e^{-jk_z z}dz \quad \text{(V.4)}$$

Consider the integral of Eq. (V.4) with respect to d$\rho$ only. Factorization of $h(\rho,\phi,z)$ gives $$2\pi \int_0^{\infty}\left[\frac{2z^2\rho}{[\rho^2 + z^2]^{5/2}} - \frac{\rho^3}{[\rho^2 + z^2]^{5/2}}\right]J_o[k_\rho p]d\rho \quad \text{(V.5)}$$

Consider the definite integral $$\int_0^{\infty}\frac{t^{\nu+1}J_\nu[at]dt}{[t^2 + z^2]^{u+1}} = \frac{a^u z^{\nu-u}K_{\nu-u}[az]}{2^u \Gamma[u+1]} \quad \text{(V.6)}$$

and the modified Bessel function of the third kind relationship, $$K_{-\nu}[x] = K_\nu[x] \quad \text{(V.7)}$$

The first factor of Eq. (V.5) is the same form as Eq. (V.6) with $\nu$=0; u=3/2, thus, $$2z^2(2\pi)\int_0^{\infty}\frac{\rho}{[\rho^2 + z^2]^{5/2}}J_o[k_\rho\rho]d\rho = \frac{2z^2(2\pi)k_\rho^{3/2}z^{-3/2}}{2^{3/2}\Gamma[5/2]}K_{-3/2}[k_\rho z] \quad \text{(V.8)}$$

$$= \frac{[2^{1/2}]\pi z^{1/2}k_\rho^{3/2}}{\Gamma[5/2]}K_{3/2}[k_\rho z]$$

where $K_{-3/2}[k_\rho z] = K_{3/2}[k_\rho z]$ (Eq. (V.7)). The second factor of Eq. (V.5) can be made into the same form as Eq. (V.6) using the Bessel function of the first kind recurrence relationship $$J_{\nu-1}[x] + J_{\nu+1}[x] = \frac{2\nu}{x}J_\nu[x] \quad \text{(V.9)}$$

Consider the second factor of the integral of Eq. (V.5).

$$-2\pi \int_0^{\infty}\frac{\rho^3}{[\rho^2 + z^2]}J_o[k_\rho\rho]d\rho \quad \text{(V.10)}$$

Eq. (V.9) with $\nu$=1 is $$J_o[x] + J_2[x] = 2/xJ_1[x] \quad \text{(V.11)}$$

$$J_o[x] = 2/xJ_1[x] - J_2[x] \quad \text{(V.12)}$$

Let $$x = k_\rho \rho \quad \text{(V.13)}$$

Substitution of Eq. (V.13) into Eq. (V.12) is $$J_0[k_\rho \rho] = \frac{2}{k_\rho \rho} J_1[k_\rho \rho] - J_2[k_\rho \rho] \qquad (V.14)$$

Substitution of Eq. (V.10) into Eq. (V.14) is $$-2\pi \int_0^\infty \frac{\rho^3}{[\rho^2 + z^2]^{5/2}} J_0[k_\rho \rho] d\rho = \qquad (V.15)$$

$$-2\pi \int_0^\infty \frac{\rho^3}{[\rho^2 + z^2]^{5/2}} \left[\frac{2}{k_\rho \rho} J_1[k_\rho \rho] - J_2[k_\rho \rho]\right] d\rho =$$

$$-2\pi \int_0^\infty \frac{2\rho^2}{k_\rho[\rho^2 + z^2]^{5/2}} J_1[k_\rho \rho] d\rho +$$

$$2\pi \int_0^\infty \frac{\rho^3}{[\rho^2 + z^2]^{5/2}} J_2[k_\rho \rho] d\rho$$

The first factor of the right hand side of Eq. (V.15) is the same form as Eq. (V.6) with ν=1; u=3/2, thus, $$-2\pi \int_0^\infty \frac{2\rho^2}{k_\rho[\rho^2 + z^2]^{5/2}} J_1[k_\rho \rho] d\rho = \frac{-(4\pi)k_\rho^{3/2} z^{-1/2}}{k_\rho 2^{3/2} \Gamma[5/2]} K_{-1/2}[k_\rho z] \qquad (V.16)$$

$$= -\frac{[2^{1/2}]\pi z^{-1/2} k_\rho^{1/2}}{\Gamma[5/2]} K_{1/2}[k_\rho z]$$

where $K_{-1/2}[k_\rho z] = K_{1/2}[k_\rho z]$ (Eq.(V.7)). The second factor of the right hand side of Eq. (V.15) is the same form as Eq. (V.6) with ν=2; u=3/2, thus, $$2\pi \int_0^\infty \frac{\rho^3}{[\rho^2 + z^2]^{5/2}} J_2[k_\rho \rho] d\rho = \frac{(2\pi)k_\rho^{3/2} z^{1/2}}{2^{3/2} \Gamma[5/2]} K_{1/2}[k_\rho z] \qquad (V.17)$$

$$= \frac{\pi z^{1/2} k_\rho^{3/2}}{[2^{1/2}]\Gamma[5/2]} K_{1/2}[k_\rho z]$$

Combining the parts of the integration with respect to dρ of Eq. (V.4) by adding Eq. (V.8), Eq. (V.16), and Eq. (V.17) gives $$\int_{-\infty}^\infty \left[\frac{[2^{1/2}]\pi z^{1/2} k_\rho^{1/2}}{\Gamma[5/2]} K_{3/2}[k_\rho z] - \right. \qquad (V.18)$$

$$\left. \frac{[2^{1/2}]\pi z^{1/2} k_\rho^{1/2}}{\Gamma[5/2]} K_{1/2}[k_\rho z] + \frac{\pi z^{1/2} k_\rho^{3/2}}{[2^{1/2}]\Gamma[5/2]} K_{1/2}[k_\rho z]\right] e^{-jk_z z} dz$$

The modified Bessel function of the third kind formulae is $$K_{n+1/2}[x] = \left[\frac{\pi}{2x}\right]^{1/2} e^{-x} \sum_{m=0}^n [2x]^{-m} \frac{\Gamma[n+m+1]}{m!\Gamma[n+1-m]} \qquad (V.19)$$

Substitution of Eq. (V.13) into Eq. (V.19) with ν=1 is $$K_{3/2}[k_\rho z] = \left[\frac{\pi}{2k_\rho z}\right]^{1/2} e^{-k_\rho z}\left[1 + \frac{1}{2k_\rho z}\Gamma[3]\right] \qquad (V.20)$$

Substitution of Eq. (V.13) into Eq. (V.19) with ν=0 is $$K_{1/2}[k_\rho z] = \left[\frac{\pi}{2k_\rho z}\right]^{1/2} e^{-k_\rho z} \qquad (V.21)$$

Substitution of Eq. (V.20) and Eq. (V.21) into Eq. (V.18) is $$\int_{-\infty}^\infty \left\{\left[\frac{(2^{1/2})\pi z^{1/2} k_\rho^{3/2}}{\Gamma[5/2]}\left[1 + \frac{1}{2k_\rho z}\Gamma[3]\right] - \right.\right. \qquad (V.22)$$

$$\left.\left.\frac{(2^{1/2})\pi z^{1/2} k_\rho^{1/2}}{\Gamma[5/2]} + \frac{\pi z^{1/2} k_\rho^{3/2}}{(2^{1/2})\Gamma[5/2]}\right]\left[\frac{\pi}{2k_\rho z}\right]^{1/2} e^{-k_\rho z}\right\} e^{-jk_z z} dz$$

$$\int_{-\infty}^\infty \left\{\frac{\pi^{3/2}}{\Gamma[5/2]} k_\rho e^{-[jk_z + k_\rho]z} + \frac{z^{-1}\pi^{3/2}\Gamma[3]}{\Gamma[5/2]2} e^{-[jk_z + k_\rho]z} - \right. \qquad (V.23)$$

$$\left. \frac{z^{-1}\pi^{3/2}}{\Gamma[5/2]} e^{-[jk_z + k_\rho]z} + \frac{\pi^{3/2}}{\Gamma[5/2]2} k_\rho e^{-[jk_z + k_\rho]z}\right\} dz$$

Collecting terms gives $$\int_{-\infty}^\infty \frac{\pi^{3/2}}{\Gamma[5/2]}\left\{k_\rho[1 + 1/2] + \left[\frac{\Gamma[3]}{2} - 1\right]z^{-1}\right\} e^{-[jk_z + k_\rho]z} dz \qquad (V.24)$$

With $\Gamma[3]=2$ and $\Gamma[5/2]=3/4\pi^{1/2}$, Eq. (V.24) is $$\int_{-\infty}^\infty \frac{\pi^{3/2}}{\Gamma[5/2]}\{k_\rho[3/2] + [1-1]z^{-1}\} e^{-k_\rho z} e^{-jk_z z} dz \qquad (V.25)$$

$$\int_{-\infty}^\infty \frac{\pi^{3/2}}{3/4\pi^{1/2}} 3/2 k_\rho e^{-k_\rho z} e^{-jk_z z} dz \qquad (V.26)$$

$$2\pi k_\rho \int_{-\infty}^\infty e^{-k_\rho z} e^{-jk_z z} dz \qquad (V.27)$$

$$4\pi k_\rho \int_0^\infty e^{-k_\rho z} e^{-jk_z z} dz \qquad (V.28)$$

$$4\pi k_\rho \int_0^\infty e^{-[jk_z + k_\rho]z} dz \qquad (V.29)$$

Integration of Eq. (V.29) with respect to dz gives $$4\pi k_\rho \left\{\frac{-1}{jk_z + k_\rho} e^{-[jk_z + k_\rho]z}\bigg|_0^\infty\right\} \qquad (V.30)$$

$$4\pi k_\rho \left[\frac{1}{jk_z + k_\rho}\right] \qquad (V.31)$$

Multiplication of Eq. (V.31) by $$1 = \left[\frac{-jk_z + k_\rho}{-jk_z + k_\rho}\right] \qquad (V.32)$$

gives $$4\pi k_\rho \left[\frac{-jk_z + k_\rho}{k_z^2 + k_\rho^2}\right] \qquad (V.33)$$

The system function (Eq. (V.1)) is an even function; thus, the spacetime Fourier transform in three dimensions in cylindrical coordinates, $H(k_\rho, k_z)$, is given by taking the real part of Eq. (V.33) [8].

$$H[k_\rho, k_z] = \frac{4\pi k_\rho^2}{k_z^2 + k_\rho^2} \quad (V.34)$$

The spacetime Fourier transform in three dimensions in Cartesian coordinates, $H(k_\rho, k_z)$, is $$H[k_x, k_y, k_z] = \frac{4\pi[k_x^2 + k_y^2]}{[k_x^2 + k_y^2 + k_z^2]} \quad (V.35)$$

where the relationship between the wavenumbers and the spatial Cartesian coordinates is as follows:

$$k_x = \frac{2\pi}{\lambda_x} = \frac{2\pi}{x} \quad (V.36)$$

$$k_y = \frac{2\pi}{\lambda_y} = \frac{2\pi}{y} \quad (V.37)$$

$$k_z = \frac{2\pi}{\lambda_z} = \frac{2\pi}{z} \quad (V.38)$$

APPENDIX VI

Derivation of $S = HF\hat{x}U(k_z)$ from Eq. (44).

$$S = HF \otimes U[k_z] = \frac{2\pi k_\rho^2}{k_\rho^2 + k_z^2} \sum_{z_n=0}^{-l_3} \sum_{y_n=-l_2/2}^{+l_2/2} \sum_{x_n=-l_1/2}^{+l_1/2} \chi_{n_1, n_2, n_3} \quad (VI.1)$$

$$e^{-j[k_x x_n + k_y y_n + k_z z_n]} + \frac{1}{jk_z} \otimes \frac{4\pi k_\rho^2}{k_\rho^2 + k_z^2} \sum_{z_n=0}^{-l_y} \sum_{y_n=-l_2/2}^{+l_2/2} \sum_{x_n=-l_1/2}^{+l_1/2} \chi_{n_1, n_2, n_3}$$

$$e^{-j[k_x x_n + k_y y_n + k_z z_n]}$$

where the Fourier transform of $u(z)=1$ for $z \geq 0$ and $u(z)=1$ for $z<0$ [8] is $$U(k_z) = \frac{1}{2}\delta(k_z) + \frac{1}{jk_z} \quad (VI.2)$$

and where H is given by Eq. (41) and F is given by Eq. (38). The convolution integral of the second term of Eq. (VI.1) is $$S = \frac{1}{2}HF + \sum_{z_n=0}^{-l_3} \sum_{y_n=-l_2/2}^{+l_2/2} \sum_{x_n=-l_1/2}^{+l_1/2} \frac{4\pi k_\rho^2}{j} \quad (VI.3)$$

$$e^{-j[k_x x_n + k_y y_n]} \int_{-\infty}^{\infty} \frac{\chi_{n_1, n_2, n_3} \, e^{-j[k_z - \kappa_z]z_n}}{\kappa_z[k_\rho^2 + [k_z - \kappa_z]^2]} d\kappa_z$$

Collecting exponential terms gives $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1, n_2, n_3} \quad (VI.4)$$

$$e^{-j[k_x x_n + k_y y_n + k_z z_n]} \frac{4\pi k_\rho^2}{j} \int_{-\infty}^{\infty} \frac{e^{+j\kappa_z z_n}}{\kappa_z[k_\rho^2 + [k_z - \kappa_z]^2]} d\kappa_z$$

Expansion of the denominator of the second term gives $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1, n_2, n_3} \quad (VI.5)$$

$$e^{-j[k_x x_n + k_y y_n + k_z z_n]} \frac{4\pi k_\rho^2}{j} \int_{-\infty}^{\infty} \frac{e^{+j\kappa_z z_n}}{\kappa_z[\kappa_z^2 - 2k_z\kappa_z + k_\rho^2 + k_z^2]} d\kappa_z$$

The factorization of the denominator of the second term, $\kappa_z^2 - 2k_z\kappa_z + k_\rho^2 + k_z^2$, using the quadratic formula is $$\frac{2k_z \pm [4k_z^2 - 4[k_\rho^2 + k_z^2]]^{\frac{1}{2}}}{2} = \frac{2k_z \pm [4k_z^2 - 4k_\rho^2 - 4k_z^2]^{\frac{1}{2}}}{2} \quad (VI.6)$$

Substitution of Eq. (VI.6) into Eq. (VI.5) is $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1, n_2, n_3} \quad (VI.7)$$

$$e^{-j[k_x x_n + k_y y_n + k_z z_n]} \frac{4\pi k_\rho^2}{j} \int_{-\infty}^{\infty} \frac{e^{+j\kappa_z z_n}}{\kappa_z[\kappa_z - k_z + jk_\rho][\kappa_z - k_z - jk_\rho]} d\kappa_z$$

The expansion of Eq. (VI.7) by the method of partial fractions is $$S = \frac{1}{2}HF + \sum_{z_n=0}^{-l_3} \sum_{y_n=-l_2/2}^{+l_2/2} \sum_{x_n=-l_1/2}^{+l_1/2} \chi_{n_1, n_2, n_3} \, e^{-j[k_x x_n + k_y y_n + k_z z_n]} \quad (VI.8)$$

$$\frac{4\pi k_\rho^2}{j} \int_{-\infty}^{\infty} e^{+j\kappa_z z_n} \left[\frac{A}{\kappa_z} + \frac{B}{\kappa_z - k_z + jk_\rho} + \frac{C}{\kappa_z - k_z - jk_\rho}\right] d\kappa_z$$

The factors A, B, C of Eq. (VI.8) are determined as follows:

$$A[\kappa_z^2 - 2k_z\kappa_z + k_\rho^2 + k_z^2] + B[\kappa_z][\kappa_z - k_z - jk_\rho] + C[\kappa_z][\kappa_z - k_z + jk_\rho] = 1 \quad (VI.9)$$

Let $\kappa_z = 0$. Then, Eq. (VI.9) gives $$A[k_\rho^2 + k^{z2}] = 1 \quad (VI.10)$$

Thus, $$A = \frac{1}{[k_\rho^2 + k_z^2]} \quad (VI.11)$$

Let $\kappa_z = k_z + jk_\rho$. Then Eq. (VI.9) is $$A[[k_z+jk_\rho]^2 - 2k_z[k_z+jk_\rho] + k_\rho^2 + k_z^2] + B[k_z+jk_\rho][k_z+jk_\rho - k_z - jk_\rho] + C[k_z+jk_\rho][k_z+jk_\rho - k_z+jk_\rho] = 1 \quad (VI.12)$$

The term in B vanishes. Substitution of Eq. (VI.11) into Eq. (VI.12) gives $$\frac{1}{[k_\rho^2 + k_z^2]}[k_z^2 + 2jk_zk_\rho - k_\rho^2 - 2k_z^2 - 2jk_zk_\rho + k_\rho^2 + k_z^2] + \quad (VI.13)$$

$$C[2jk_zk_\rho - 2k_\rho^2] = 1$$

where the term in A also vanishes. Solving for C gives $$C = \frac{1}{[-2k_\rho^2 + 2jk_zk_\rho]} \quad (VI.14)$$

Let $\kappa_z = k_z - jk_\rho$. Then, Eq. (VI.9) is $$A[[k_z-jk_\rho]^2 - 2k_z[k_z-jk_\rho] + k_\rho^2 + k_z^2] + B[k_z-jk_\rho][k_z-jk_\rho - k_z-jk_\rho] + C[k_z-jk_\rho][k_z-jk_\rho - k_z+jk_\rho] = 1 \quad (VI.15)$$

The term in C vanishes. Substitution of Eq. (VI.11) into Eq. (VI.15) gives $$\frac{1}{[k_\rho^2 + k_z^2]}[k_z^2 - 2jk_zk_\rho - k_\rho^2 - 2k_z^2 + 2jk_zk_\rho + k_\rho^2 + k_z^2] + \quad (VI.16)$$

$$B[-2jk_zk_\rho - 2k_\rho^2] = 1$$

where the term in A also vanishes. Solving for B gives $$B = \frac{1}{[-2k_\rho^2 - 2jk_zk_\rho]} \quad (VI.17)$$

Substitution of A, B, and C into the convolution integral (Eq. (VI.8)) gives:

$$S = \frac{1}{2}HF + \sum_{z_n=0}^{-l_1} \sum_{y_n=-l_2/2}^{+l_2/2} \sum_{x_n=-l_1/2}^{+l_1/2} \chi_{n_1,n_2,n_3} e^{-j[k_xx_n+k_yy_n+k_zz_n]} \quad (VI.18)$$

$$\left\{ \frac{4\pi k_\rho^2}{j} \int_{-\infty}^{\infty} \frac{e^{+j\kappa_z z_n}}{\kappa_z[k_\rho^2+k_z^2]} d\kappa_z + \right.$$

$$\frac{4\pi k_\rho^2}{j} \int_{-\infty}^{\infty} \frac{e^{+j\kappa_z z_n}}{[\kappa_z-k_z+jk_\rho][-2k_\rho^2 - 2jk_zk_\rho]} d\kappa_z +$$

$$\left. \frac{4\pi k_\rho^2}{j} \int_{-\infty}^{\infty} \frac{e^{+j\kappa_z z_n}}{[\kappa_z-k_z-jk_\rho][-2k_\rho^2 + 2jk_zk_\rho]} d\kappa_z \right\}$$

The first convolution integral is of the form given by Mc Seibert [8].

$$\frac{2}{jk_z} \Leftrightarrow sgnz_n; \quad sgnz_n = -1 \quad \text{where} \quad z_n < 0 \quad (VI.19)$$

Thus, $$\frac{4\pi k_\rho^2}{[k_\rho^2+k_z^2]} \int_{-\infty}^{\infty} \frac{e^{+j\kappa_z z_n}}{jk_z} d\kappa_z = -\frac{2\pi k_\rho^2}{[k_\rho^2+k_z^2]} \quad \text{where} \quad z_n < 0 \quad (VI.20)$$

A change of variable in the second convolution integral given by letting $$\kappa_z = -k_z - jk_\rho; \quad d\kappa_z = -dk_z \quad (VI.21)$$

in $$\frac{4\pi k_\rho^2}{[-2k_\rho^2 - 2jk_zk_\rho]} \int_{-\infty}^{\infty} \frac{e^{+j\kappa_z z_n}}{j[\kappa_z - k_z + jk_\rho]} d\kappa_z \quad (VI.22)$$

is $$\frac{4\pi k_\rho^2}{[-2k_\rho^2 - 2jk_zk_\rho]} \int_{-\infty}^{\infty} \frac{e^{+j[-k_z-jk_\rho]z_n}}{j[-2k_z]}[-dk_z] \quad \text{where} \quad z_n < 0 \quad (VI.23)$$

$$= \frac{2\pi k_\rho^2 e^{-k_\rho|z_n|}}{[-2k_\rho^2 - 2jk_zk_\rho]} \int_{-\infty}^{\infty} \frac{2e^{+jk_zz_n|}}{2jk_z} dk_z \quad (VI.24)$$

$$= \frac{\pi k_\rho^2}{2[k_\rho^2 + jk_zk_\rho]} e^{-k_\rho|z_n|} \quad \text{where} \quad z_n < 0 \quad (VI.25)$$

A change of variable in the third convolution integral given by letting $$\kappa_z = -k_z + jk_\rho; \quad d\kappa_z = -dk_z \quad (VI.26)$$

in $$\frac{2\pi k_\rho^2}{[-2k_\rho^2 + 2jk_zk_\rho]} \int_{-\infty}^{\infty} \frac{2e^{+j\kappa_z z_n}}{j[\kappa_z - k_z - jk_\rho]} d\kappa_z \quad (VI.27)$$

is $$\frac{2\pi k_\rho^2}{[-2k_\rho^2 + 2jk_zk_\rho]} \int_{-\infty}^{\infty} \frac{2e^{+j[-k_z+jk_\rho]z_n}}{j[-2k_z]}[-dk_z] \quad \text{where} \quad z_n < 0 \quad (VI.28)$$

$$\frac{2\pi k_\rho^2 e^{+k_\rho|z_n|}}{[-2k_\rho^2 + 2jk_zk_\rho]} \int_{-\infty}^{\infty} \frac{2e^{+jk_zz_n|}}{2jk_z} dk_z \quad (VI.29)$$

$$= \frac{\pi k_\rho^2}{2[k_\rho^2 - jk_zk_\rho]} e^{+k_\rho|z_n|} \quad \text{where} \quad z_n < 0 \quad (VI.30)$$

Combining Eqs. (VI.20), (VI.25), and (VI.30) gives the convolution of Eq. (VI.1).

$$S = \frac{1}{2}HF + \quad (VI.31)$$

$$\sum_{z_n=0}^{-l_3} \sum_{y_n=-l_2/2}^{+l_2/2} \sum_{x_n=-l_1/2}^{+l_1/2} \chi_{n_1,n_2,n_3} e^{-j[k_xx_n+k_yy_n+k_zz_n]} \left[\frac{-2\pi k_\rho^2}{k_\rho^2+k_z^2}\right] +$$

$$\sum_{z_n=0}^{-l_1} \sum_{y_n=-l_2/2}^{+l_2/2} \sum_{x_n=-l_1/2k}^{+l_1/2} \chi_{n_1,n_2,n_3} e^{-j[k_xx_n+k_yy_n+k_zz_n]}$$

$$\left\{\frac{\pi k_\rho^2}{2[k_\rho^2 + jk_\rho k_z]} e^{-k_\rho|z_n|} + \frac{\pi k_\rho^2}{2[k_\rho^2 - jk_zk_\rho]} e^{+k_\rho|z_n|}\right\}$$

APPENDIX VII

Derivation of the Inverse Transform of Eq. (57) to Give Inverse Transform 1, Eq. (58)

$$F^{-1}\left\{\frac{1}{8}\sum_{z_n=0}^{-l_3} \sum_{y_n=-l_2/2}^{+l_2/2} \sum_{x_n=-l_1/2}^{+l_1/2} \chi_{n_1 n_2 n_3} e^{-j[k_xx_n+k_yy_n+k_zz_n]} \quad (VII.1)\right.$$

$$\left.\left[e^{-k_\rho|z_n|} + e^{+k_\rho|z_n|} + j\frac{k_z}{k_\rho}[e^{+k_\rho|z_n|} - e^{-k_\rho|z_n|}]\right]\right\} =$$

-continued $$\frac{1}{8}\sum_{z_n}\sum_{y_n}\sum_{x_n} X_{n_1 n_2 n_3}\delta[x-x_n, y-y_n, z-z_n]$$

$$\left\{2\pi\int_{-\infty}^{\infty}\int_0^{\infty} e^{-k_\rho|z_n|}J_o[k_\rho\rho]k_\rho dk_\rho e^{jk_z z}dk_z + \right.$$

$$2\pi\int_{-\infty}^{\infty}\int_0^{\infty} e^{+k_\rho|z_n|}J_o[k_\rho\rho]k_\rho dk_\rho e^{jk_z z}dk_z +$$

$$j2\pi\int_{-\infty}^{\infty}\int_0^{\infty} e^{+k_\rho|z_n|}J_o[k_\rho\rho]dk_\rho k_z e^{jk_z z}dk_z -$$

$$\left. j2\pi\int_{-\infty}^{\infty}\int_0^{\infty} e^{-k_\rho|z_n|}J_o[k_\rho\rho]dk_\rho k_z e^{jk_z z}dk_z\right\}$$

where $$z_n < 0 \tag{VII.2}$$

Consider the definite integral:

$$\int_0^\infty e^{-\alpha t}J_\nu[bt]t^{\nu+1}\,dt = \frac{2a[2b]^\nu\Gamma[\nu+3/2]}{[a^2+b^2]^{\nu+3/2}\pi^{1/2}};\quad \alpha>0 \tag{VII.3}$$

In the case of the first integral of Eq. (VII.2), the parameters of Eq. (VII.3) are $\nu=0$ $t=k_\rho$ $b=\rho$ $a=|z_n|$ (VII.4)

Thus, $$\int_0^\infty e^{-k_\rho|z_n|}J_o[k_\rho\rho]k_\rho dk_\rho = \frac{|z_n|}{[z_n^2+\rho^2]^{3/2}} \tag{VII.5}$$

where $$\frac{2|z_n|\Gamma[3/2]}{\pi^{1/2}[z_n^2+\rho^2]^{3/2}} = \frac{|z_n|}{[z_n^2+\rho^2]^{3/2}} \tag{VII.6}$$

Consider the following relationship of the modified Bessel function of the third kind:

$$\pi J_\nu[z] = e^{+j\frac{\pi}{2}[\nu+1]}K_\nu\!\left[ze^{+j\frac{\pi}{2}}\right] + e^{-j\frac{\pi}{2}[\nu+1]}K_\nu\!\left[ze^{-j\frac{\pi}{2}}\right] \tag{VII.7}$$

In the case that $\nu=0$, Eq. (VII.7) is $$\pi J_o[k_\rho\rho] = jK_o[jk_\rho\rho] - jK_o[-jk_\rho\rho] \tag{VII.8}$$

Thus, $$\int_0^\infty e^{+k_\rho|z_n|}J_o[k_\rho\rho]dk_\rho = \int_0^\infty \frac{e^{+k_\rho|z_n|}}{\pi}[jK_o[jk_\rho\rho] - jK_o[-jk_\rho\rho]]dk_\rho \tag{VII.9}$$

$$= \int_0^\infty j\frac{e^{+k_\rho|z_n|}}{\pi}K_o[jk_\rho\rho]dk_\rho - \frac{j}{\pi}\int_0^\infty e^{+k_\rho|z_n|}K_o[-jk_\rho\rho]dk_\rho \tag{VII.10}$$

With a change of variable as follows:

First Integral:    Second Integral: (VII.11)

$k_\rho = jk_\rho \quad\quad k_\rho = -jk_\rho$ $dk_\rho = jdk_\rho \quad\quad dk_\rho = -jdk_\rho$ and an expansion of the complex exponential factor, Eq. (VII.10) becomes $$\frac{-1}{\pi}\int_0^\infty e^{+jk_\rho|z_n|}K_o[k_\rho\rho]dk_\rho - \frac{1}{\pi}\int_0^\infty e^{-jk_\rho|z_n|}K_o[k_\rho\rho]dk_\rho = \tag{VII.12}$$

$$\frac{-1}{\pi}\int_0^\infty [\cos k_\rho z_n] + j\sin[k_\rho z_n] + \cos[k_\rho z_n] - j\sin[k_\rho z_n]]$$

$$K_o[k_\rho\rho]dk_\rho = \int_0^\infty \frac{-2\rho^{1/2}}{\pi\rho^{1/2}}\cos[k_\rho z_n]K_o[k_\rho\rho]dk_\rho$$

The transform is given by Bateman [12].

$$\int_0^\infty \frac{-2\rho^{1/2}}{\pi\rho^{1/2}}\cos[k_\rho z_n]K_o[k_\rho\rho]dk_\rho = \frac{-2\rho^{1/2}\pi}{2\pi\rho^{1/2}[z_n^2+\rho^2]^{1/2}} \tag{VII.13}$$

$$= \frac{-1}{[z_n^2+\rho^2]^{1/2}}$$

Thus, $$\int_0^\infty e^{k_\rho|z_n|}J_o[k_\rho\rho]dk_\rho = \frac{-1}{[z_n^2+\rho^2]^{1/2}} \tag{VII.14}$$

The Fourier transform relationship between a function f[x] and its Fourier transform g[y] given by McC. Siebert [8] is $$xf[x] \Leftrightarrow -\frac{1}{j}\frac{d}{dk}g[k] \tag{VII.15}$$

Consider the following Inverse Fourier transform integral from Eq. (VII.2)

$$\int_0^\infty k_\rho e^{k_\rho|z_n|}J_o[k_\rho\rho]dk_\rho \tag{VII.16}$$

Eq. (VII.16) is equivalent to the following Inverse Fourier transform $$k_\rho F^{-1}\{J_o[k_\rho\rho]\} \tag{VII.17}$$

From Eq. (VII.15) with $$g[y] = \frac{-1}{[z_n^2+\rho^2]^{1/2}} \tag{VII.18}$$

Eq. (VII.16) is $$\int_0^\infty k_\rho e^{k_\rho[z_n]} J_0[k_\rho \rho] dk_\rho = \frac{1}{-j} \frac{d}{dz_n}\left[\frac{-1}{[z_n^2+\rho^2]^{1/2}}\right] \quad (VII.19)$$

$$= j\frac{z_n}{[z_n^2+\rho^2]^{3/2}}$$

Taking the imaginary part because Eq. (VII.19) has odd symmetry gives $$\int_0^\infty k_\rho e^{k_\rho|z_n|} J_0[k_\rho \rho] dk_\rho = \frac{-|z_n|}{[z_n^2+\rho^2]^{3/2}}; z_n < 0 \quad (VII.20)$$

In the case of the third and fourth terms of Eq. (VII.2), consider the following Fourier transform given by Gray [13]:

$$\int_0^\infty e^{-ax} J_0[bx] dx = \frac{1}{[a^2+b^2]^{1/2}} \quad (VII.21)$$

Thus, $$\int_0^\infty e^{-k_\rho z_n} J_0[k_\rho \rho] dk_\rho = \frac{1}{[z_n^2+\rho^2]^{1/2}}; z_n > 0 \quad (VII.22)$$

The Inverse Fourier transform with respect to $k_z$ is given by McC. Siebert [8]. In the case of the first two terms of Eq. (VII.2), $$\int_{-\infty}^\infty e^{+jk_z z} dk_z = \delta[z] \quad (VII.23)$$

In the case of the third and fourth terms of Eq. (VII.2), $$\int_{-\infty}^\infty jk_z e^{+jk_z z} dk_z = \overset{*}{\delta}[z] \quad (VII.24)$$

Combining transforms from Eqs. (VII.6), (VII.20), and (VII.23) in the case of the first and second terms of Eq. (VII.2) and combining transforms from Eqs. (VII.14) (VII.22) and (VII.24) in the case of the third and fourth terms of Eq. (VII.2) gives:

$$F^{-1}\left\{\frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3}\right. \quad (VII.25)$$

$$\left. e^{-j[k_x x_n+k_y y_n+k_z z_n]}\left[e^{-k_\rho|z_n|} + e^{+k_\rho|z_n|} + j\frac{k_z}{k_\rho}[e^{+k_\rho|z_n|}]\right]\right\} =$$

$$F^{-1}\left\{\frac{1}{8}\sum_{z_n=0}^{-l_y}\sum_{y_n=-l_2/2}^{+l_2/2}\sum_{x_n=-l_1/2}^{+l_1/2} \chi_{n_1,n_2,n_3} e^{-j[k_x x_n+k_y y_n+k_z z_n]}\right\} \otimes$$

$$\left\{2\pi\delta[z]\left[\frac{|z_n|}{[z_n^2+\rho^2]^{3/2}} - \frac{|z_n|}{[z_n^2+\rho^2]^{3/2}}\right] + 2\pi\overset{*}{\delta}[z]\left[\frac{-1}{[z_n^2+\rho^2]^{1/2}} - \frac{1}{[z_n^2+\rho^2]^{1/2}}\right]\right\}$$

where $z_n < 0$

Substitution of Eq. (37) into Eq. (VII.25) gives $$F^{-1}\left\{\frac{1}{8}\sum_{z_n=0}^{-l_3}\sum_{y_n=-l_2/2}^{+l_2/2}\sum_{x_n=-l_1/2}^{+l_1/2} \chi_{n_1,n_2,n_3} e^{-j[k_x x_n+k_y y_n+k_z z_n]}\right. \quad (VII.26)$$

$$\left. \left[e^{-k_\rho|z_n|} + e^{+k_\rho|z_n|} + j\frac{k_z}{k_\rho}[e^{+k_\rho|z_n|} - e^{-k_\rho|z_n|}]\right]\right\} =$$

$$\frac{1}{8}\sum_{n_3=0}^{+l_3/k}\sum_{n_2=-l_2/2k}^{+l_2/2k}\sum_{n_1=-l_1/2k}^{+l_1/2k} \chi_{n_1,n_2,n_3} \delta[x-n_1 k, y-n_2 k, z-n_3 k] \otimes$$

$$\left[2\pi\delta[z]\left[\frac{|z_n|}{([z_n^2+\rho^2])^{3/2}} - \frac{|z_n|}{([z_n^2+\rho^2])^{3/2}}\right] +\right.$$

$$\left. 2\pi\overset{*}{\delta}[z]\left[\frac{-1}{([z_n^2+\rho^2])^{1/2}} - \frac{1}{([z_n^2+\rho^2])^{1/2}}\right]\right] \text{ where } z_n < 0$$

Taking the derivative given by the doublet function gives $$F^{-1}\left\{\frac{1}{8}\sum_{z_n=0}^{-l_3}\sum_{y_n=-l_2/2}^{+l_2/2}\sum_{x_n=-l_1/2}^{+l_1/2}\chi_{n_1,n_2,n_3}e^{-j[k_xx_n+k_yy_n+k_zz_n]}\right.$$

$$\left.\left[e^{-k_\rho|z_n|}+e^{+k_\rho|z_n|}+j\frac{k_z}{k_\rho}[e^{+k_\rho|z_n|}-e^{-k_\rho|z_n|}]\right]\right\}=$$

$$\frac{\pi}{2}\sum_{n_3=0}^{+l_3/k}\sum_{n_2=-l_2/2k}^{+l_2/2k}\sum_{n_1=-l_1/2k}^{+l_1/2k}\chi_{n_1,n_2,n_3}$$

$$\delta[x-n_1k,\,y-n_2k,\,z-n_3k]\otimes\left[\delta[z]\frac{z_n}{([z_n^2+\rho^2])^{3/2}}\right]$$

Inverse Transform 1

(VII.27)

REFERENCES

The following citations are incorporated by reference.
1. Mills, R., Magnetic Susceptibility Imaging (MSI), U.S. Pat. No. 5,073,858 (1991).
2. Reynolds, G. O., DeVelis, J. B., Parrent, G. B., Thompson, B. J., *The New Physical Optics Notebook,* SPIE Optical Engineering Press, (1990).
3. Patz, S., Cardiovasc Interven Radiol, (1986), 8:25, pp. 225–237.
4. Jackson, J. D., *Classical Electrodynamics,* Second Edition, John Wiley & Sons, New York, (1962), pp. 391–394.
5. Ogawa, S., Lee, T, Nayak, A. S., Glynn, P., Magnetic Resonance in Medicine, Vol. 14, (1990), pp. 68–78.
6. Sarwinski, R. E., "Superconducting Instruments", Cryogenics, December 1977, pp. 671–679.
7. Hounsfield, G. N., U.S. Pat. No. 4,322,684, Mar. 30, 1982.
8. Siebert, W., McC., *Circuits, Signals, and Systems,* The MIT Press, Cambridge, Mass., (1986), p. 399.2. Siebert, W., McC., *Circuits, Signals, and Systems,* The MIT Press, Cambridge, Mass., (1986), pp. 415–416.
9. Bracewell, R. N., *The Fourier Transform and Its Applications,* McGraw-Hill Book Company, New York, (1978), pp. 252–253.
10. Siebert, W., McC., *Circuits, Signals, and Systems,* The MIT Press, Cambridge, Mass., (1986), p. 574.
11. Siebert, W., McC., *Circuits, Signals, and Systems,* The MIT Press, Cambridge, Mass., (1986), pp. 435–439
12. Bateman, H., *Tables of Integral Transforms,* Vol. III, McGraw-Hill, New York, (1954), p. 149.
13. Gray, A., Mathews, G. B., A Treatise on Bessel Functions and Their Applications to Physics, MacMillian and Co., Limited, London, (1952), p. p. 65.

What is claimed is:

1. A system for providing a multi-dimensional magnetic susceptibility image of a body, comprising:
   a first radiation source for applying a first radiation field having a magnetic field component to magnetize the body,
   a first detector for measuring said magnetic field in a volume to be occupied by the body,
   means for applying an electromagnetic second radiation field to the body when disposed in the magnetic field to produce a third radiation field emanating from the body,
   a second detector producing output signals in response to said third radiation field, and
   a processor coupled to said second detector for receiving said output signals to produce a multi-dimensional magnetic susceptibility image of the body.
2. The system of claim 1, wherein said first radiation source comprises a magnet for producing a DC magnetic field.
3. The system of claim 2, wherein said magnet comprises a superconducting magnet.
4. The system of claim 1, wherein said first detector comprises a magnetometer.
5. The system of claim 1, wherein said means for applying a second radiation field comprises an RF generator.
6. The system of claim 1, further comprising an analog to digital converter coupled to said second detector for digitizing said output signals.
7. The system of claim 1, wherein said electromagnetic second radiation field polarizes nuclei having non-zero spin in the body, said polarized nuclei precessing to produce said third radiation field.
8. The system of claim 1, wherein said processor includes a Fourier transform stage for obtaining Fourier spectra of said output signals of said second detector.
9. The system of claim 1, further comprising a plurality of detectors for detecting said third radiation field, said plurality of detectors being disposed in a plane with respect to each other and with respect to said second detector, said plurality of detectors being configured to move in a direction perpendicular to the plane to sample said third radiation field over a three-dimensional volume external to the body.
10. The system of claim 1, further comprising a plurality of detectors forming a three-dimensional array to sample said third radiation field over a three-dimensional volume external to the body.
11. The system of claim 9, wherein said processor comprises a Fourier transform stage for obtaining frequencies and intensities of Fourier components of said sampled third radiation, said frequency components indicating the magnetic susceptibility corresponding to voxels of the body and said intensity components indicating positions of said voxels.
12. The system of claim 1, wherein the means for applying includes means for applying an electromagnetic second radiation field to the body when disposed in the magnetic field to produce a third radiation field emanating from a voxel in the body that approximates a dipole near field having a maximum amplitude given by the following formula:

$$B^1 = m_z 2z^2 - x^2 - y^2/(x^2+y^2+z^2)^{5/2}$$

wherein x,y, and z are Cartesian coordinates, and $m_z$ is a bulk magnetization of the voxel along the z-coordinate, and $B^1$ is the maximum amplitude of the near field.
13. The system of claim 1, wherein said processor includes a Fourier transform processor for obtaining Larmor frequencies corresponding to voxels of the body from which said third radiation field emanates.
14. The system of claim 13, wherein said display element generates said anatomical images based on selected physiological parameters, said anatomical images being substantially free of motion artifacts.
15. The system of claim 1, further comprising a display element for generating an anatomical image of the body from the multi-dimensional susceptibility image.
16. System for providing a multi-dimensional image representation of spatial variations of magnetic susceptibility of a body including a paramagnetic or a diamagnetic substance, comprising:

a first generator for generating an excitation field in the body to polarize paramagnetic or diamagnetic substances within the body such that said polarization creates a local magnetic field in voxels of the body according to the magnetic susceptibility of each voxel, a second generator for generating a primary electromagnetic radiation field in the body to induce a secondary radiation field to emanate from the body, each voxel of the body contributing to said secondary radiation field at a frequency determined by the magnetic susceptibility of said voxel, a detector positioned to receive one of said fields for producing an output signal in response to said secondary radiation field, and a processor for receiving and processing the output signal of said detector to create the multi-dimensional image.

17. System for providing a multi-dimensional image representation of spatial variations of magnetic susceptibility of a body having at least one type of nuclei with non-zero spin, and a paramagnetic or a diamagnetic substance, comprising:

a first generator for generating an excitation field in the body to polarize the paramagnetic or the diamagnetic substances such that said polarization creates a local excitation field in the body, said local excitation field generating a shift in the Larmor frequency of nuclei in the body, a second generator for generating a primary radio frequency field in the body to create a transverse magnetization of the nuclei, a detector for producing output signals in response to detecting a component of a secondary radio frequency field generated by the polarized nuclei, and a reconstruction processor for receiving the output signals of said detector to create the multi-dimensional image.

18. System for generating a three-dimensional magnetic susceptibility map of a body, comprising:

means for producing a magnetic field for magnetizing the body;

means for measuring the magnetic field in a volume to be occupied by the body;

a radiation generator and a transmitter for producing a primary electromagnetic radiation field for causing the body to produce a secondary radiation field by excitation;

a three-dimensional or planar array of detectors movable in a direction perpendicular to the plane of the detectors for producing output signals by spatially sampling a selected component of said secondary radiation field over a three-dimensional volume at least at the Nyquist rate;

an analog to digital converter for digitizing said output signals;

a Fourier transform stage for converting the output signals of the detectors acquired over a period of time into frequency spectra; and a processor for converting the frequency spectra into a map of magnetic moments in the volume and for converting the magnetic moment map into a three-dimensional magnetic susceptibility map.

19. The system of claim 18, further comprising an image processor for displaying said magnetic susceptibility map, said processor being configured to display said map from any perspective as a two-dimensional or a three-dimensional image.

20. The system of claim 18, further comprising coils for providing a magnetic field gradient to alter intensity of the said secondary radiation field when said radiation generator provides $T_1$ and $T_2$ radio frequency pulse sequences.

21. The system of claim 18, wherein said radiation generator comprises a radio frequency generator providing a radio frequency field for causing precession of protons in said body for producing said secondary radiation field.

22. The system of claim 18, wherein said means for measuring the magnetic field comprises a magnetometer that employs NMR frequency of protons in water to detect magnitude of said magnetic field in the volume to be occupied by the body.

23. The system of claim 18, wherein the protons are substantially free of ferromagnetic influences.

24. The system of claim 18, wherein the radiation generator includes an amplifier for increasing magnitude of said primary field in portions of the body distal to said array of detectors.

25. The system of claim 18, wherein said means for producing a magnetic field produces a magnetic field varying as a quadratic function of distance from said detectors in a direction perpendicular to the plane of the detectors.

26. The system of claim 18, wherein said magnetic field has a component $B_z$ in a voxel along a Cartesian coordinate perpendicular to said array of detectors, said component $B_z$ being given by:

$$B_z = B_o[a^2+y^2_m]^{3/2}$$

where $a_0$ and $B_o$ are constants and $Y_n$ is the distance from the plane of the detectors to the voxel.

27. The system of claim 18, wherein said magnetic field is substantially constant.

28. The system of claim 18, wherein said magnetic field is substantially confined to a volume of the body to be imaged.

29. The system of claim 18, wherein said means for producing a magnetic field produces a magnetic field having a magnitude that varies within the body, said varying field providing a range of Larmor frequencies.

30. The system of claim 18, wherein said array of detectors comprises an array of antennae responsive to a selected component of said secondary radiation field.

31. A method for providing a multi-dimensional magnetic susceptibility image of a body, comprising the steps of measuring a magnetic field component in a volume to be occupied by the body, applying a first radiation field having the magnetic field component to the body to magnetize the body, applying an electromagnetic second radiation field to the body when disposed in the magnetic field to produce a third radiation field emanating from the body, detecting the third radiation field emanating from the body, and, producing the magnetic susceptibility image of the body from said detected third radiation field.

32. The method of claim 31, wherein the step of detecting comprises the step of positioning an array of detectors movable in a direction perpendicular to the body to sample said third radiation field over a three-dimensional volume.

33. The method of claim 32, wherein said step of producing the magnetic susceptibility image further comprises the steps of determining the frequency components of voxels of said third radiation field, determining the magnetic susceptibility of said voxels at each said frequency component, and obtaining the positions of said voxels by utilizing intensity variation of said frequency components over the sampled three-dimensional volume.

34. The method of claim 31, wherein said step of applying a first radiation field comprises the step of applying a DC magnetic field to the body.

35. The method of claim 31, wherein the step of applying an electromagnetic second radiation field comprises the step of applying an RF pulse to the body.

36. A method for providing a multi-dimensional image representation of the spatial variations of magnetic susceptibility of a body having a paramagnetic or a diamagnetic substance, comprising the steps of generating an excitation field in the body to polarize the paramagnetic or the diamagnetic substance to create local magnetic fields in voxels in the body according to the magnetic susceptibility of each voxel, generating an electromagnetic primary radiation field in the body to induce a secondary radiation field from the body, each voxel of the body contributing to said secondary radiation field at a frequency determined by the magnetic susceptibility of said voxel, generating an output signal in response to said secondary radiation field and indicative of said radiation field, and creating the multi-dimensional susceptibility image from said output signal.

37. A method for generating a three-dimensional magnetic susceptibility map of a body, comprising the steps of producing a magnetic field for magnetizing the body, measuring the magnetic field in a volume to be occupied by the body, producing an electromagnetic primary radiation field for causing the body to produce a secondary radiation field by excitation, disposing a three-dimensional or planar array of detectors external to said body, said three-dimensional or planar array of detectors being movable in a direction perpendicular to the plane of the detectors for producing output signals by spatially sampling a selected component of said secondary radiation field over a three-dimensional volume at least at a Nyquist frequency, and producing the magnetic susceptibility image of the body from said sampled selected component of said secondary radiation field.

38. A method for generating a three-dimensional magnetic susceptibility map of a body, comprising the steps of producing a magnetic field for magnetizing the body, measuring the magnetic field in a volume to be occupied by the body, producing an electromagnetic primary radiation field for causing the body to produce a secondary radiation field by excitation, disposing an array of detectors external to said body, said array of detectors being three-dimensional or movable in a direction perpendicular to the detectors for producing output signals by spatially sampling a selected component of said secondary radiation field over a three-dimensional volume at least at a Nyquist rate, digitizing said output signals, converting said output signals acquired over a period of time into frequency spectra, converting said frequency spectra into a map of magnetic moments in the volume and converting the magnetic moment map into a three-dimensional magnetic susceptibility map of the body.

39. A method for producing a multi-dimensional image representation of the spatial variations of the magnetic susceptibility of a body having a paramagnetic or a diamagnetic substance, comprising the steps of exciting said paramagnetic or diamagnetic substance by applying an electromagnetic excitation field to said body, detecting a radiation field originating in said body from said excited paramagnetic or diamagnetic substances, wherein frequency components of said radiation field provide information regarding the variations of the magnetic susceptibility within said body, constructing the multi-dimensional susceptibility image according to the information provided by the frequency components of said radiation field.

40. A method for providing a multi-dimensional image representation of spatial variations of the magnetic susceptibility of a body, comprising the steps of:

providing a primary magnetic field to magnetize said body, measuring said primary magnetic field in a volume to be occupied by said body, applying a primary radio frequency field to said body to rotate at least one type of magnetic moments in said body by 90 degrees such that said rotated moments point in a direction transverse to said primary magnetic field, detecting a secondary radio frequency field produced by a free induction decay of said rotated magnetic moments by a plurality of detectors arranged in a plane and movable in a direction perpendicular to said plane, obtaining Fourier transform of said secondary radio frequency to derive Larmor frequencies of said rotated magnetic moments, determining the magnetic moment corresponding to each Larmor frequency, determining maximum intensity of each Larmor frequency at positions of said detectors, and constructing the multi-dimensional susceptibility image according to said derived Larmor frequencies and according to spatial variations of said secondary radio frequency field.

41. The method of claim 40, wherein said constructing step comprises the step of employing a reconstruction algorithm.

42. A method for determining a correspondence between detected voltages in an array of detectors to a radiation distributed within a body, comprising the steps of:

applying a magnetic field to the body, applying an electromagnetic first radiation field to the body to cause the body to cause a radiation distribution within the body, detecting the radiation distribution within the body with an array of detectors, and determining the correspondence between voltages of the array and the radiation distribution such a set of detected voltages corresponds to a unique radiation distribution within the body.

43. The method of claim 42, further comprising the step of constructing a magnetic susceptibility map of the body in response to one or more voltages detected by said array of detectors.

44. The method of claim 42, further comprising the step of correlating detected voltages with a particular frequency of a magnetic field emanating from the body and induced by said applied field, and determining the spatial locations within the body contributing to each detected frequency.

45. The method of claim 44, further comprising the step of constructing a magnetic susceptibility map of the body as a function of said detected voltages.

* * * * *